(12) United States Patent
Hwang et al.

(10) Patent No.: US 10,672,787 B2
(45) Date of Patent: Jun. 2, 2020

(54) THREE-DIMENSIONAL SEMICONDUCTOR DEVICE AND METHOD OF MANUFACTURING THE SAME

(71) Applicant: SAMSUNG ELECTRONICS CO., LTD., Suwon-si, Gyeonggi-Do (KR)

(72) Inventors: Sung-Min Hwang, Hwaseong-si (KR); Sunghoi Hur, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/460,801

(22) Filed: Mar. 16, 2017

(65) Prior Publication Data
US 2017/0309639 A1 Oct. 26, 2017

(30) Foreign Application Priority Data

Apr. 25, 2016 (KR) .................. 10-2016-0050309

(51) Int. Cl.
*H01L 27/11582* (2017.01)
*H01L 27/11575* (2017.01)
*H01L 27/1157* (2017.01)
*G11C 16/04* (2006.01)
*G11C 16/08* (2006.01)
*H01L 23/528* (2006.01)
*H01L 27/11565* (2017.01)

(52) U.S. Cl.
CPC .... *H01L 27/11582* (2013.01); *G11C 16/0466* (2013.01); *G11C 16/08* (2013.01); *H01L 23/5283* (2013.01); *H01L 27/1157* (2013.01); *H01L 27/11565* (2013.01); *H01L 27/11575* (2013.01)

(58) Field of Classification Search
CPC ........ H01L 27/11582; H01L 27/11519; H01L 27/11565; H01L 27/11556
See application file for complete search history.

(56) References Cited

U.S. PATENT DOCUMENTS

| 8,187,932 | B2 | 5/2012 | Nguyen et al. |
| 8,284,601 | B2 | 10/2012 | Son et al. |
| 8,501,609 | B2 | 8/2013 | Roizin et al. |
| 8,787,082 | B2* | 7/2014 | Son .................... H01L 27/0207 365/185.05 |
| 8,969,162 | B2 | 3/2015 | Hwang et al. |
| 9,041,093 | B2 | 5/2015 | Tanaka et al. |
| 9,048,329 | B2 | 6/2015 | Kim et al. |
| 9,553,106 | B1* | 1/2017 | Sung ................. H01L 27/11575 |
| 2008/0099819 | A1* | 5/2008 | Kito ...................... G11C 16/10 257/315 |

(Continued)

*Primary Examiner* — Stephen M Bradley
(74) *Attorney, Agent, or Firm* — F. Chau & Associates, LLC

(57) ABSTRACT

An electrode structure includes a plurality of electrodes vertically stacked on a substrate. Each of the plurality of electrodes includes an electrode portion, a pad portion and a protrusion. The electrode portion is parallel to a top surface of the substrate, extending in a first direction. The pad portion extends from the electrode portion in an inclined direction with respect to the top surface of the substrate. The protrusion protrudes from a portion of the pad portion in a direction parallel to the inclined direction. Protrusions of the plurality of electrodes are arranged in a direction diagonal to the first direction when viewed from a plan view.

20 Claims, 80 Drawing Sheets

(56) References Cited

U.S. PATENT DOCUMENTS

| | | |
|---|---|---|
| 2011/0227141 A1 | 9/2011 | Jeong et al. |
| 2013/0020647 A1* | 1/2013 | Hwang ............. H01L 27/11565 |
| | | 257/365 |
| 2015/0076579 A1 | 3/2015 | Tsuji et al. |

* cited by examiner

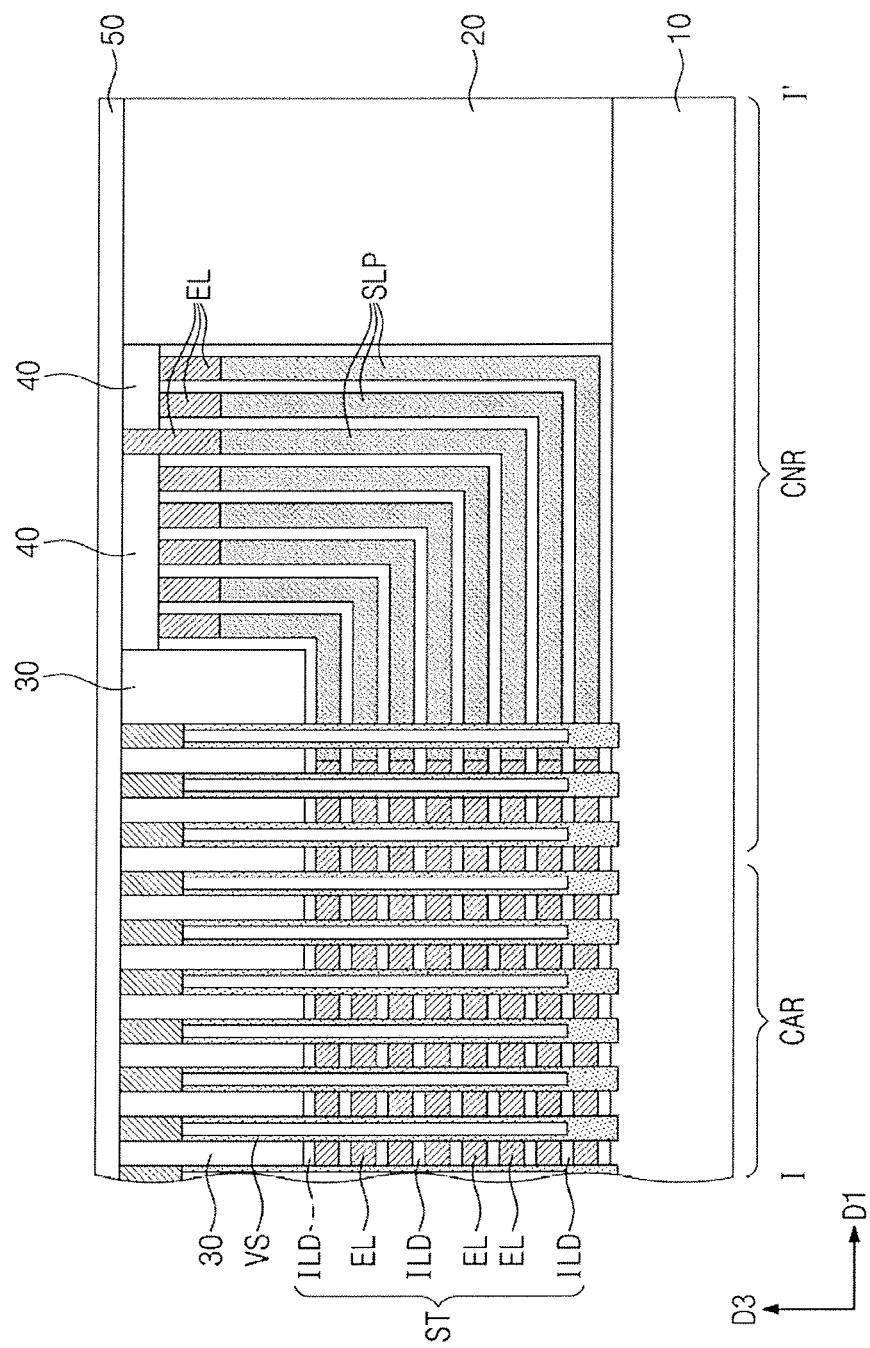

THREE-DIMENSIONAL SEMICONDUCTOR DEVICE AND METHOD OF MANUFACTURING THE SAME

CROSS-REFERENCE TO RELATED APPLICATION

This application claims priority under 35 U.S.C. § 119 to Korean Patent Application No. 10-2016-0050309, filed on Apr. 25, 2016, in the Korean Intellectual Property Office, the disclosure of which is incorporated by reference herein in its entirety.

TECHNICAL FIELD

The present inventive concept relates to a three-dimensional (3D) semiconductor device and a method of manufacturing the same.

DISCUSSION OF RELATED ART

Semiconductor devices have been highly integrated to provide excellent performance and low manufacture costs. The integration density of semiconductor devices directly affects the costs of the semiconductor devices, thereby resulting in a demand of highly integrated semiconductor devices. The integration density of conventional two-dimensional (2D) or planar semiconductor devices may be mainly determined by an area where a unit memory cell occupies. Therefore, the integration density of the conventional 2D semiconductor devices may be greatly affected by a technique of forming fine patterns. However, since extremely high-priced apparatuses are needed to form fine patterns, the integration density of 2D semiconductor devices continues to increase but is still limited. Thus, three-dimensional (3D) semiconductor devices including three-dimensionally arranged memory cells have been developed to overcome the above limitations.

SUMMARY

According to an exemplary embodiment of the present inventive concept, a three-dimensional (3D) semiconductor device is provided as follows. An electrode structure includes a plurality of electrodes vertically stacked on a substrate. Each of the plurality of electrodes includes an electrode portion, a pad portion and a protrusion. The electrode portion is parallel to a top surface of the substrate, extending in a first direction. The pad portion extends from the electrode portion in an inclined direction with respect to the top surface of the substrate. The protrusion protrudes from a portion of the pad portion in a direction parallel to the inclined direction. Protrusions of the plurality of electrodes are arranged in a direction diagonal to the first direction when viewed from a plan view.

According to an exemplary embodiment of the present inventive concept, a three-dimensional (3D) semiconductor device is provided as follows. An electrode structure includes a plurality of electrodes vertically stacked on a substrate. Each of the plurality of electrodes includes an electrode portion, a vertical pad portion, and a horizontal pad portion. The electrode portion is parallel to a top surface of the substrate, extending in a first direction. The vertical pad portion extends from a portion of the electrode portion in an inclined direction with respect to the top surface of the substrate. The horizontal pad portion extends from a portion of the vertical pad portion in a second direction. The second direction intersects the first direction and is parallel to the top surface of the substrate.

According to an exemplary embodiment of the present inventive concept, a three-dimensional (3D) semiconductor device is provided as follows. A substrate includes a cell array region and a connection region. An electrode structure includes a plurality of electrodes vertically stacked on the substrate. Each of the plurality of electrodes includes an electrode portion and a vertical pad portion. The electrode portion is parallel to a top surface of the substrate, extending in a first direction. The vertical pad portion extends from a portion of the electrode portion in an inclined direction with respect to the top surface of the substrate. The electrode portion includes a first portion having a first width on the cell array region and a second portion having a second width smaller than the first width on the connection region. The vertical pad portion has a width substantially equal to the second width.

According to an exemplary embodiment of the present inventive concept, a method of manufacturing a three-dimensional (3D) semiconductor device is provided as follows. A thin layer structure is formed on a substrate. The thin layer structure includes a plurality of insulating layers and a plurality of sacrificial layers alternately stacked on the substrate. Each of the plurality of insulating layers and each of the plurality of sacrificial layers include a horizontal portion and a sidewall portion. The horizontal portion is parallel to a top surface of the substrate, extending in a first direction. The sidewall portion is extending in an inclined direction with respect to the top surface of the substrate. Portions of sidewall portions of the plurality of sacrificial layers are recessed to form recessed surfaces of the portions of the sidewall portions of the plurality of sacrificial layers. A plurality of protrusions is protruded from the recessed surfaces of the sidewall portions of the plurality of sacrificial layers. The plurality of protrusions of the plurality of sacrificial layers is arranged in a diagonal direction with respect to the first direction when viewed from a plan view.

According to an exemplary embodiment of the present inventive concept, a method of manufacturing a three-dimensional (3D) semiconductor device is provided as follows. A thin layer structure is formed on a substrate including a cell array region and a connection region. The thin layer includes a plurality of insulating layers and a plurality of sacrificial layers alternately stacked on the substrate. The thin layer structure is patterned to form trenches extending in a first direction. A pad mask pattern is formed to cover portions of sidewalls of the thin layer structure exposed by the trenches on the connection region. A first etching process is performed to laterally etch portions of the sacrificial layers exposed by the trenches and the pad mask pattern to form first sacrificial patterns between the insulating layers. After removing the pad mask pattern, a second etching process is performed to laterally etch the first sacrificial patterns exposed by the trenches to form gate regions and second sacrificial patterns. The gate regions are formed between the insulating layers on the cell array region. The second sacrificial patterns are formed between the insulating layers on the connection region. Electrodes are formed in the gate regions, the electrodes being in contact with sidewall portions of the second sacrificial patterns.

According to an exemplary embodiment of the present inventive concept, a three-dimensional (3D) semiconductor device is provided as follows. A substrate has a cell array region and a connection region. A plurality of electrodes is vertically stacked on the cell array region of the substrate and the connection region of the substrate. The plurality of electrodes extends in parallel to a top surface of the substrate and wherein the plurality of electrodes extend in an inclined direction with respect to the top surface of the substrate. A plurality of vertical structures penetrates the plurality of electrodes disposed on the cell array region. A plurality of contact plugs is disposed on the plurality of electrodes disposed on the connection region. The plurality of contact plugs is positioned at a substantially same height from the top surface of the substrate. A plurality of conductive lines is disposed on the plurality of contact plugs. Each of the plurality of conductive lines is electrically connected to one of the plurality of contact plugs.

BRIEF DESCRIPTION OF THE DRAWINGS

These and other features of the inventive concept will become more apparent by describing in detail exemplary embodiments thereof with reference to the accompanying drawings of which:

FIGS. 6A to 12A are perspective views illustrating methods for manufacturing a 3D semiconductor device according to some embodiments of the inventive concepts;

FIGS. 6B to 12B are cross-sectional views taken along lines I-I' of FIGS. 6A to 12A, respectively, to illustrate methods for manufacturing a 3D semiconductor device according to some embodiments of the inventive concepts;

FIGS. 6C to 12C are cross-sectional views taken along lines II-II' of FIGS. 6A to 12A, respectively, to illustrate methods for manufacturing a 3D semiconductor device according to some embodiments of the inventive concepts;

FIGS. 15A to 17A are perspective views illustrating a method for manufacturing a 3D semiconductor device according to some embodiments of the inventive concepts;

FIGS. 15B to 17B are cross-sectional views taken along lines II-II' of FIGS. 15A to 17A, respectively;

FIGS. 20A to 25A are perspective views illustrating a method for manufacturing a 3D semiconductor device according to some embodiments of the inventive concepts;

FIGS. 20B to 25B are cross-sectional views taken along lines II-II' of FIGS. 20A to 25A, respectively, to illustrate a method for manufacturing a 3D semiconductor device according to some embodiments of the inventive concepts;

DETAILED DESCRIPTION OF EXEMPLARY EMBODIMENTS

Figure 1:
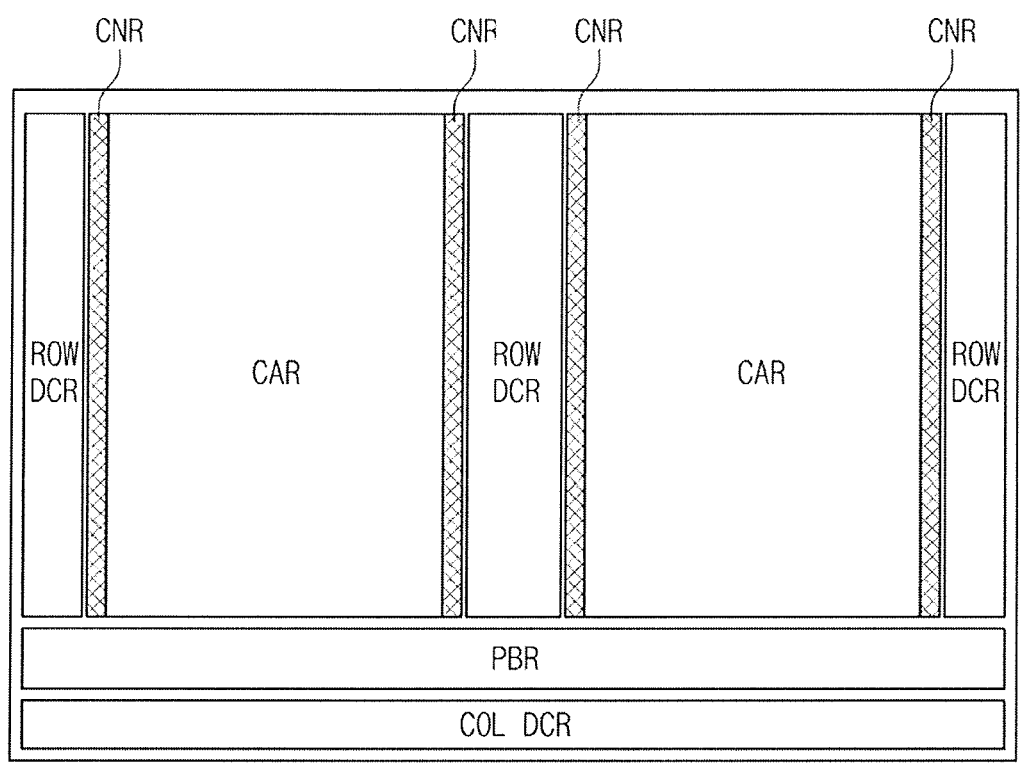
FIG. 1 is a schematic block diagram illustrating a three-dimensional (3D) semiconductor device according to some embodiments of the inventive concepts.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a schematic block diagram illustrating a three-dimensional (3D) semiconductor device according to some embodiments of the inventive concepts.

Referring to FIG. 1, a 3D semiconductor device may include a cell array region CAR and a peripheral circuit region. The peripheral circuit region may include row decoder regions ROW DCR, a page buffer region PBR, a column decoder region COL DCR, and a control circuit region (not shown). In some embodiments, a connection region CNR may be disposed between the cell array region CAR and the row decoder region ROW DCR.

A memory cell array including a plurality of memory cells may be disposed in the cell array region CAR. In some embodiments, the memory cell array may include three-dimensionally arranged memory cells, word lines, and bit lines. The word lines and the bit lines may be electrically connected to the memory cells.

A row decoder for selecting the word lines of the memory cell array may be disposed in the row decoder region ROW DCR, and an interconnection structure may be disposed in the connection region CNR. The interconnection structure may include contact plugs and interconnections which electrically connect the memory cell array and the row decoder to each other. The row decoder may select one word line, for example, among the word lines of the memory cell array in response to an address signal. The row decoder may respectively provide a first word line voltage and second word line voltages to the selected word line and unselected word lines in response to a control signal of a control circuit.

A page buffer for sensing data stored in the memory cells may be disposed in the page buffer region PBR. According to an operation mode, the page buffer may temporarily store data to be stored in the memory cells or may sense data stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

FIGS. 2A to 2H are perspective views illustrating a method for manufacturing a 3D semiconductor device according to some embodiments of the inventive concepts.

Figure 2A:
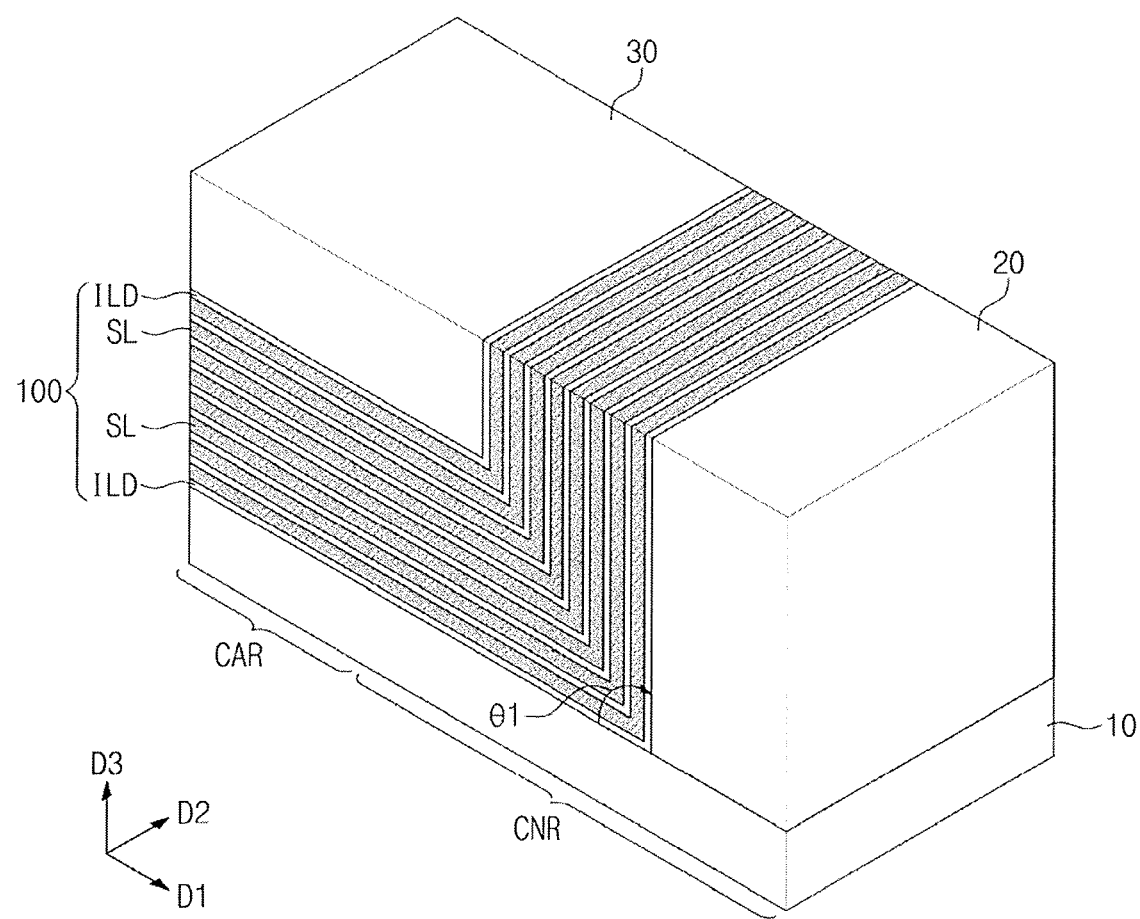
FIGS. 2A to 2H are perspective views illustrating a method for manufacturing a 3D semiconductor device according to some embodiments of the inventive concepts.

Referring to FIG. 2A, a substrate 10 may include a cell array region CAR and a connection region CNR. For example, the substrate 10 may include silicon (Si), germanium (Ge), silicon-germanium (SiGe), gallium-arsenic (GaAs), indium-gallium-arsenic (InGaAs), or aluminum-gallium-arsenic (AlGaAs). The substrate 10 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process. In some embodiments, the substrate 10 may include an insulating material and may include a single layer or a plurality of thin layers. For example, the substrate 10 may include a silicon oxide layer, a silicon nitride layer, or a low-k dielectric layer.

A mold pattern 20 defining a trench may be formed on the substrate 10. The mold pattern 20 may be locally formed on the connection region CNR. For the convenience of description, part of trench defined by the mold pattern 20 is shown on FIG. 2A. Another mold pattern (not shown here) may be disposed in an opposite end of the mold pattern 20 in a first direction D1. The trench may be defined by the mold pattern 20 and the another mold pattern. For example, the mold pattern 20 may be formed only on the connection region CNR. In some embodiments, the mold pattern 20 may be formed on the connection region CNR and a peripheral circuit region. In some embodiments, a mold insulating layer may be formed on an entire top surface of the substrate 10, and a portion of the mold insulating layer may be etched to form the mold pattern 20. By the etching process, the mold pattern 20 may have a sidewall inclined at a predetermined angle θ1 with respect to the top surface of the substrate 10. For example, the predetermined angle θ1 may range between about 90 degrees and about 130 degrees. The predetermined angle θ1 is measured counterclockwise from the top surface of the substrate 10 to the sidewall of the mold pattern 20. If the predetermined angle θ1 is about 90 degrees, the sidewall of the mold pattern 20 may be erected vertically with respect to the top surface of the substrate 10.

In some embodiments, a portion of the substrate 10 may be patterned to form the mold pattern 20. In this case, the mold pattern 20 may be formed of the same material as the substrate 10.

In some embodiments, the mold pattern 20 may have a multi-layered structure including a plurality of thin layers.

Next, a thin layer structure 100 may be formed on the substrate 10 having the mold pattern 20. The thin layer structure 100 may include insulating layers ILD and sacrificial layers SL which are alternately stacked on the substrate 10.

The sacrificial layers SL and the insulating layers ILD may be formed to conformally cover the substrate 10 having the mold pattern 20. In some embodiments, the sacrificial layers SL and the insulating layers ILD may be formed using a deposition technique including a thermal chemical vapor deposition (thermal CVD) technique, a plasma-enhanced CVD technique, a physical CVD technique, or an atomic layer deposition (ALD) technique. In some embodiments, the deposition process may be controlled to have a step coverage to the extent that the sacrificial layers SL and the insulating layers ILD conformally cover the substrate 10 having the mold pattern 20. When the sacrificial layers SL and the insulating layers ILD are formed using the deposition technique, the sacrificial layers SL and the insulating layers ILD may have substantially uniform thicknesses on the top surface of the substrate 10, the sidewall of the mold pattern 20, and a top surface of the mold pattern 20.

In the thin layer structure 100, the sacrificial layers SL may be formed of a material having etch selectivity with respect to the insulating layers ILD. For example, each of the sacrificial layers SL may include a silicon layer, a silicon oxide layer, a silicon carbide layer, a silicon-germanium layer, a silicon oxynitride layer, or a silicon nitride layer. Each of the insulating layers ILD may include a silicon layer, a silicon oxide layer, a silicon carbide layer, a silicon oxynitride layer, or a silicon nitride layer. For example, each of the sacrificial layers SL may be formed of a silicon nitride layer, and each of the insulating layers ILD may be formed of a low-k dielectric layer. In some embodiments, the sacrificial layers SL may be formed of a conductive material, and the insulating layers ILD may be formed of an insulating material.

In some embodiments, thicknesses of the sacrificial layers SL may be equal to each other. In some embodiments, the lowermost sacrificial layer and the uppermost sacrificial layer of the sacrificial layers SL may be thicker than other sacrificial layers SL interposed therebetween.

In some embodiments, the insulating layers ILD may have the same thickness. In some embodiments, a thickness of at least one insulating layer of the insulating layers ILD may be different from a thickness of the other insulating layers of the insulating layers ILD. In some embodiments, the lowermost insulating layer of the insulating layers ILD of the thin layer structure 100 may be thinner than the sacrificial layers SL and the other insulating layers ILD formed thereon. The lowermost insulating layer ILD may be a silicon oxide layer formed by using a thermal oxidation process.

In some embodiments, a thickness of the thin layer structure 100 may be smaller than a thickness of the mold pattern 20. In this case, a top surface of the thin layer structure 100 on the cell array region CAR may be lower than the top surface of the mold pattern 20. In this case, the thickness of the thin layer structure 100 and the thickness of the mold pattern 20 may be measured along a third direction D3 substantially perpendicular to the top surface of the substrate 10.

Subsequently, a planarization process may be performed to planarize an upper portion of the thin layer structure 100. Thus, the sacrificial layers SL and the insulating layers ILD disposed on the top surface of the mold pattern 20 may be removed and the thin layer structure 100 may be confined in the trench. For example, the trench may be defined by the top surface of the substrate 10 and a sidewall of the mold pattern 20.

In addition, a preliminary planarization insulating layer may be formed on the thin layer structure 100 before the planarization process is performed. The preliminary planarization insulating layer may increase a planarization degree in the planarization process. Thus, a planarization insulating layer 30 may be formed in the trench defined by the sidewall of the mold pattern 20 and the top surface of the substrate 10.

The thin layer structure 100 formed in the trench of the mold pattern 20 may have a portion that is bent in a L-shape on the connection region CNR. For example, each of the sacrificial layers SL and the insulating layers ILD may have a horizontal portion parallel to the top surface of the substrate 10 and a sidewall portion parallel to the sidewall of the mold pattern 20. In addition, due to the planarization process, the sacrificial layers SL and the insulating layers ILD may have top surfaces that are disposed on the connection region CNR and are disposed at the substantially same height from the top surface of substrate 10.

Figure 2B:
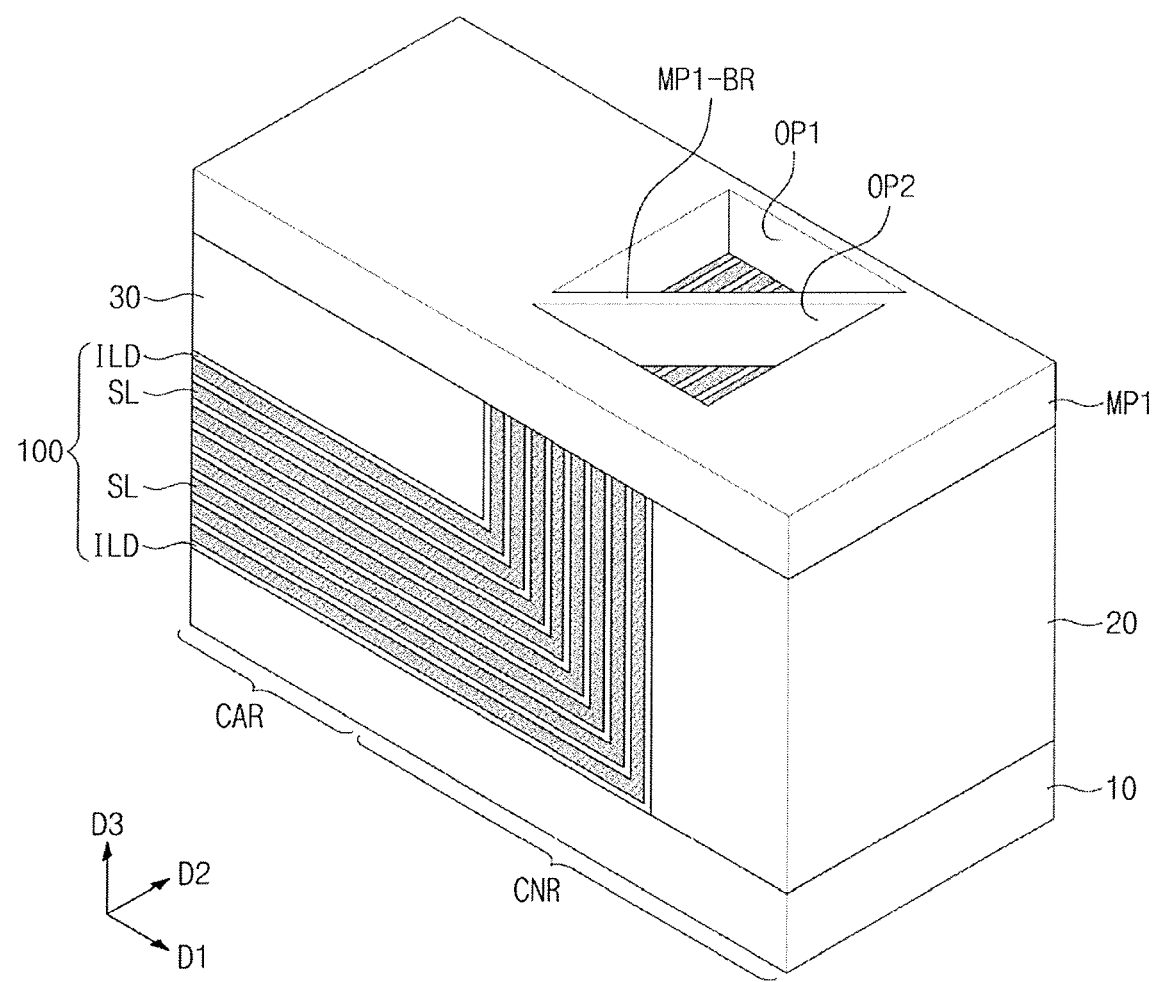

Referring to FIG. 2B, a first mask pattern MP1 may be formed to expose a portion of the thin layer structure 100 disposed on the connection region CNR. In some embodiments, the first mask pattern MP1 may have first and second openings OP1 and OP2 exposing portions of the sidewall portions of the sacrificial layers SL. In some embodiments, the first mask pattern MP1 may have one opening disposed on the connection region CNR.

The first mask pattern MP1 may include a portion MP1-BR that is disposed on the connection region CNR to extend in a direction diagonal to first and second directions D1 and D2. The first and second directions D1 and D2 intersect each other and are parallel to the top surface of the substrate 10. For example, the portion MP1-BR of the first mask pattern MP1 may intersect the sacrificial layers SL and the insulating layers ILD in the diagonal direction on the connection region CNR. For example, each of the first and second openings OP1 and OP2 may have a sidewall intersecting the sacrificial layers SL and the insulating layers ILD in the diagonal direction, and the sidewalls in the diagonal direction of the first and second openings OP1 and OP2 may extend in parallel to each other. In some embodiments, each of the first and second openings OP1 and OP2 may have a triangular shape.

In some embodiments, areas of the sacrificial layers SL exposed by the first opening OP1 may decrease sequentially as a first distance from the cell array region CAR to the sacrificial layers SL increases, and areas of the sacrificial layers SL exposed by the second opening OP2 may increase sequentially as a second distance from the cell array region CAR to the sacrificial layers SL increases. The first and second distances may be measured along the first direction D1.

Figure 2C:
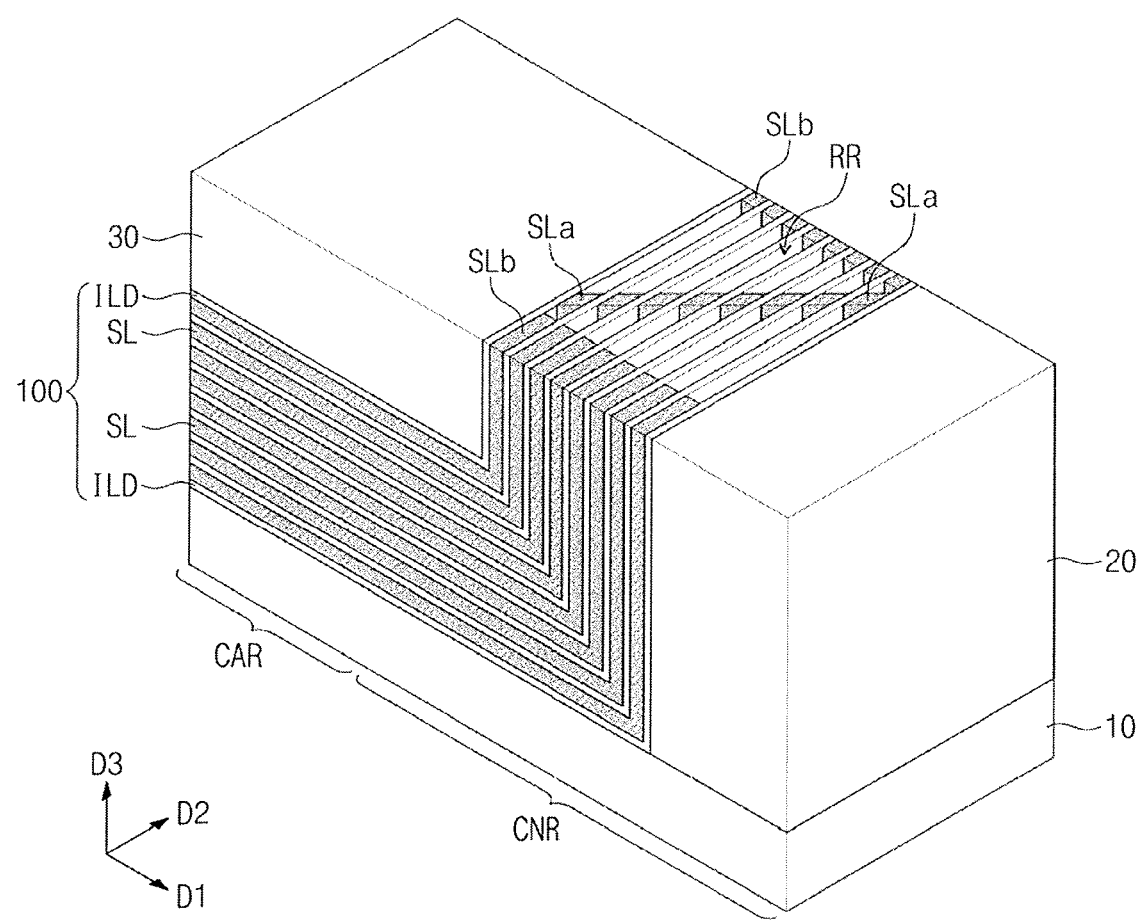

Subsequently, the portions of the sacrificial layers SL exposed by the first mask pattern MP1 may be selectively etched. For example, the portions of the sacrificial layers SL may be anisotropically or isotropically etched using the first mask pattern MP1 as an etch mask. Thus, recess regions RR may be formed between the insulating layers ILD on the connection region CNR, as illustrated in FIG. 2C. Top surfaces of the sacrificial layers SL in the recess regions RR may be lower than the top surface of the mold pattern 20 and may be higher than a bottom surface of the uppermost sacrificial layer SL disposed on the cell array region CAR. For example, the portions of the sidewall portions of the sacrificial layers SL may be etched to form protrusions SLa, each of which is disposed between the insulating layers ILD adjacent to each other on the connection region CNR.

In some embodiments, the protrusions SLa of the sacrificial layers SL may be arranged in the direction diagonal to the first and second directions D1 and D2 when viewed from a plan view. In addition, since the first mask pattern MP1 has the first and second openings OP1 and OP2, the recess regions RR may be formed at both sides of the protrusions SLa of the sacrificial layers SL in the second direction D2. Furthermore, when the recess regions RR are formed, dummy protrusions SLb of the sacrificial layers SL may be formed together with the protrusions SLa, according to widths of the first and second openings OP1 and OP2 in the second direction D2. The dummy protrusions SLb may be spaced apart from the protrusions SLa in the second direction D2. The first mask pattern MP1 may be removed after the formation of the protrusions SLa of the sacrificial layers SL.

Figure 2D:
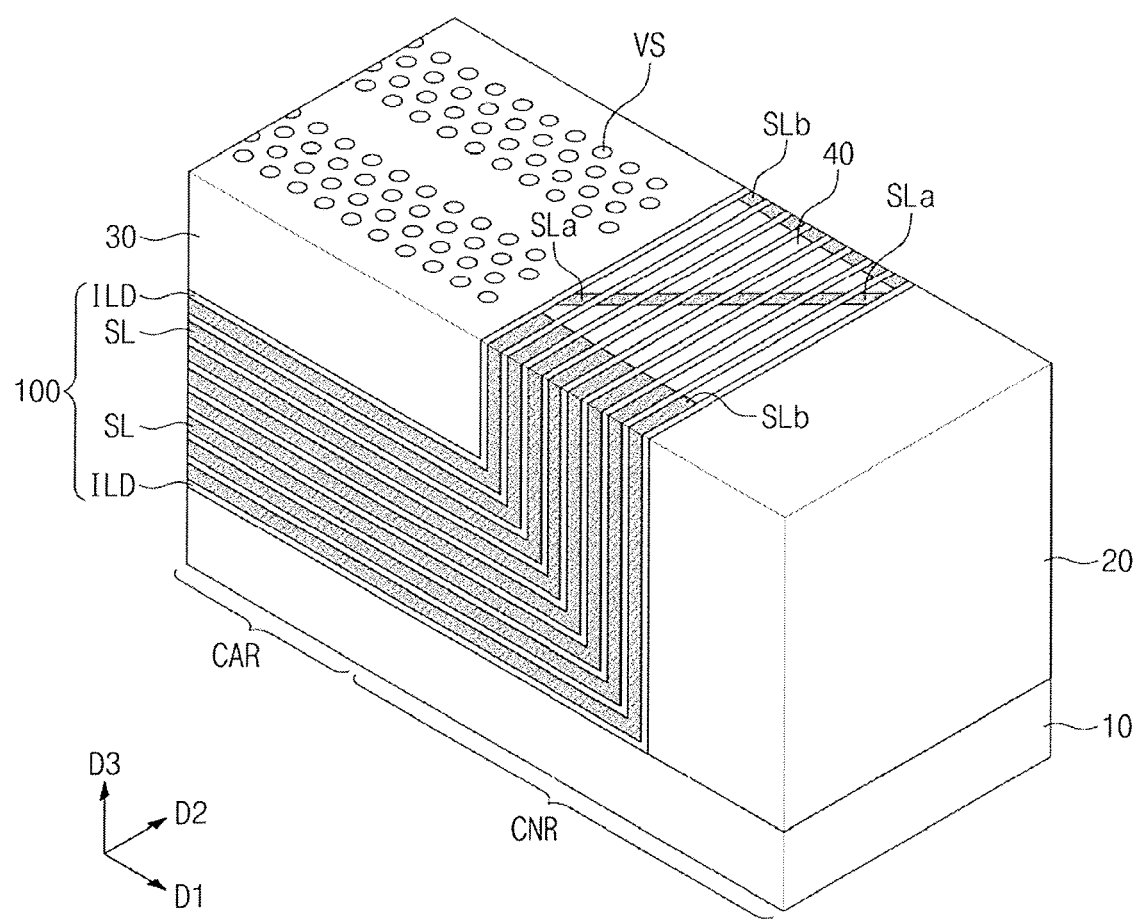

Referring to FIG. 2D, a filling insulation layer 40 may be formed in the recess regions RR between the insulating layers ILD on the connection region CNR. In some embodiments, the filling insulation layer 40 may completely fill the recess regions RR. Forming the filling insulation layer 40 may include depositing an insulating layer on the thin layer structure 100 having the recess regions RR, and planarizing the insulating layer until top surfaces of the protrusions SLa of the sacrificial layers SL are exposed. Here, the filling insulation layer 40 may be formed of an insulating material having etch selectivity with respect to the sacrificial layers SL. For example, the filling insulation layer 40 may include a silicon layer, a silicon oxide layer, a silicon carbide layer, a silicon oxynitride layer, or a silicon nitride layer. At this time, the filling insulation layer 40 may include a different material from a material of the sacrificial layers SL.

Subsequently, vertical structures VS may be formed to penetrate the thin layer structure 100 on the cell array region CAR. The vertical structures VS may include a semiconductor material or a conductive material.

In some embodiments, forming the vertical structures VS may include forming openings penetrating the thin layer structure 100, and forming semiconductor patterns in the openings, respectively. Forming the openings of the vertical structures VS may include forming a mask pattern (not shown) on the thin layer structure 100, and anisotropically etching the thin layer structure 100 using the mask pattern (not shown) as an etch mask. The top surface of the substrate 10 may be etched by over-etching of the anisotropic etching process, and thus the substrate 10 exposed through the openings may be recessed by a predetermined depth. The openings may be arranged in a line or in a zigzag form along one direction when viewed from a plan view.

Each of the vertical structures VS may include a conductive pad disposed in a top end portion of each of the vertical structures VS. The conductive pad may be a dopant region doped with dopants or may be formed of a conductive material. The conductive pads may be disposed at a higher level than a top surface of the uppermost sacrificial layer SL on the cell array region CAR.

In addition, a vertical insulating layer (not shown) may be formed in the openings before the vertical structures VS are formed in the openings. The vertical insulating layer may include a single layer or a plurality of layers. In some embodiments, the vertical insulating layer may be at least a portion of a data storage layer of a charge trap type flash memory transistor. The data storage layer will be described later in more detail with reference to FIGS. 48A to 48D.

In these embodiments, the vertical structures VS are formed after the formation of the protrusions SLa of the sacrificial layers SL. However, embodiments of the inventive concepts are not limited thereto. In some embodiments, the vertical structures VS may be formed before the protrusions SLa of the sacrificial layers SL are formed on the connection region CNR.

Figure 2E:
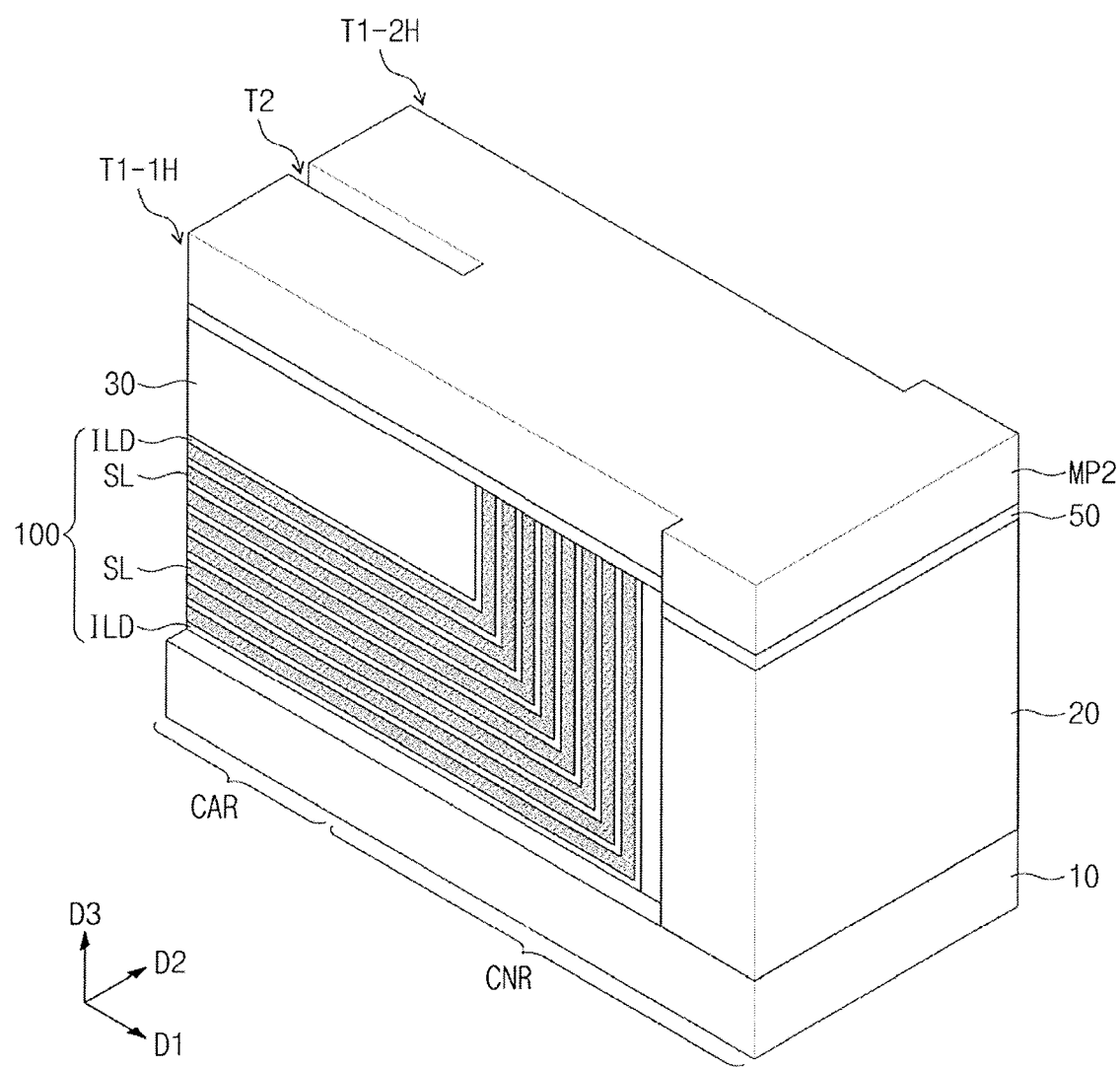

Referring to FIG. 2E, the thin layer structure 100 may be patterned to form a first trench T1 and a second trench T2. The thin layer structure 100 of FIG. 2 may be repeated along the second direction D2. For example, the first trench T1 may include a first half trench T1-1H and a second half trench T1-2H. In addition, together with the first trenches T1, the second trench T2 may be formed to laterally divide the horizontal portions of the sacrificial layers SL on the cell array region CAR.

For example, after the formation of the vertical structures VS, a capping layer 50 may be formed on the vertical structures VS and the thin layer structure 100, and a second mask pattern MP2 may be formed on the capping layer 50. The capping layer 50 may be used as a hard mask in an etching process for forming the trenches, and the second mask pattern MP2 may be a photoresist mask pattern.

The second mask pattern MP2 may have openings having linear shapes. In some embodiments, the second mask pattern MP2 may have first openings extending in the first direction D1 and spaced apart from each other in the second direction D2 perpendicular to the first direction D2 when viewed from a plan view. In addition, the second mask pattern MP2 may also have at least one second opening extending in the first direction D1 between the first openings. The first openings of the second mask pattern MP2 may intersect the thin layer structure 100 and may expose portions of the mold pattern 20. The second opening of the second mask pattern MP2 may intersect the thin layer structure 100 on the cell array region CAR.

In some embodiments, the mold structure defined by the first trench T1 may extend in the first direction D1, and the first trench T1 may be spaced apart from the vertical structures VS. The second trench T2 may extend in the first direction D1 on the cell array region CAR and may be spaced apart from the vertical structures VS.

The first trench T1 may expose sidewalls of the sacrificial layers SL on the cell array region CAR and the connection region CNR, and the second trench T2 may expose sidewalls of the sacrificial layers SL on the cell array region CAR. For example, the first trench T1 may expose the horizontal portions and the sidewall portions of the sacrificial layers SL, and the second trench T2 may expose the horizontal portions of the sacrificial layers SL.

Figure 2F:
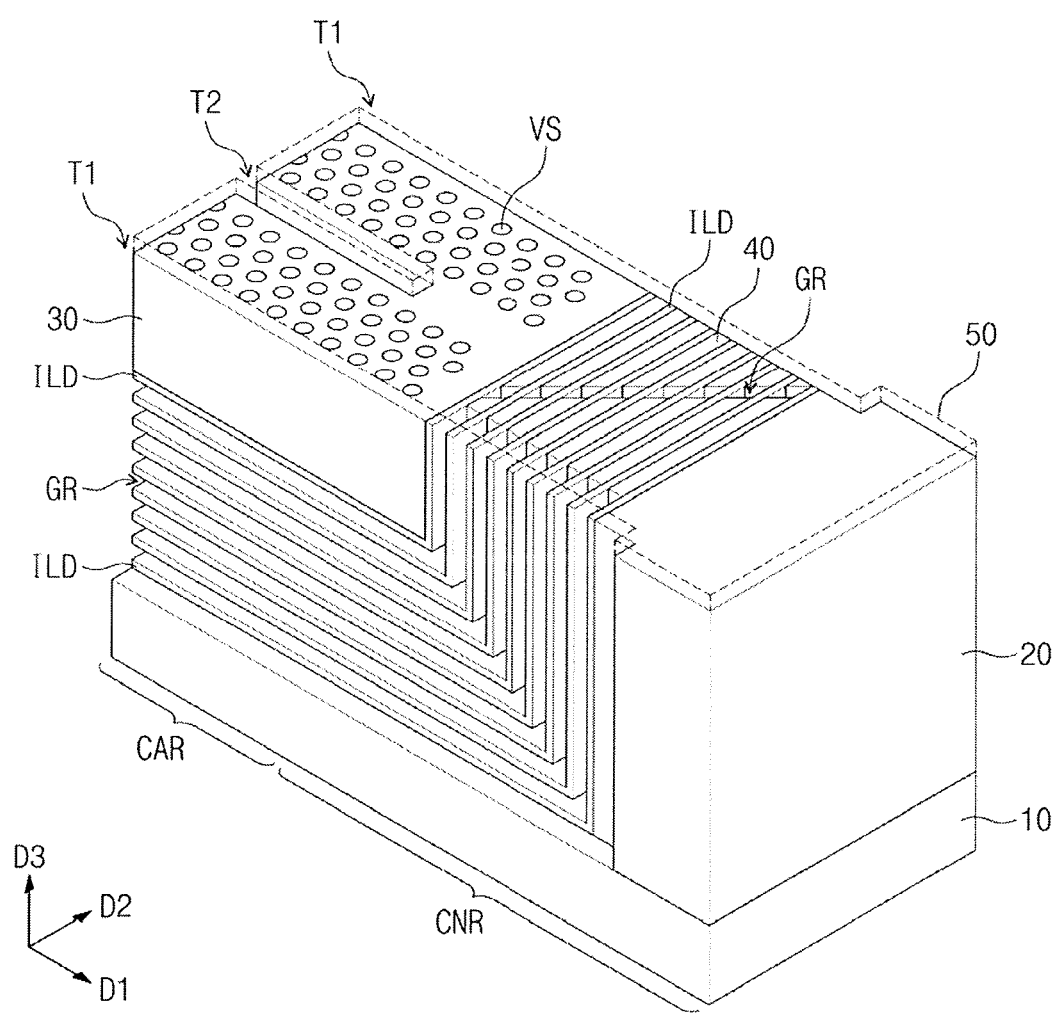

Referring to FIG. 2F, the sacrificial layers SL exposed by the first and second trenches T1 and T2 may be removed to form gate regions GR between the insulating layers ILD. The gate regions GR may be formed by isotropically etching the sacrificial layers SL using an etch process having etch selectivity with respect to the insulating layers ILD, the vertical structures VS, and the substrate 10. In some embodiments, the sacrificial layers SL may be completely removed by the isotropic etching process. For example, when the sacrificial layers SL are silicon nitride layers and the insulating layers ILD are silicon oxide layers, the isotropic etching process may be performed using an etching solution including phosphoric acid. In addition, the vertical insulating layer (not shown) surrounding the vertical structures VS may be used as an etch stop layer for forming the gate regions GR during the isotropic etching process.

The gate regions GR may laterally extend from the first and second trenches T1 and T2 into between the insulating layers ILD on the cell array region CAR and may expose portions of sidewalls of the vertical insulating layer (not shown) or portions of sidewalls of the vertical structures VS.

Since the gate regions GR are empty spaces formed by the removal of the sacrificial layers SL, the gate regions GR may extend from the cell array region CAR into the connection region CNR. For example, like the sacrificial layers SL, the gate regions GR may include horizontal regions parallel to the top surface of the substrate 10 and sidewall regions parallel to the sidewall of the mold pattern 20. In addition, according to some embodiments, the gate regions GR may have protrusion regions that are formed by removal of the protrusions SLa of FIG. 2D and are defined by the filling insulation layer 40 on the connection region CNR. For example, the protrusion regions of the gate regions GR may be defined by the insulating layers ILD and the filling insulation layer 40 on the connection region CNR.

Figure 2G:
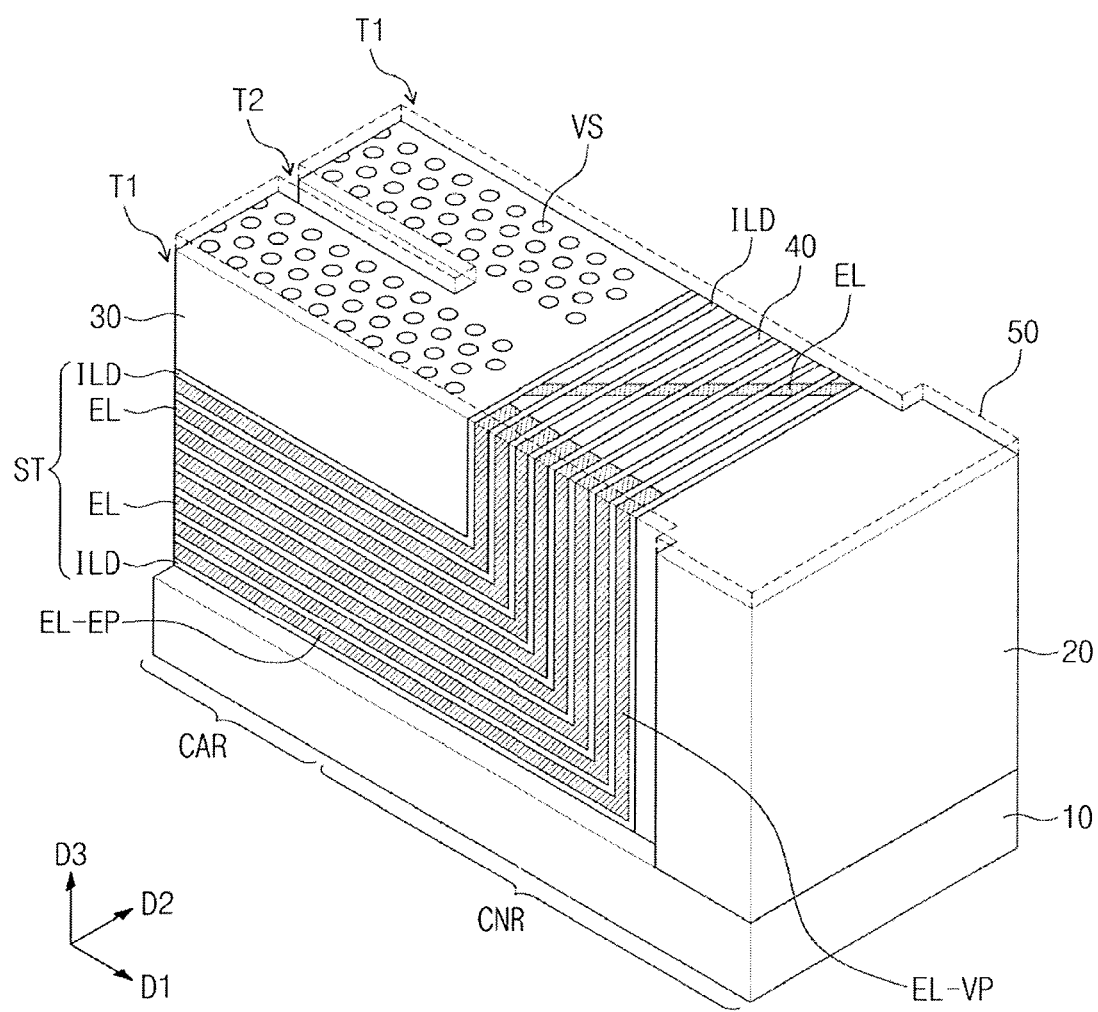

Referring to FIG. 2G, electrodes EL may be formed in the gate regions GR, respectively. In some embodiments, forming the electrodes EL may include depositing a gate conductive layer filling the gate regions GR, and removing portions of the gate conductive layer disposed in the first and second trenches T1 and T2 to locally form the electrodes EL in the gate regions GR, respectively. Here, the gate conductive layer may partially or completely fill the first and second trenches T1 and T2. In some embodiments, depositing the gate conductive layer may include sequentially depositing a barrier metal layer and a metal layer. For example, the barrier metal layer may be formed of a metal nitride layer such as a titanium nitride (TiN) layer, a tantalum nitride (TaN) layer, or a tungsten nitride (WN) layer. For example, the metal layer may be formed of a metal material such as tungsten (W), aluminum (Al), titanium (Ti), tantalum (Ta), cobalt (Co), or copper (Cu). The portions of the gate conductive layer in the first and second trenches T1 and T2 may be removed by an anisotropic etching process or an isotropic etching process.

Meanwhile, a horizontal insulating layer (not shown) may be formed to conformally cover inner surfaces of the gate regions GR before the electrodes EL are formed in the gate regions GR. In some embodiments, the horizontal insulating layer may be a portion of the data storage layer of the charge trap type flash memory transistor. In addition, the horizontal insulating layer may be used as an etch stop layer during the process of etching the gate conductive layer.

Since the electrodes EL are formed by the above processes, an electrode structure ST may be formed. The electrode structure ST may include the insulating layers ILD and the electrodes EL which are alternately and repeatedly stacked. In some embodiments, since the electrodes EL have shapes defined by the gate regions GR, each of the electrodes EL may include an electrode portion EL-EP and a vertical pad portion EL-PAD. The electrode portion EL-EP may be parallel to the top surface of the substrate 10 on the cell array region CAR and may extend in the first direction D1. In some embodiments, the electrode portion EL-EP may extend into the connection region CNR in the first direction D1. The vertical pad portion EL-PAD may be parallel to the sidewall of the mold pattern 20 on the connection region CNR. For example, the vertical pad portion EL-PAD may extend from an end portion of the electrode portion EL-EP in the third direction D3. The end portion of the electrode portion EL-EP is disposed on the connection region CNR. In addition, the electrodes EL may include protrusions EL-PP filling the protrusion regions of the gate regions GR defined by the insulating layers ILD and the filling insulation layer 40 on the connection region CNR. The electrodes EL will be described later in more detail with reference to FIGS. 3, 4, and 5.

According to some embodiments, dopant regions (not shown) may be formed in the substrate 10 under the first and second trenches T1 and T2 after the formation of the electrodes EL. The dopant regions may be formed by doping the substrate 10 with dopants having a different conductivity type from the substrate 10.

Figure 2H:
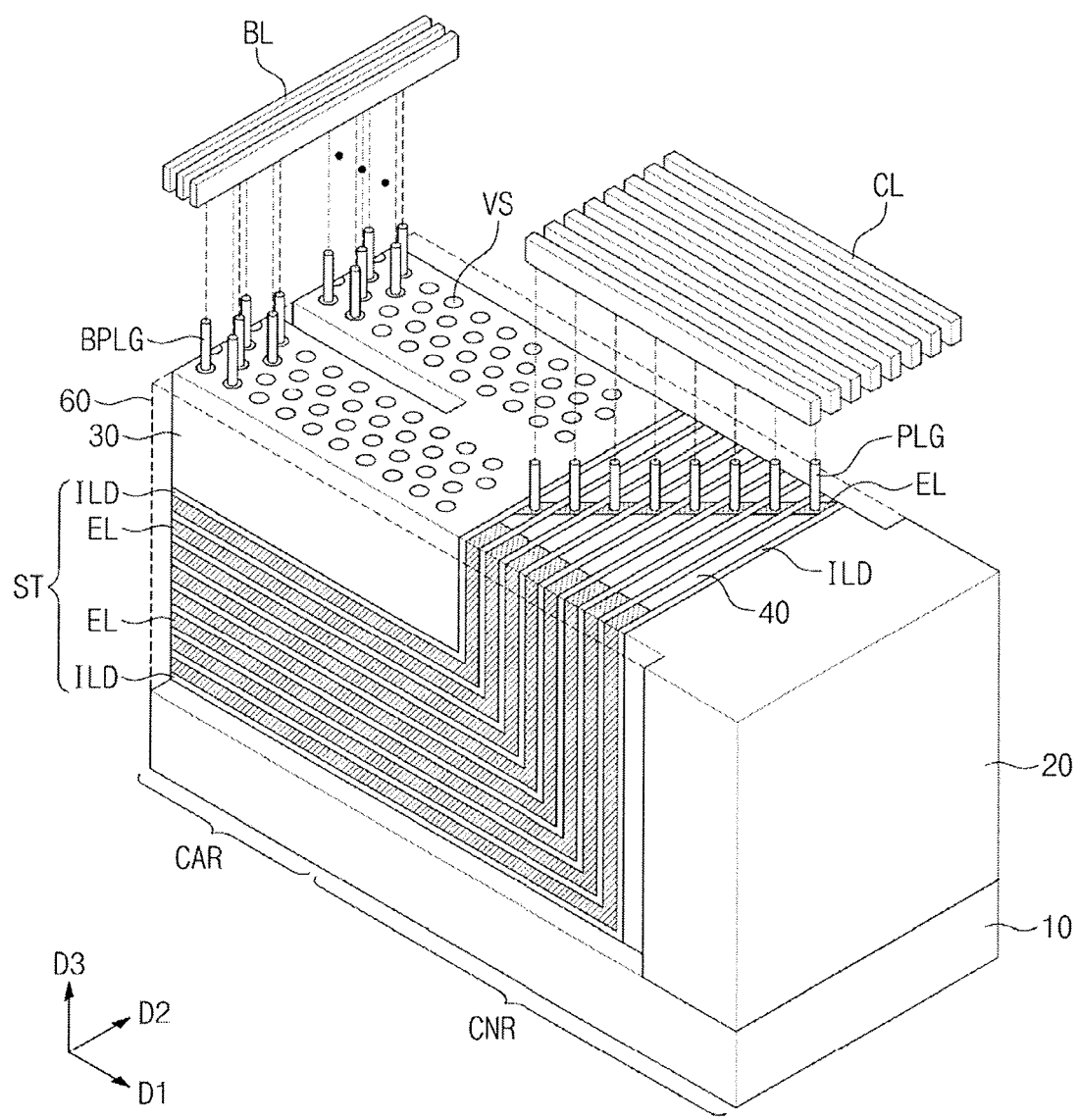

Referring to FIG. 2H, isolation insulating patterns 60 may be formed to fill the first and second trenches T1 and T2 of FIG. 2G, respectively. Thereafter, an interconnection structure may be formed on the connection region CNR to be electrically connected to the electrode structure ST. The interconnection structure may include contact plugs PLG connected to the protrusions EL-PP of the electrodes EL and conductive lines CL connected to the contact plugs PLG.

Since the protrusions EL-PP of the electrodes EL are arranged in the direction diagonal to the first and second directions D1 and D2, a process margin may be secured to form the contact plugs PLG on the connection region CNR. For example, the contact plugs PLG may be arranged in the direction diagonal to the first and second directions D1 and D2, like the protrusions EL-PP of the electrodes EL. Lengths of the contact plugs PLG may be substantially equal to each other. The conductive lines CL may extend in the first direction D1 and may be arranged in the second direction D2. The conductive lines CL may be spaced apart from each other in the second direction D2 and may be connected to the contact plugs PLG, respectively.

Meanwhile, in some embodiments, the process of forming the contact plugs PLG on the connection region CNR may be omitted. In this case, the conductive lines CL may be in direct contact with the protrusions EL-PP of the electrodes EL without the contact plugs PLG.

Bit lines BL electrically connected to the vertical structures VS may be formed on the cell array region CAR. The bit lines BL may be electrically connected to the vertical structures VS through bit line contact plugs BPLG. The bit lines BL may extend in the second direction D2 to intersect the electrodes EL on the cell array region CAR. Each of the bit lines BL may be electrically connected to the vertical structures VS arranged in the first direction D1.

In an exemplary embodiment, each of the electrodes EL has a top surface coplanar with a top surface of the filling insulation layer 40.

A plurality of electrodes EL may be vertically stacked on the cell array region CAR of the substrate 10 and the connection region CNR of the substrate 10. The plurality of electrodes disposed on the cell array region CAR extends in parallel to an top surface of the substrate 10. The plurality of electrodes disposed on the connection region CNR extends in an inclined direction with respect to the top surface of the substrate. A plurality of vertical structures VS may penetrate the plurality of electrodes disposed on the cell array region CAR. A plurality of contact plugs PLG is disposed on the plurality of electrodes EL disposed on the connection region.

A plurality of conductive lines CL is disposed on the plurality of contact plugs PLG. Each of the plurality of conductive lines CL may be electrically connected to one of the plurality of contact plugs PLG.

The plurality of contact plugs PLG may be positioned at a substantially same height from the top surface of the substrate 10.

Upper surfaces of the plurality of contact plugs PLG are higher than upper surfaces of the plurality of vertical structures VS.

Upper surfaces of the plurality of protrusions are substantially coplanar with the upper surfaces of the plurality of vertical structures VS.

Figure 3:
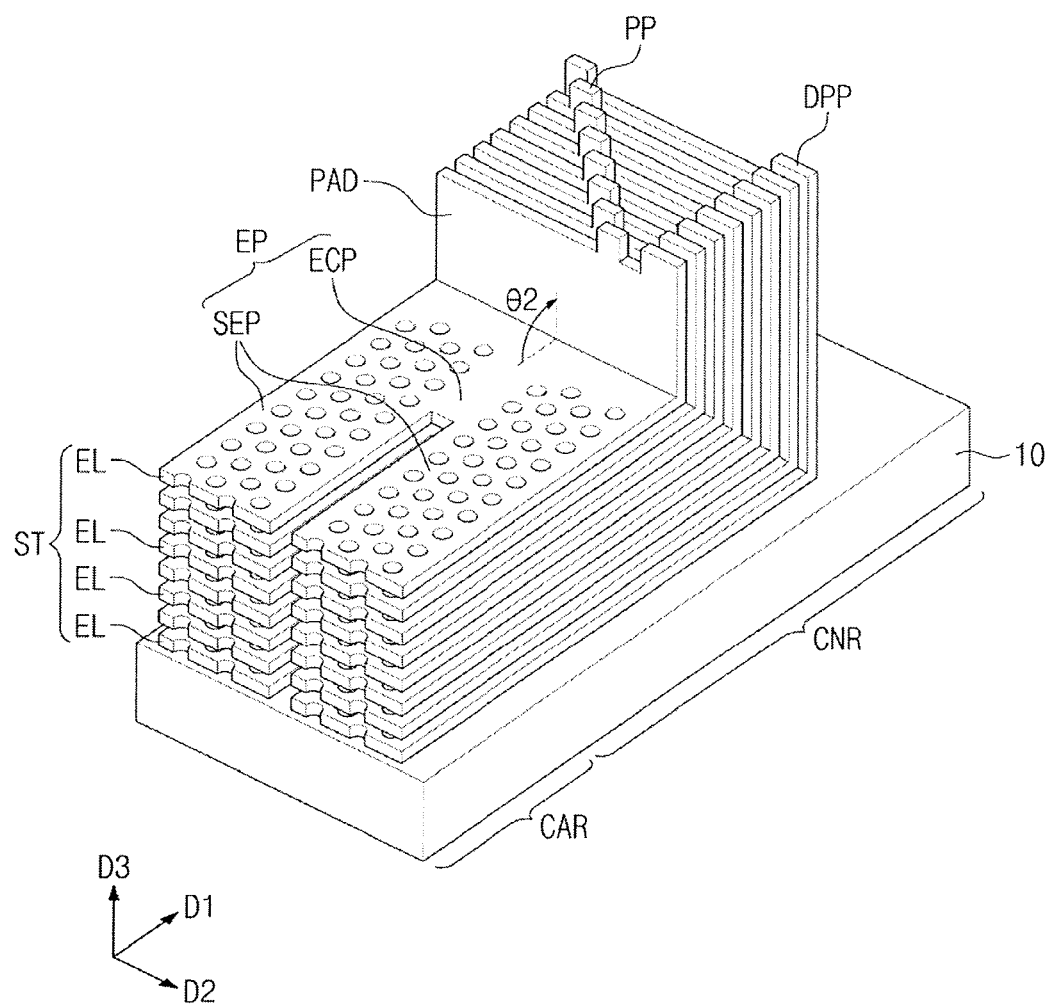
FIGS. 3, 4, and 5 are perspective views illustrating electrode structures of 3D semiconductor devices according to some embodiments of the inventive concepts.
Figure 4:
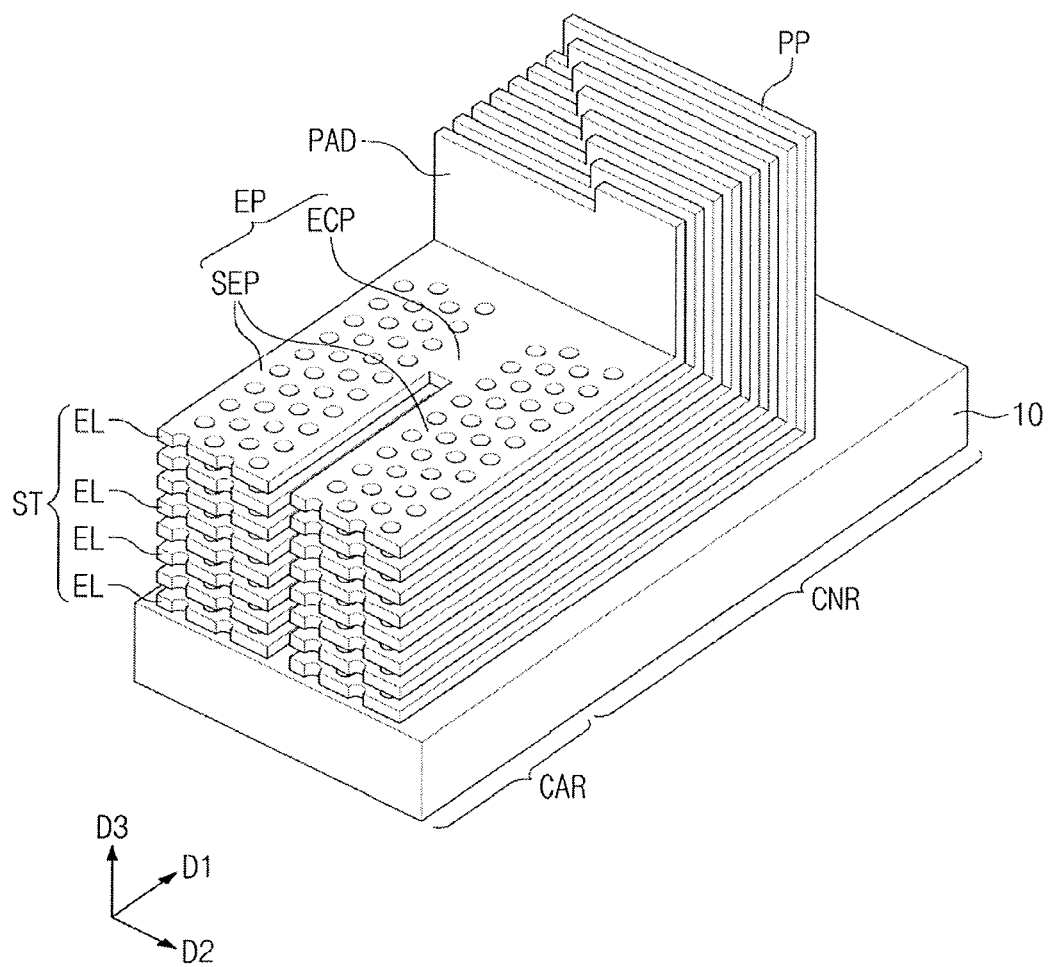
Figure 5:
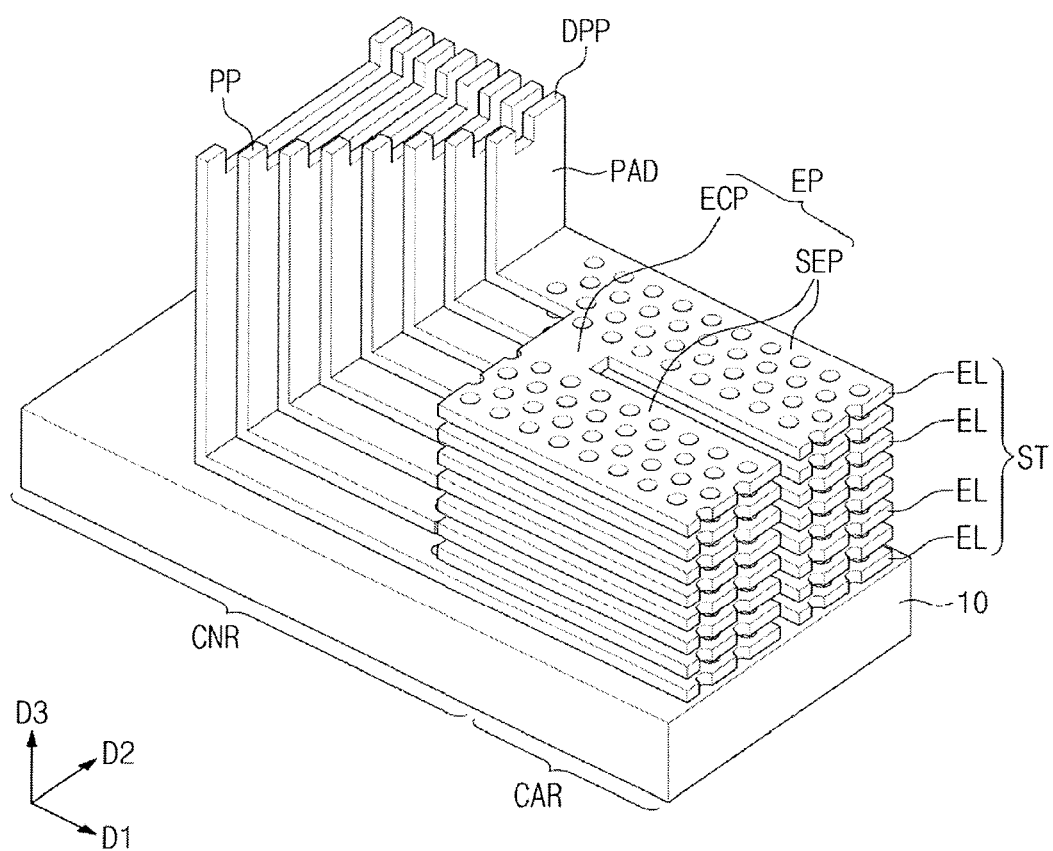

FIGS. 3, 4, and 5 are perspective views illustrating electrode structures of 3D semiconductor devices according to some embodiments of the inventive concepts. Hereinafter, the descriptions to the same features as in the embodiments of FIGS. 2A to 2H will be omitted or mentioned briefly for the purpose of ease and convenience in description.

Referring to FIGS. 3, 4, and 5, an electrode structure ST may be disposed on a substrate 10 including the cell array region CAR and the connection region CNR. The electrode structure ST may include a plurality of electrodes EL sequentially stacked on the substrate 10.

Hereinafter, the electrode portion EL-EP of the electrode EL may be referenced with a reference numeral "EP"; the vertical pad portion EL-PAD of the electrode EL may be referenced with a reference numeral "PAD" and the protrusion EL-PP of the electrode EL may be referenced with a reference numeral "PP".

In some embodiments, each of the electrodes EL may include the electrode portion EP on the cell array region CAR, the vertical pad portion PAD on the connection region CNR, and the protrusion PP vertically protruding from a portion of the vertical pad portion PAD. The electrode portion EP may extend in a first direction D1 parallel to a top surface of the substrate 10. The vertical pad portion PAD may extend from an end of the electrode portion EP and may be inclined at a predetermined angle θ2 with respect to the top surface of the substrate 10. In some embodiments, the predetermined angle θ2 may range between about 90 degrees and about 130 degrees. The predetermined angle is measured from the top surface of the substrate 10 to a sidewall of the vertical pad portion PAD. For example, if the predetermined angle θ2 is about 90 degrees, the vertical pad portion PAD may be vertical with respect to the top surface of the substrate 10.

The electrode portions EP of the electrodes EL may be stacked in a third direction D3 perpendicular to the top surface of the substrate 10, and lengths of the electrode portions EP in the first direction D1 may decrease sequentially as a vertical distance from the substrate 10 increases. In some embodiments, the electrode portions EP may have holes through which the vertical structures described with reference to FIG. 2D penetrate. In some embodiments, each of the electrode portions EP of the electrodes EL may include a plurality of sub-electrode portions SEP extending in the first direction D1 and laterally spaced apart from each other in the second direction D2, and an electrode connection portion ECP laterally connecting the sub-electrode portions SEP to each other.

The vertical pad portions PAD of the electrodes EL may extend from the electrode connection portions ECP in a direction vertical or inclined to the top surface of the substrate 10. The vertical pad portions PAD of the electrodes EL may have widths in the second direction D2, which are substantially equal to each other. The widths of the vertical pad portions PAD in the second direction D2 may be substantially equal to widths of the electrode portions EP in the second direction D2. In some embodiments, the widths of the vertical pad portions PAD in the second direction D2 may be substantially equal to widths of the electrode connection portions ECP in the second direction D2.

Top surfaces of the vertical pad portions PAD may be disposed at the substantially same height (or level) from the substrate 10 and may be higher than the electrode portion EP of the uppermost electrode EL. In addition, lengths of the vertical pad portions PAD in the third direction D3 may decrease sequentially as heights of the electrode portions EP of the electrodes EL based on the substrate 10 are increased sequentially. For example, a length in the third direction D3 of the vertical pad portions PAD of one electrode EL is smaller than a length in the third direction D3 of the vertical pad portions PAD of another electrode EL disposed under the one electrode EL.

In some embodiments, the protrusions PP of the electrodes EL may be arranged in a direction diagonal to the first and second directions D1 and D2 when viewed from a plan view. Top surfaces of the protrusions PP may be disposed at the substantially same height (or level) from the top surface of the substrate 10. For example, the top surfaces of the protrusions PP may be substantially coplanar with each other.

In each of the electrodes EL, a width of the protrusion PP in the first direction D1 may be substantially equal to a width of the vertical pad portion PAD in the first direction D1 (i.e., a thickness of the electrode portion EP). In some embodiments, widths, in the second direction D2, of the protrusions PP of the electrodes EL may be substantially equal to each other. In some embodiments, the widths, in the second direction D2, of the vertical pad portion PAD of the electrodes EL may be changed according to a distance between the sidewalls of the first and second openings OP1 and OP2 described with reference to FIG. 2B. In some embodiments, widths, in the second direction D2, of the protrusions PP of the electrodes EL may be different from each other, as illustrated in FIG. 4. For example, the protrusions PP of the electrodes EL may have first sidewalls arranged in the direction diagonal to the first and second directions D1 and D2 and second sidewalls aligned with each other in the first direction D1.

Heights of the protrusions PP may be varied according to etched depths of the sacrificial layers SL during the formation of the recess regions RR described with reference to FIG. 2C. In addition, the heights, in the third direction D3, of the protrusions PP of the electrodes EL may be substantially equal to each other.

In some embodiments, the widths, in the second direction D2, of the protrusions PP of the electrodes EL may be varied according to the number of the electrodes EL included in the electrode structure ST. In addition, the widths, in the second direction D2, of the protrusions PP of the electrodes EL may also be varied according to the widths, in the second direction D2, of the electrode portions EP.

Angles between the sidewall portions of the sacrificial layers SL and the sidewalls, in the diagonal direction, of the first and second openings OP1 and OP2 may be varied according to the number of the sacrificial layers SL included in the thin layer structure 100. In addition, the angles may also be varied according to the widths, in the second direction D2, of the electrode portion EP.

In some embodiments, each of the electrodes EL may further include a dummy protrusion DPP that protrudes from the vertical pad portion PAD and is spaced apart from the protrusion PP in the second direction D2. The dummy protrusions DPP of the electrodes EL may be arranged in the first direction D1, and widths of the dummy protrusions DPP in the second direction D2 may be substantially equal to each other.

In some embodiments, as illustrated in FIG. 5, the electrode portions EP of the electrodes EL may have a stepwise structure upward in the second direction D2 on the connection region CNR. Thus, widths, in the second direction D2, of the electrode portions EP on the connection region CNR may decrease sequentially as a vertical distance from the substrate 10 increases. In addition, widths of the vertical pad portions PAD in the second direction D2 may decrease sequentially as the heights of the electrode portions EP from the top surface of the substrate 10 may increase sequentially. For example, first sidewalls of the vertical pad portions PAD may be arranged along the diagonal direction. In some embodiments, second sidewalls of the vertical pad portions PAD may be aligned with each other in the first direction D1. In addition, the protrusions PP may be respectively disposed on end portions of the vertical pad portions PAD, which are arranged in the diagonal direction.

FIGS. 6A to 12A are perspective views illustrating methods for manufacturing a 3D semiconductor device according to some embodiments of the inventive concepts. FIGS. 6B to 12B are cross-sectional views taken along lines I-I' of FIGS. 6A to 12A, respectively, to illustrate methods for manufacturing a 3D semiconductor device according to some embodiments of the inventive concepts. FIGS. 6C to 12C are cross-sectional views taken along lines II-II' of FIGS. 6A to 12A, respectively, to illustrate methods for manufacturing a 3D semiconductor device according to some embodiments of the inventive concepts. FIGS. 13A and 13B are cross-sectional views illustrating modified embodiments of a method for manufacturing a 3D semiconductor device according to some embodiments of the inventive concepts.

Hereinafter, the descriptions to the same features as in the embodiments of FIGS. 2A to 2H will be omitted or mentioned briefly for the purpose of ease and convenience in explanation.

Figure 6A:
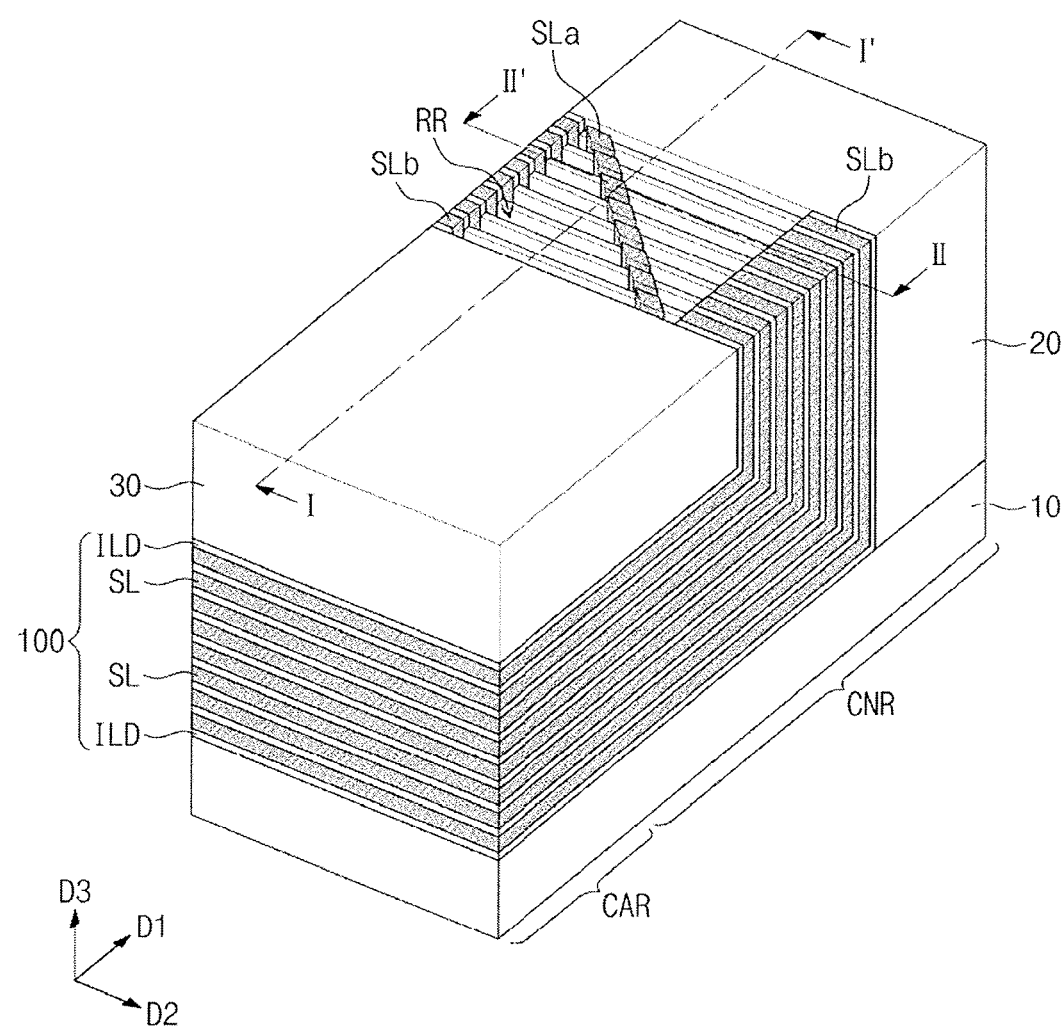
Figure 6B:
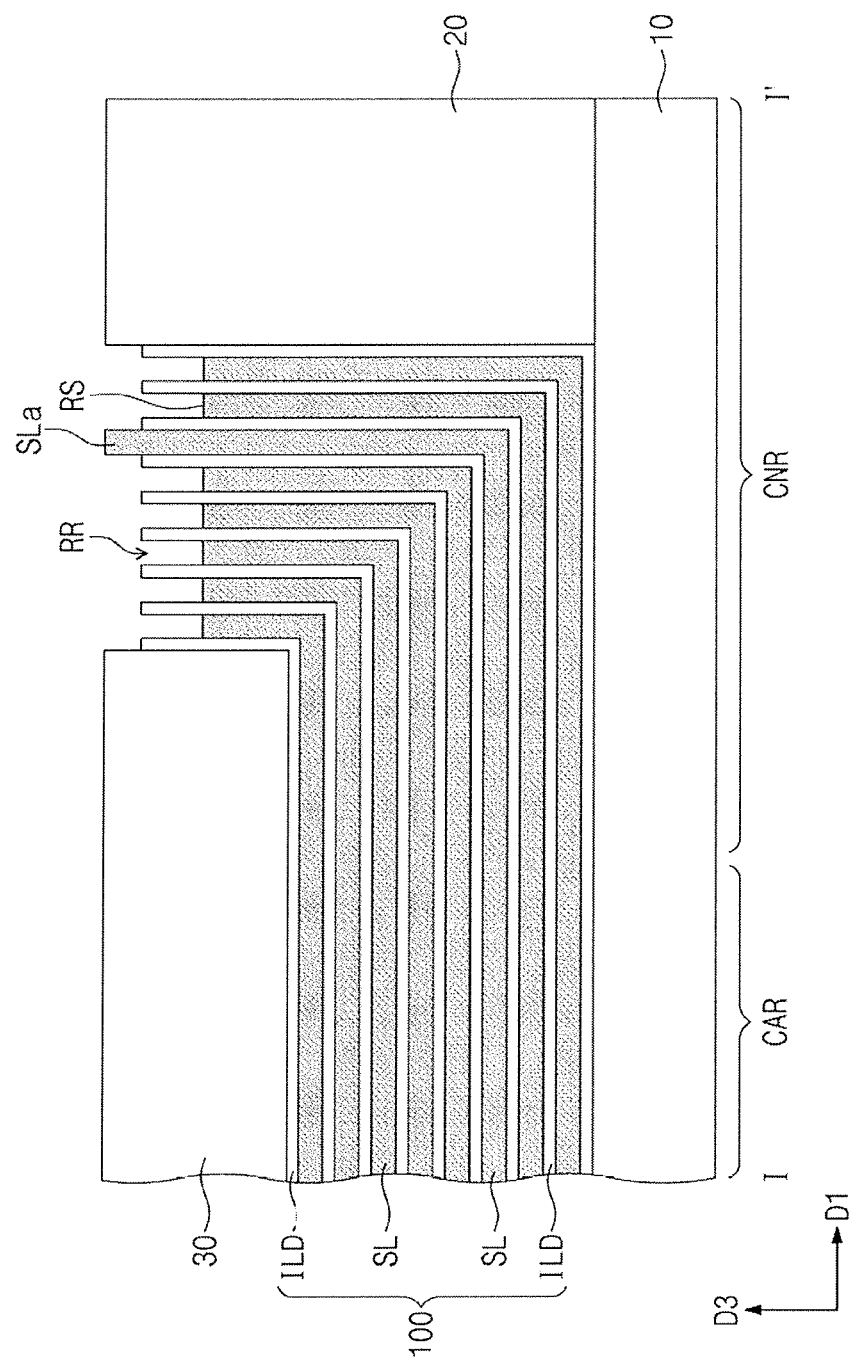
Figure 6C:
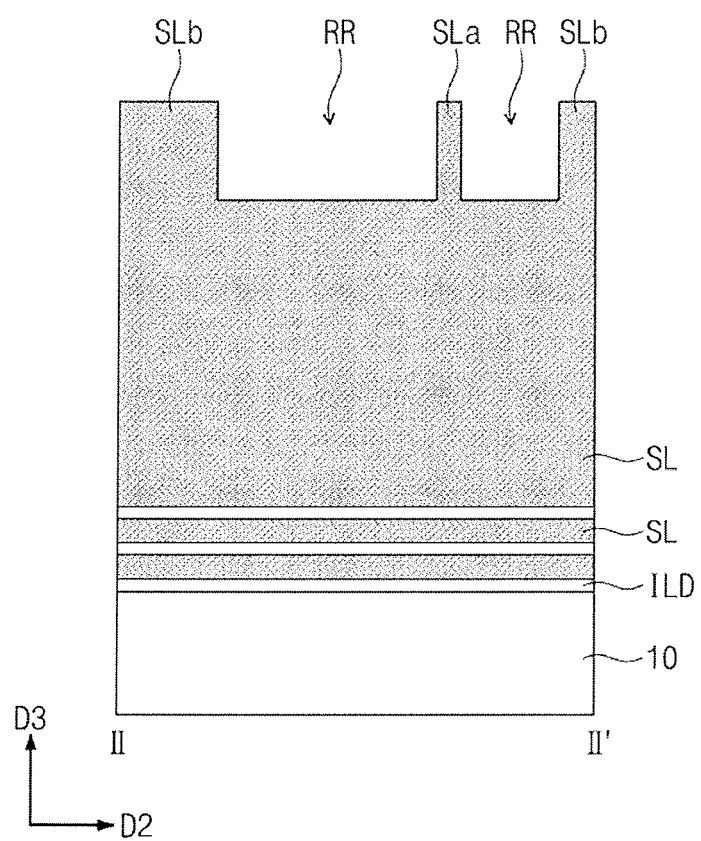

Referring to FIGS. 6A, 6B, and 6C, a thin layer structure 100 may be formed in a trench defined by a mold pattern 20. As described with reference to FIG. 2A, the thin layer structure 100 may include insulating layers ILD and sacrificial layers SL alternately and repeatedly stacked on the substrate 10, and each of the insulating layers ILD and each of the sacrificial layers SL may include a horizontal portion of the cell array region CAR and a sidewall portion of the connection region CNR.

Next, recess regions RR may be formed in the thin layer structure 100 of the connection region CNR. The recess regions RR may be formed between the sidewall portions of the insulating layers ILD on the connection region CNR. In addition, protrusions SLa may be formed at the sacrificial layers SL by the formation of the recess regions RR. As described with reference to FIG. 2B, the first mask pattern (see MP1 of FIG. 2B) may be formed on the thin layer structure 100, and then, portions of the sacrificial layers SL may be selectively etched using the first mask pattern as an etch mask, thereby forming the recess regions RR. In some embodiments, top surfaces of the sacrificial layers SL in the recess regions RR may be lower than top surfaces of the sidewall portions of the insulating layers ILD and may be higher than a bottom surface of the uppermost sacrificial layer SL disposed on the cell array region CAR. In some embodiments, the protrusions SLa formed at the sacrificial layers SL on the connection region CNR may be arranged in a direction diagonal to first and second directions D1 and D2 when viewed from a plan view.

In some embodiments, portions of the insulating layers ILD may also be etched during the process of etching the portions of the sacrificial layers SL. Thus, the top surfaces of the sidewall portions of the insulating layers ILD may be lower than a top surface of the mold pattern 20. In this case, portions of sidewalls of the protrusions SLa of the sacrificial layers SL may be exposed. In some embodiments, as illustrated in FIG. 13A, the insulating layers ILD may cover the sidewalls of the protrusions SLa of the sacrificial layers SL during the process of etching the portions of the sacrificial layers SL. In some embodiments, as illustrated in FIG. 13B, sidewalls of the protrusions SLa may be laterally partially etched during the formation of the recess regions RR, and thus widths of the protrusions SLa in the first direction D1 may become smaller than widths, in the first direction D1, of the sidewall portions of the sacrificial layers SL. For example, sizes of the protrusions SLa may be varied according to the etching process for forming the recess regions RR.

The dummy protrusions SLb may be spaced apart from the protrusions SLa in the second direction D2.

The sidewall portions of the plurality of sacrificial layers SL may have recessed surfaces RS with the recess regions RR. The protrusions SLa may be protruded from the recessed surfaces RS of the sidewall portions of the plurality of sacrificial layers, as shown in FIG. 6B.

Figure 7A:
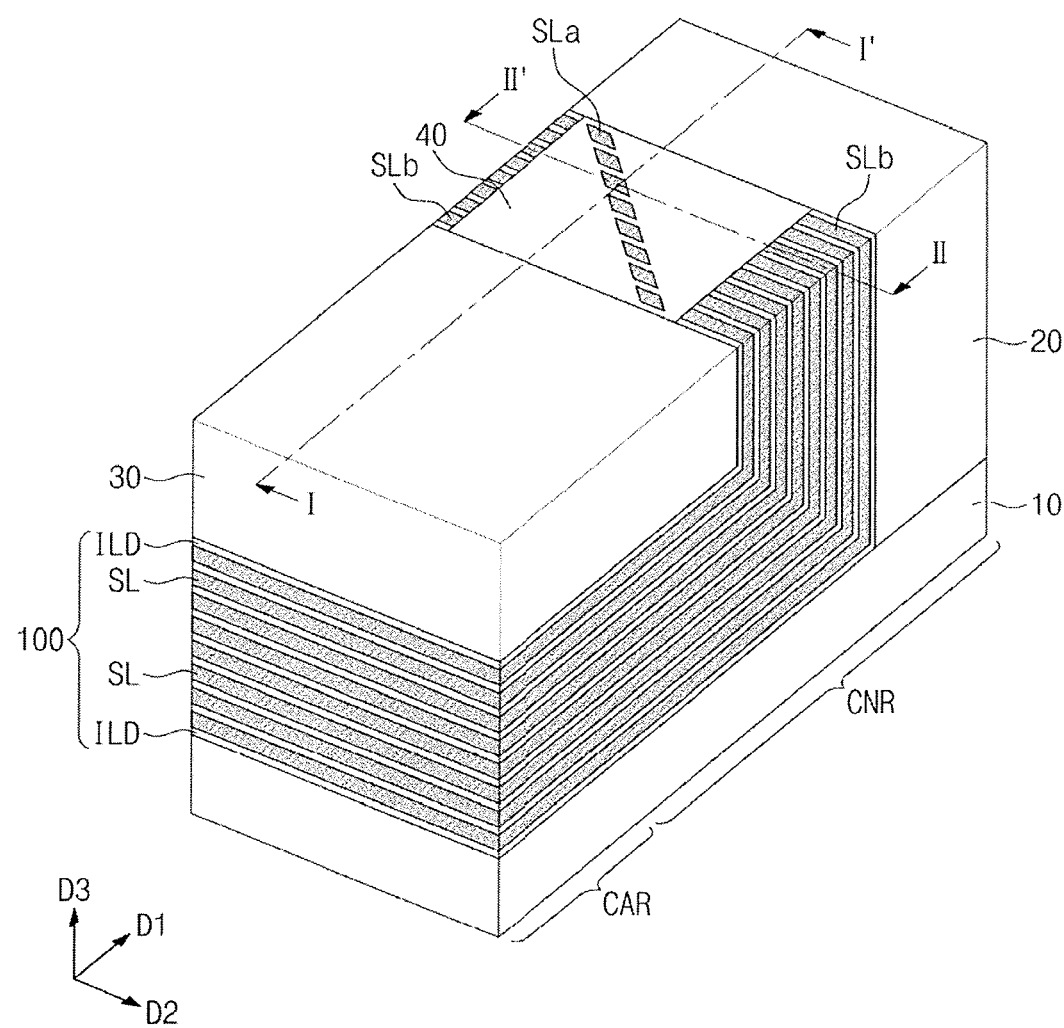
Figure 7B:
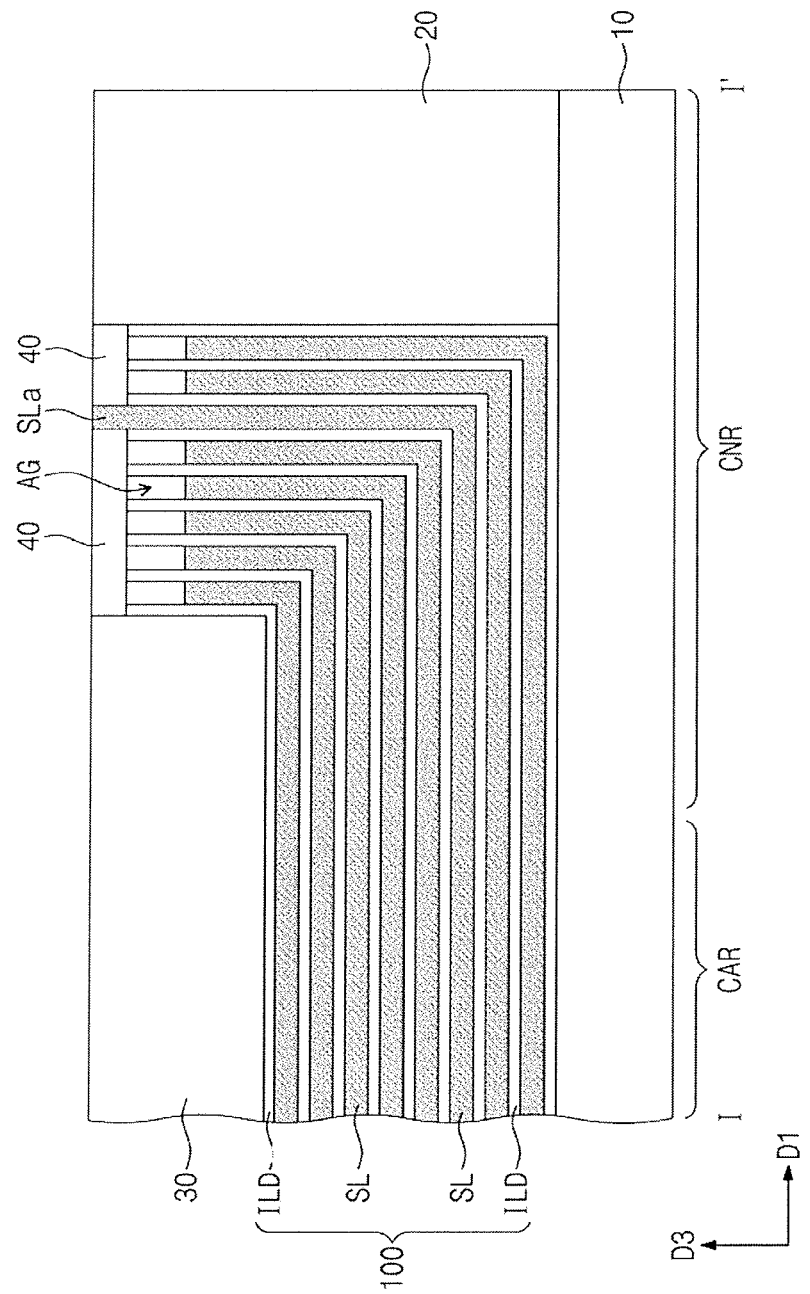
Figure 7C:
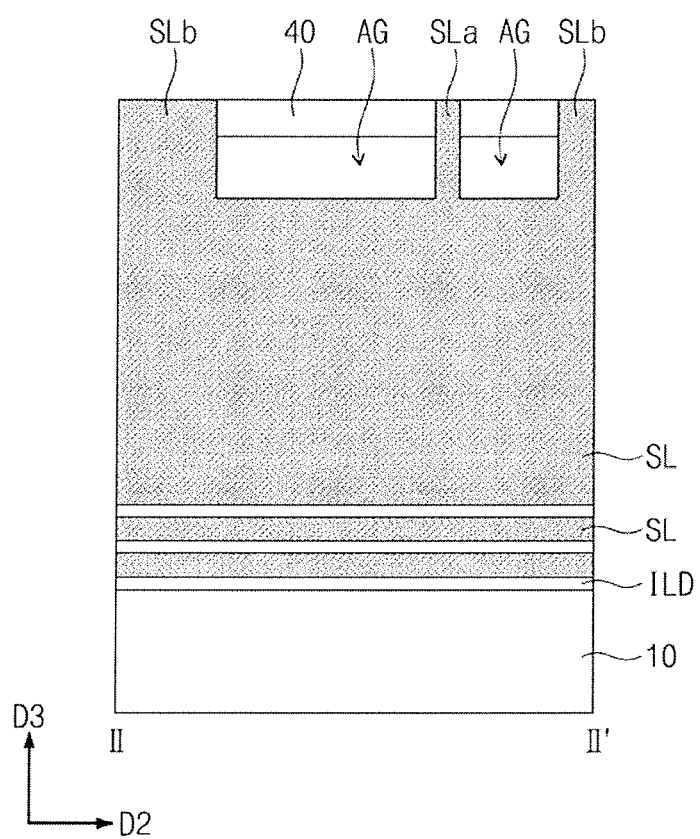

Referring to FIGS. 7A, 7B, and 7C, a filling insulation layer 40 may be formed to define air gaps AG in the recess regions RR. Here, the air gaps AG may be locally formed in the recess regions RR, and the top surfaces of the sacrificial layers SL in the recess regions RR may be exposed by the air gaps AG. For example, the filling insulation layer 40 may define top surfaces of the air gaps AG and the top surfaces of the sacrificial layers SL disposed on the connection region CNR may define bottom surfaces of the air gaps AG. The sidewall portions of the insulating layers ILD disposed on the connection region CNR may define sidewalls of the air gaps AG.

In some embodiments, the filling insulation layer 40 may be formed using a deposition process. The deposition process may be controlled to have a step coverage of the filling insulating layer 40 to the extent that the air gaps AG are formed under the filling insulating layer 40. For example, the filling insulation layer 40 may be formed using a physical vapor deposition (PVD) process. In the deposition process, the filling insulation layer 40 may close top ends of the recess regions RR by an overhang phenomenon in a state in which the recess regions RR are not completely filled with the filling insulation layer 40. For example, the filling insulating layer 40 may close the top ends of the recess regions RR before completely filling the recess regions RR. Thus, the filling insulation layer 40 may define the air gaps AG in the recess regions RR. Since the air gaps AG are defined in the recess regions RR, the air gaps AG may be defined at both sides of the protrusion SLa of each of the sacrificial layers SL. Here, a top point of the air gap AG may be lower than the top surface of the mold pattern 20. In some embodiments, the filling insulation layer 40 may be formed on the recessed top surfaces of the sidewall portions of the insulating layers ILD and may cover the sidewalls of the protrusions SLa of the sacrificial layers SL.

A planarization process may be performed on the filling insulation layer 40 after the formation of the filling insulation layer 40, and thus a top surface of the filling insulation layer 40 may be substantially coplanar with the top surface of the mold pattern 20. For example, the filling insulation layer 40 may include a high-density plasma (HDP) oxide layer, a tetraethylorthosilicate (TEOS) layer, a plasma enhanced TEOS (PE-TEOS) layer, or an $O_3$-TEOS layer.

Figure 8A:
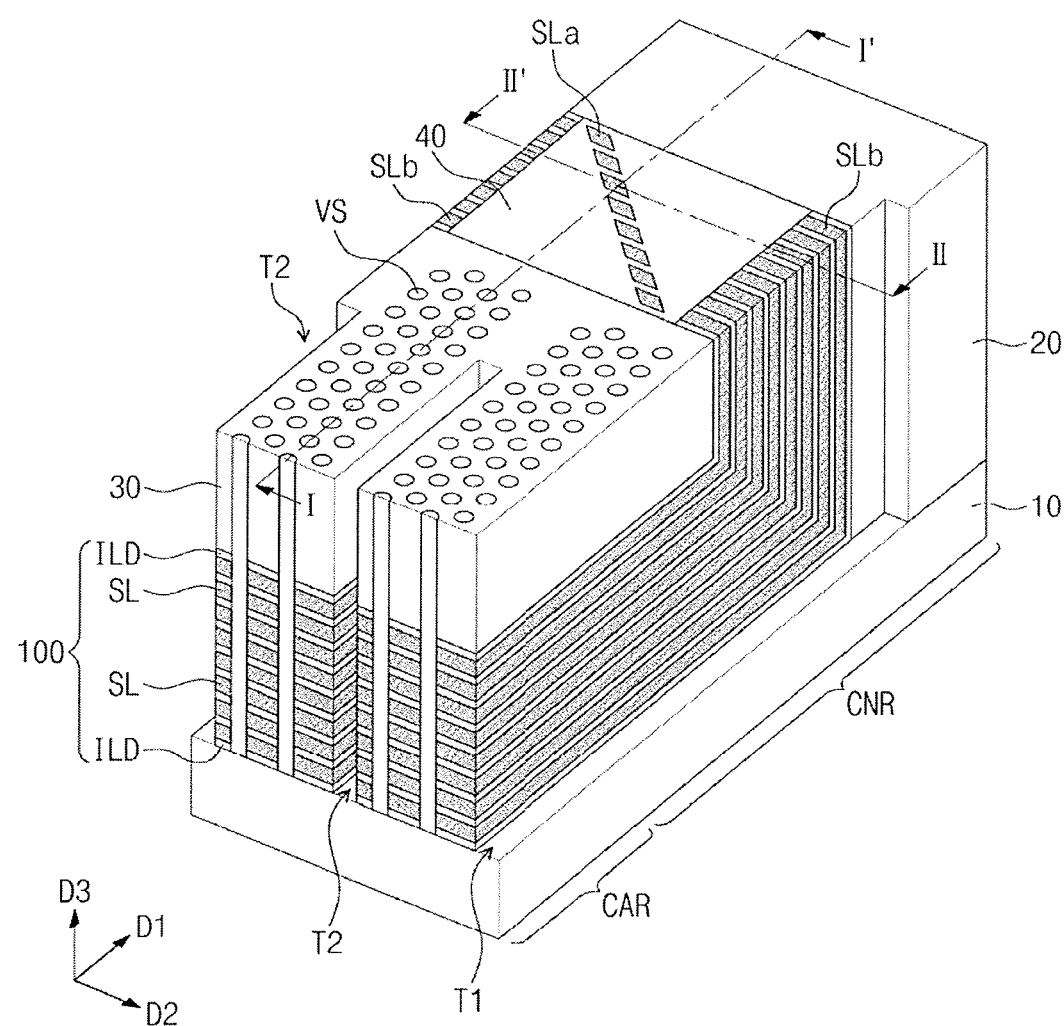
Figure 8B:
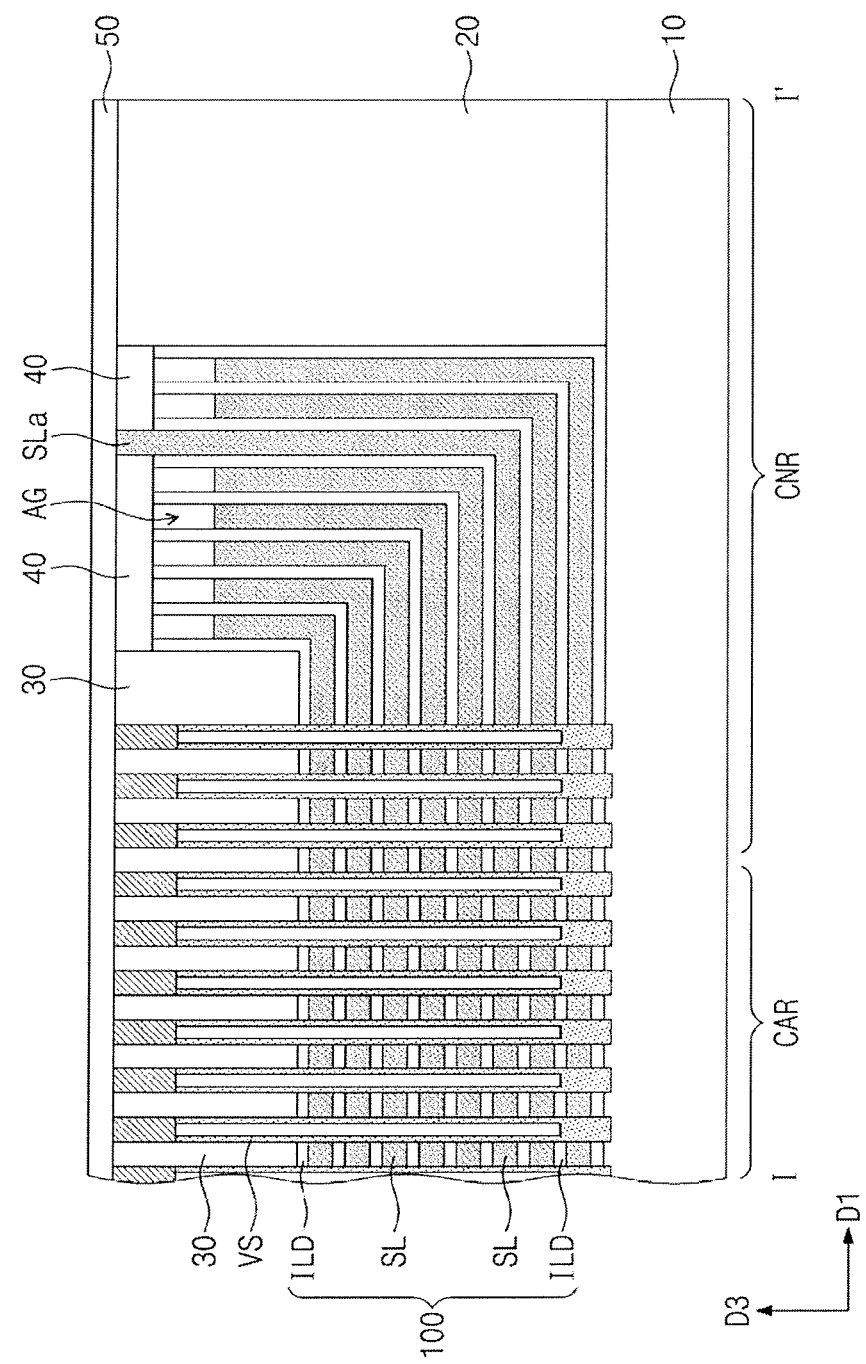
Figure 8C:
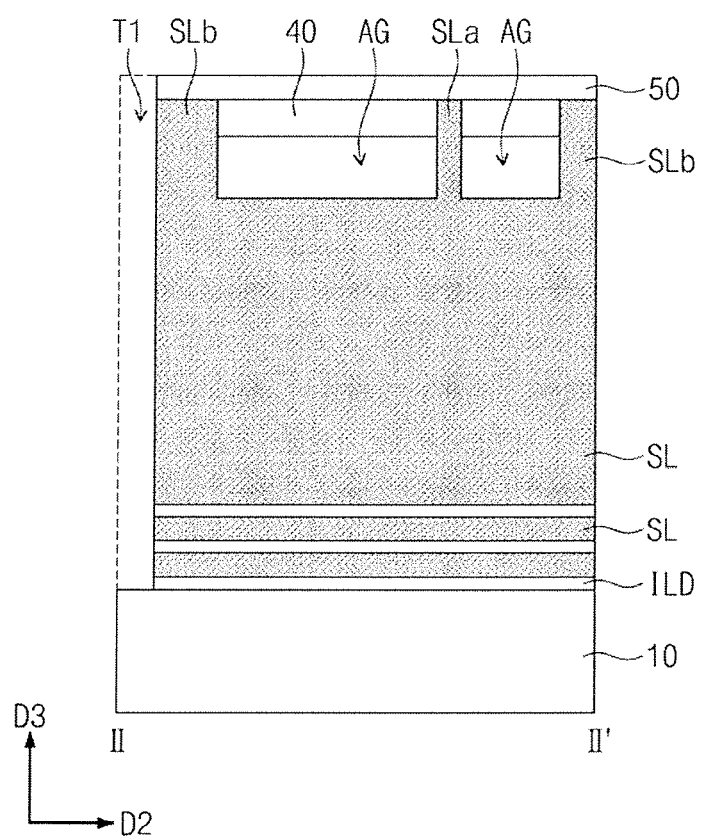

Referring to FIGS. 8A, 8B, and 8C, vertical structures VS may be formed to penetrate the thin layer structure 100 on the cell array region CAR, as described with reference to FIG. 2D. A capping layer 50 may be formed on the thin layer structure 100 after the formation of the vertical structures VS. The capping layer 50 may be omitted from FIG. 8A for the convenience of description. FIGS. 8B and 8C shows the capping layer 50 formed on the thin layer structure 100. Next, the thin layer structure 100 may be patterned to form first and second trenches T1 and T2, as described with reference to FIG. 2E. In some embodiments, at least one first trench T1 and at least one second trench T2 may be formed by patterning the thin layer structure 100. The first and second trenches T1 and T2 may extend in the first direction D1, and a length of the second trench T2 in the first direction D1 may be shorter than a length of the first trench T1 in the first direction D1. In addition, the first and second trenches T1 and T2 may be spaced apart from the vertical structures VS, and the first trench T1 may be spaced apart from the protrusions SLa of the sacrificial layers SL.

The first trench T1 may expose the horizontal portions and the sidewall portions of the sacrificial layers SL on the cell array region CAR and the connection region CNR. The second trench T2 may expose the horizontal portions of the sacrificial layers SL on the cell array region CAR.

Figure 9A:
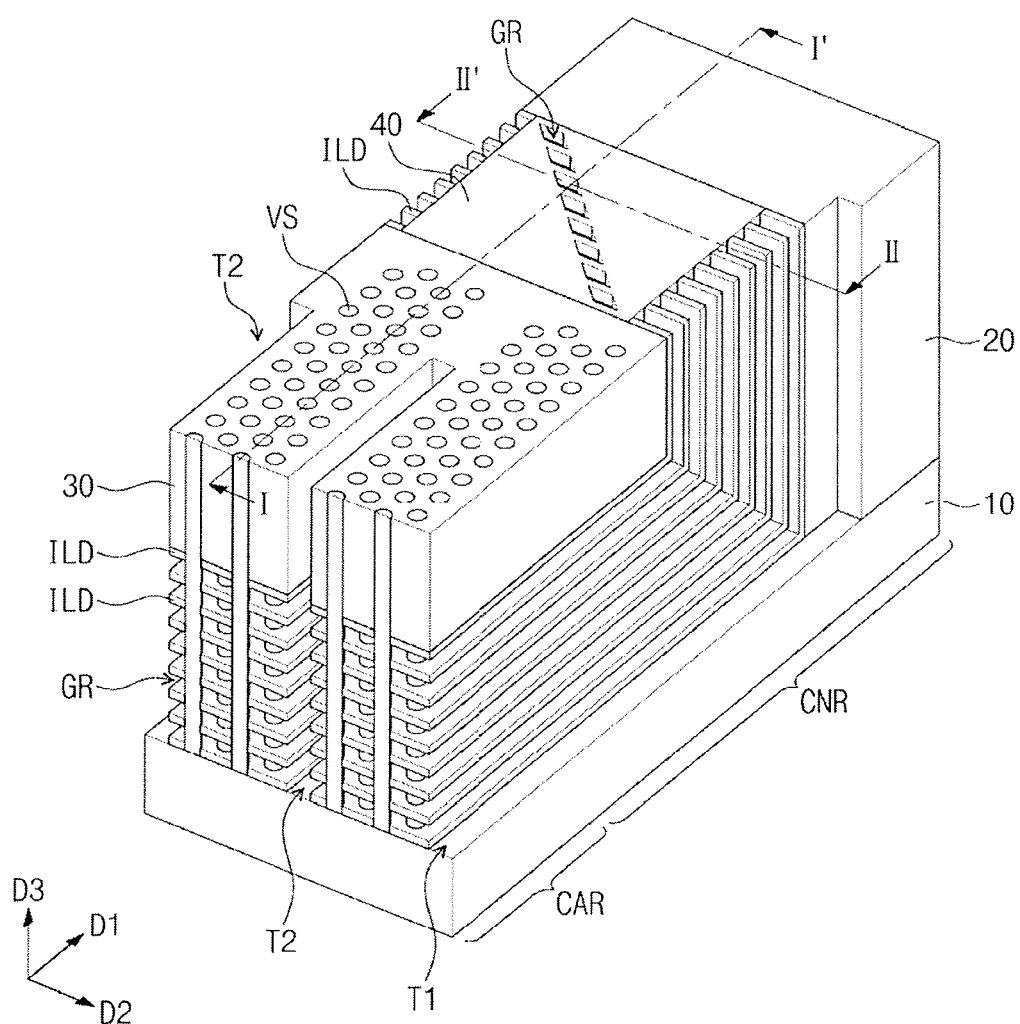
Figure 9B:
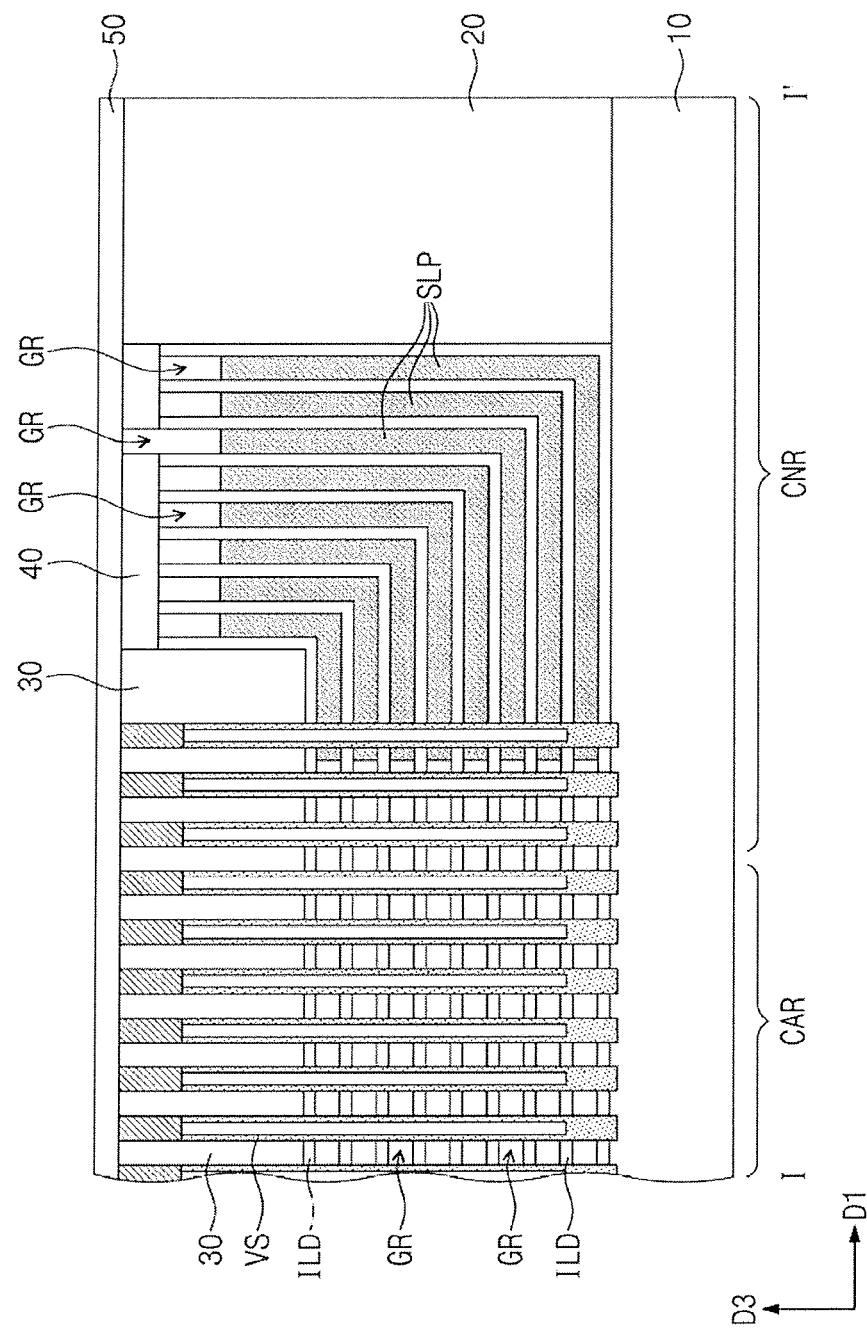
Figure 9C:
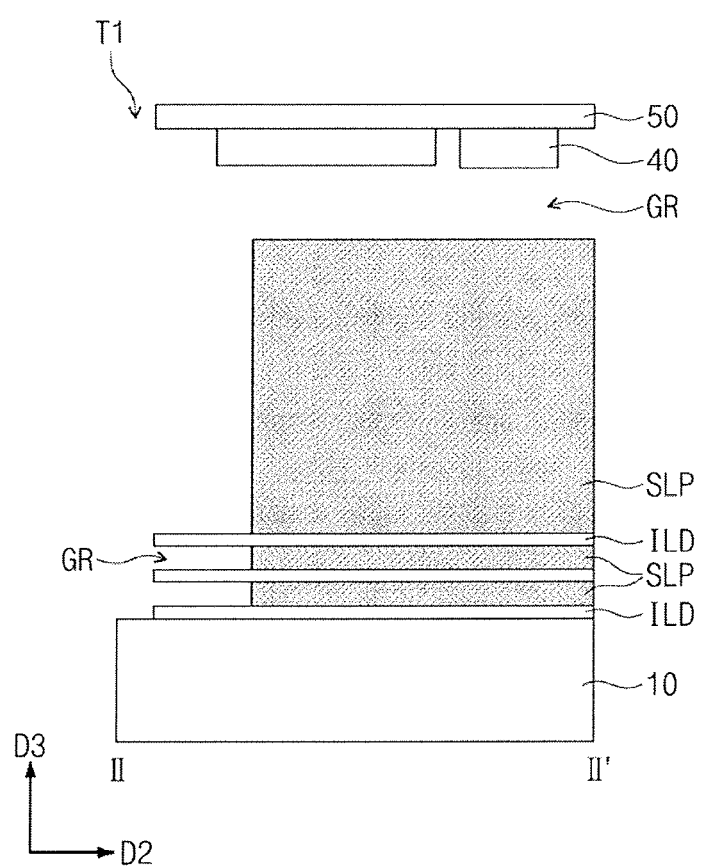

Referring to FIGS. 9A, 9B, and 9C, the sacrificial layers SL exposed by the first and second trenches T1 and T2 may be selectively and laterally etched to form gate regions GR between the insulating layers ILD.

As described above, the gate regions GR may be formed by isotropically etching the sacrificial layers SL using an etchant having etch selectivity with respect to the insulating layers ILD, the vertical structures VS, and the substrate 10. Since the etchant is laterally supplied through the first and second trenches T1 and T2 on the cell array region CAR, portions of the horizontal portions of the sacrificial layers SL may remain on the connection region CNR when the gate regions GR exposing sidewalls of the vertical structures VS are formed on the cell array region CAR.

In addition, during the formation of the gate regions GR, the etchant may be provided through the first trench T1 on the connection region CNR to laterally etch the sidewall portions of the sacrificial layers SL. Since the sidewall portions of the sacrificial layers SL are isotropically etched, the air gaps AG defined under the filling insulation layer 40 may be exposed. Subsequently, the etchant may be provided through the air gaps AG to etch the protrusions SLa of the sacrificial layers SL. Portions of the sidewall portions of the sacrificial layers SL may remain after the removal of the protrusions SLa of the sacrificial layers SL.

For example, the gate regions GR may be formed between the insulating layers ILD by the isotropic etching process performed on the sacrificial layers SL, and sacrificial patterns SLP may also be formed on the connection region CNR by the isotropic etching process. Sidewall portions of the sacrificial patterns SLP may be spaced apart from a bottom surface of the filling insulation layer 40, and thus the gate regions GR may extend between the filling insulation layer 40 and the sacrificial patterns SLP in the second direction D2 on the connection region CNR. For example, each of the gate regions GR on the connection region CNR may have a vertical region parallel to the sidewall of the mold pattern 20 and a horizontal region extending in the second direction D2 between the filling insulation layer 40 and each of the sacrificial patterns SLP.

In some embodiments, each of the sacrificial patterns SLP may have a horizontal portion parallel to the top surface of the substrate 10 and a sidewall portion parallel to the sidewall of the mold pattern 20. For example, the sacrificial patterns SLP may have L-shapes, and some of the vertical structures VS may penetrate the horizontal portions of the sacrificial patterns SLP. Since the sidewall portions of the sacrificial patterns SLP fill portions of spaces between the insulating layers ILD on the connection region CNR, the sidewall portions of the sacrificial patterns SLP may be used as supporters that inhibit or prevent the insulating layers ILD from bending, leaning or collapsing on the connection region CNR. In addition, since the etchant is laterally provided through the first trench T1 on the connection region CNR during the isotropic etching process, the etching amount of the sacrificial layers SL of the connection region CNR may be less than that of the sacrificial layers SL of the cell array region CAR. Thus, a horizontal distance between the first trench T1 and the sidewall of the sacrificial pattern SLP on the connection region CNR may be smaller than a horizontal distance between the first trench T1 and the second trench T2 on the cell array region CAR.

Figure 10A:
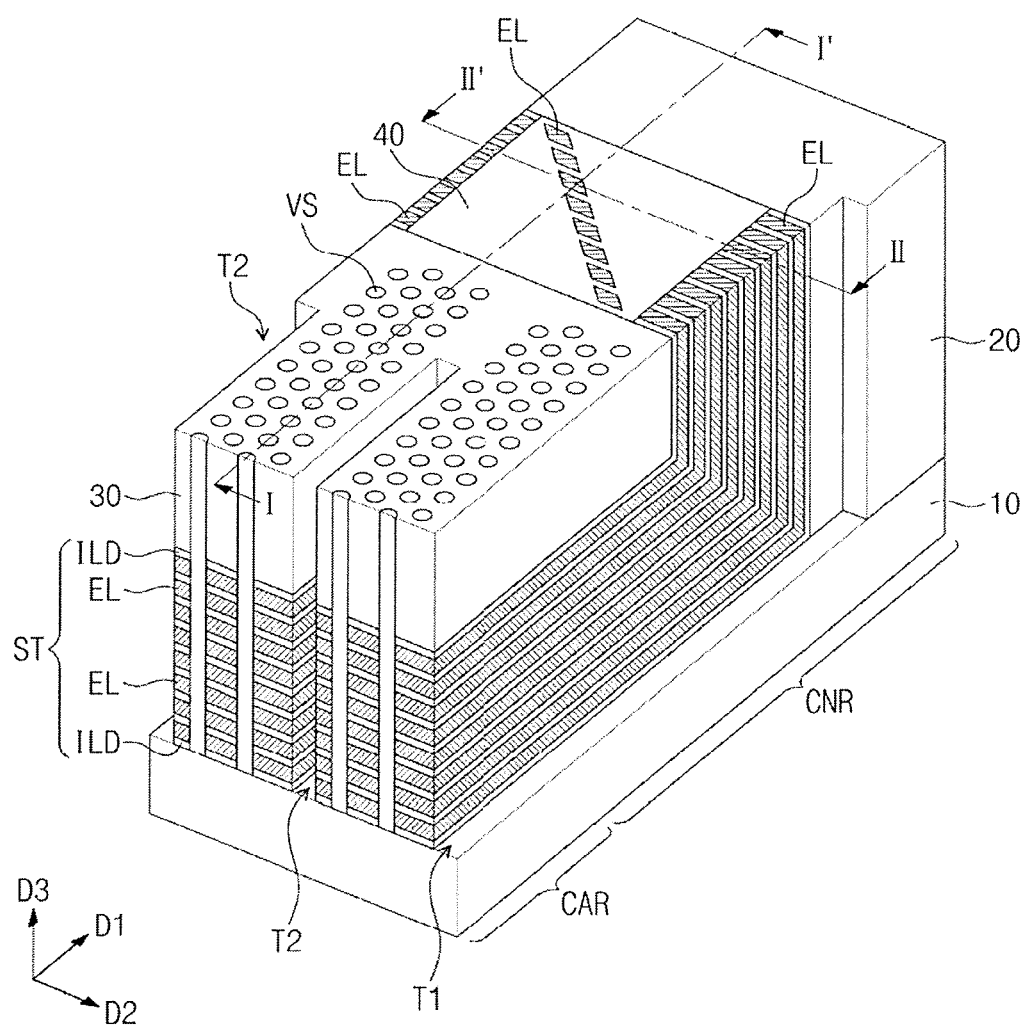
Figure 10C:
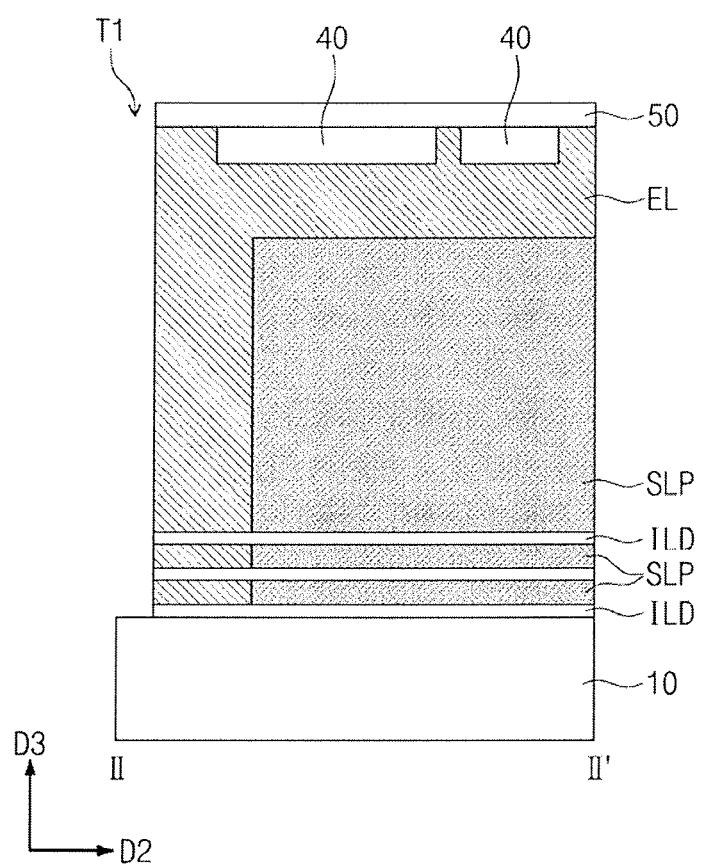

Referring to FIGS. 10A, 10B, and 10C, electrodes EL may be formed in the gate regions, respectively. A gate conductive layer may be deposited, and then, the gate conductive layer disposed in the first and second trenches T1 and T2 may be etched to form the electrodes EL, as described with reference to FIG. 2G. The gate conductive layer may be deposited using a deposition process having a step coverage to the extent that spaces between the insulating layers ILD of the cell array region CAR may be filled with the gate conductive layer. In addition, the gate conductive layer may cover the sidewall portions of the sacrificial patterns SLP on the connection region CNR and may fill the gate regions between the filling insulation layer 40 and top surfaces of the sacrificial patterns SLP. An electrode structure ST may be formed by the formation of the electrodes EL. The electrode structure ST may include the insulating layers ILD and the electrodes EL which are alternately and repeatedly stacked.

Thus, the electrodes EL may include electrode portions that extend in the first direction D1 and surround the vertical structures VS on the cell array region CAR. In addition, the electrodes EL may further include vertical pad portions extending along the sidewalls of the sidewall portions of the sacrificial patterns SLP, horizontal pad portions extending from the vertical pad portions in the second direction D2 along the top surfaces of the sidewall portions of the sacrificial patterns SLP, and protrusions vertically protruding from the horizontal pad portions, which are disposed on the connection region CNR. The electrodes EL according to the present embodiment will be described in more detail with reference to FIG. 14.

In some embodiments, a horizontal insulating layer (not shown) having a substantially uniform thickness may be formed on inner surfaces of the gate regions before the formation of the electrodes EL. Thus, portions of the horizontal insulating layer may be respectively disposed between the sacrificial patterns SLP and the electrodes EL on the connection region CNR.

Figure 11A:
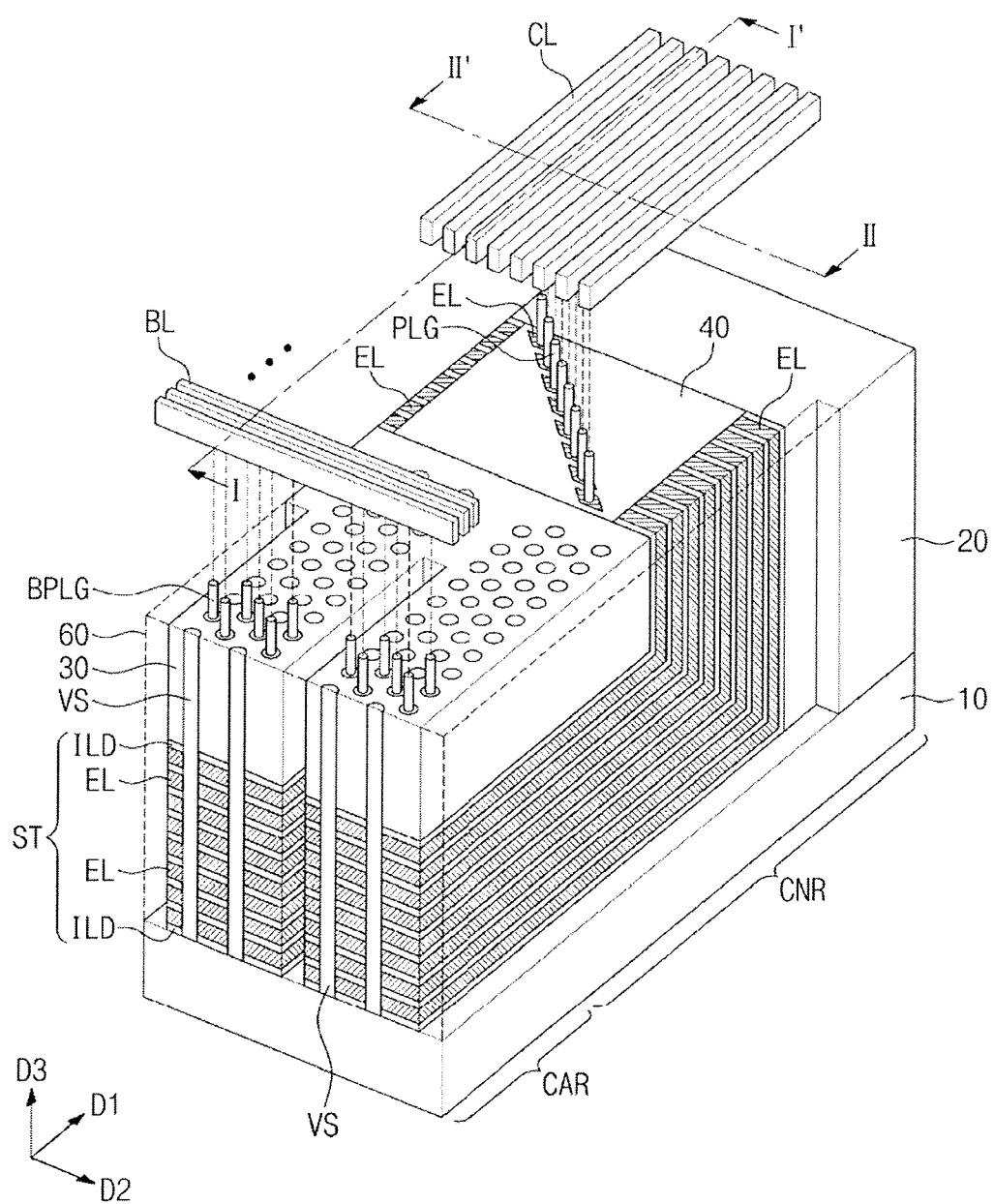
Figure 11B:
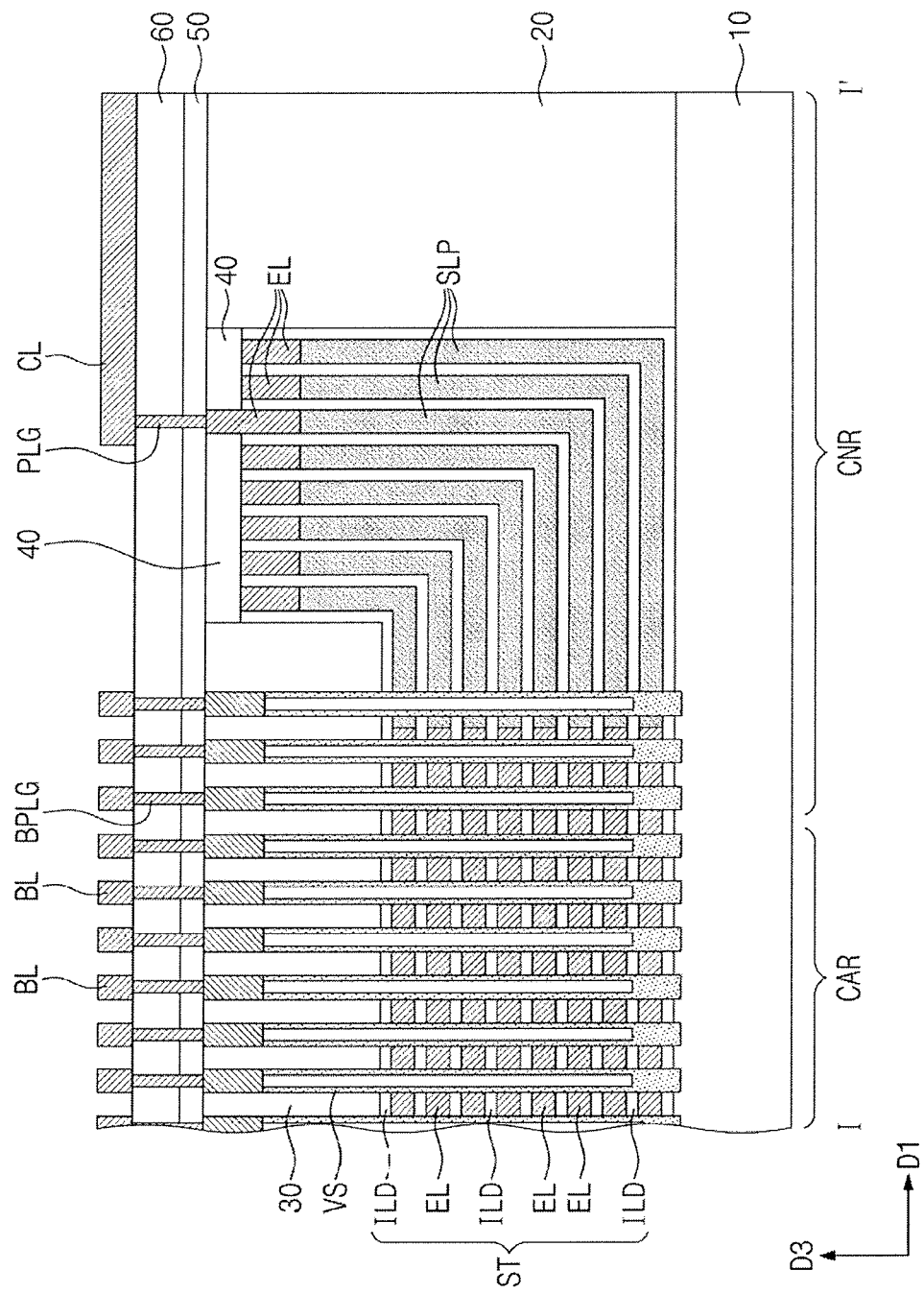
Figure 11C:
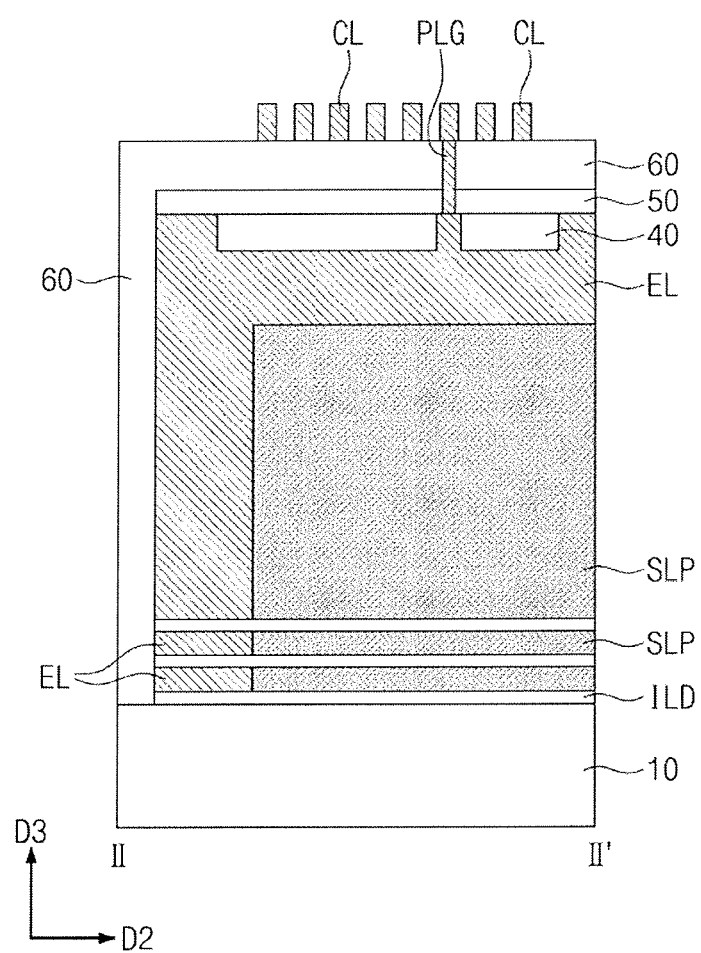

Referring to FIGS. 11A, 11B, and 11C, isolation insulating patterns 60 may be formed in the first and second trenches T1 and T2 of FIG. 10A, respectively, after the formation of the electrodes EL. An interconnection structure may be formed on the connection region CNR to be electrically connected to the electrode structure ST. The interconnection structure may include contact plugs PLG connected to the protrusions of the electrodes EL and conductive lines CL connected to the contact plugs PLG. In addition, bit line contact plugs BPLG and bit lines BL may be formed on the cell array region CAR. The bit line contact plugs BPLG may be electrically connected to the vertical structures VS, and the bit lines BL may extend in the second direction D2 to intersect the electrodes EL. The bit lines BL may be electrically connected to the vertical structures VS through the bit line contact plugs BPLG.

Figure 12A:
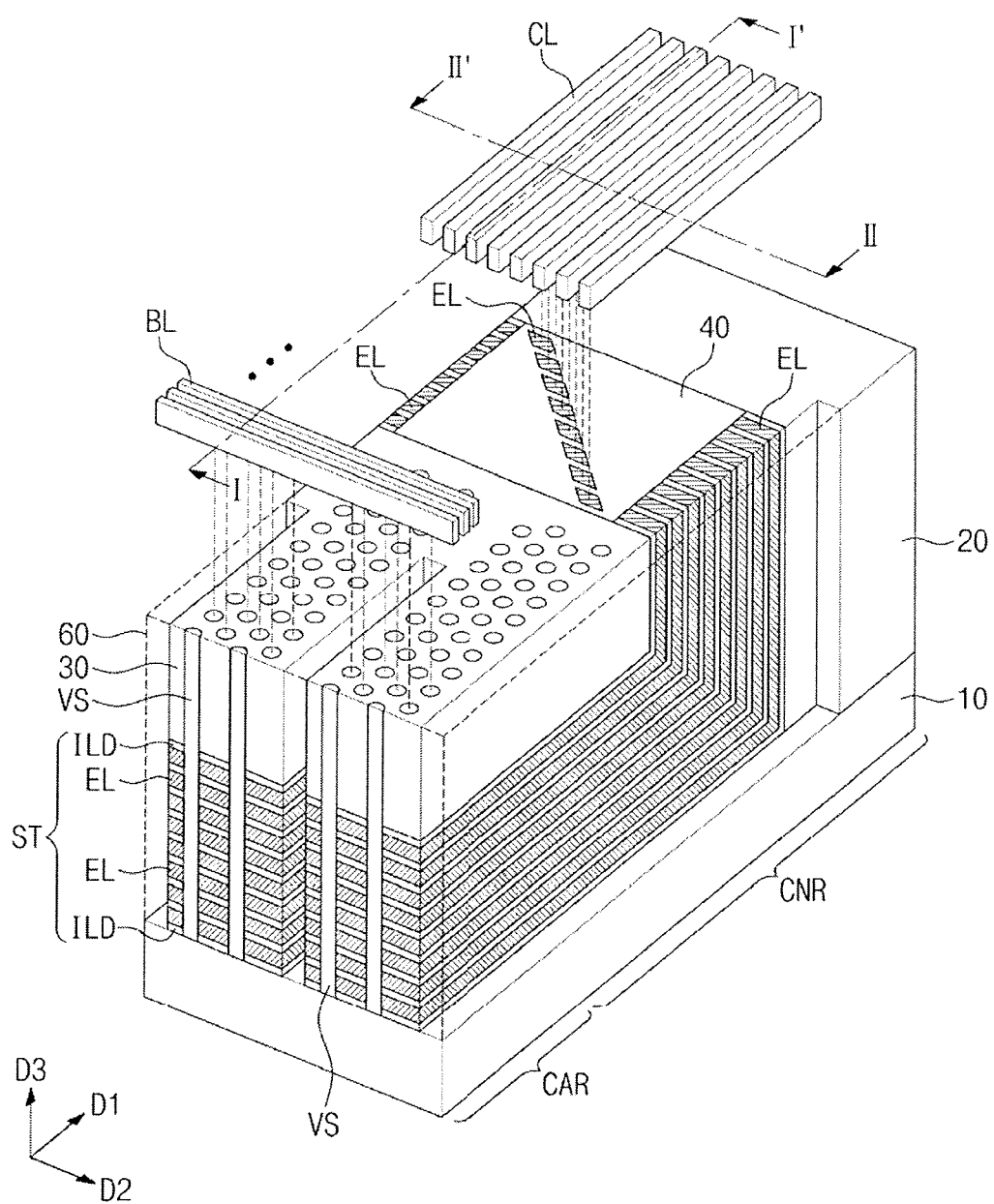
Figure 12B:
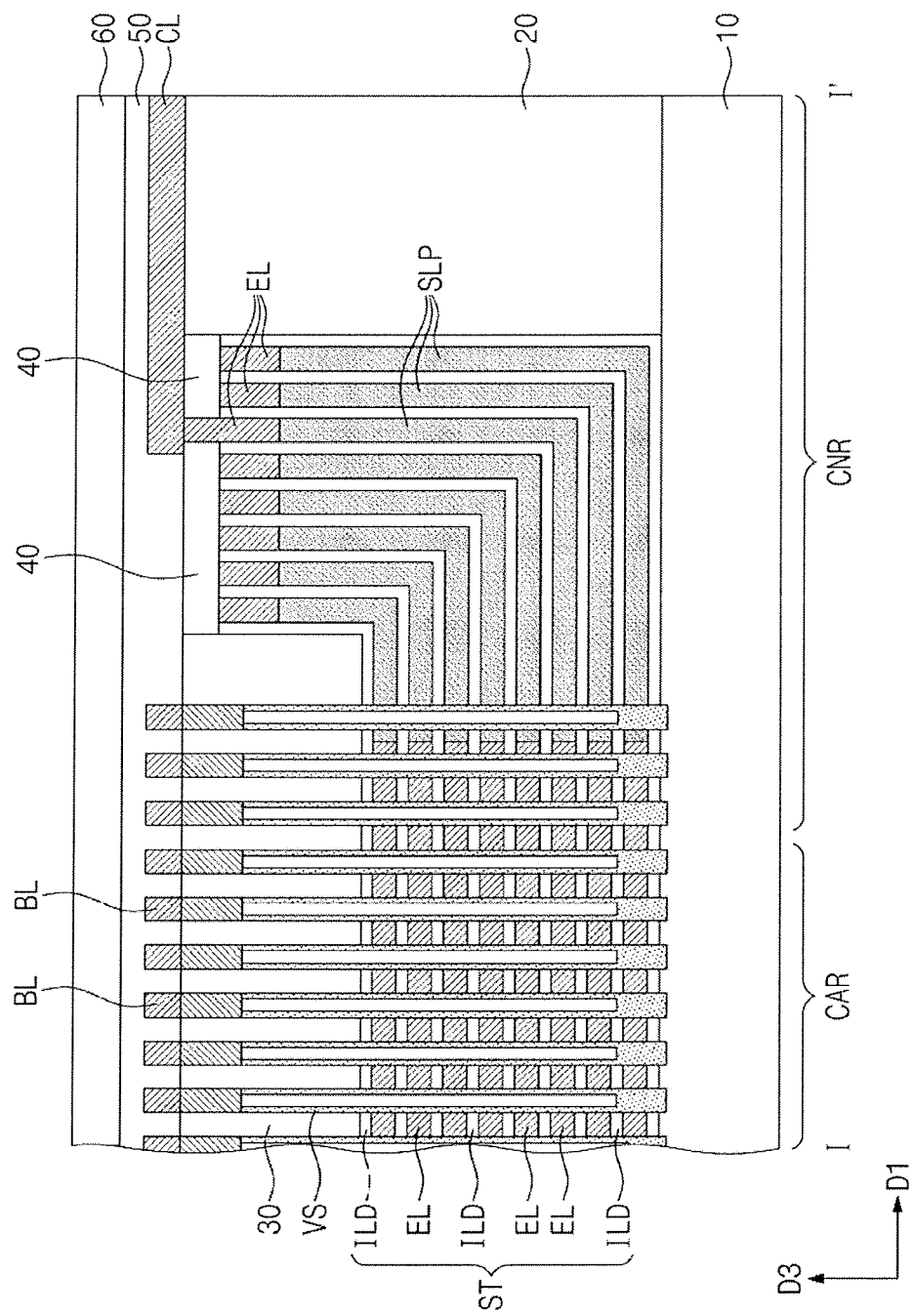
Figure 12C:
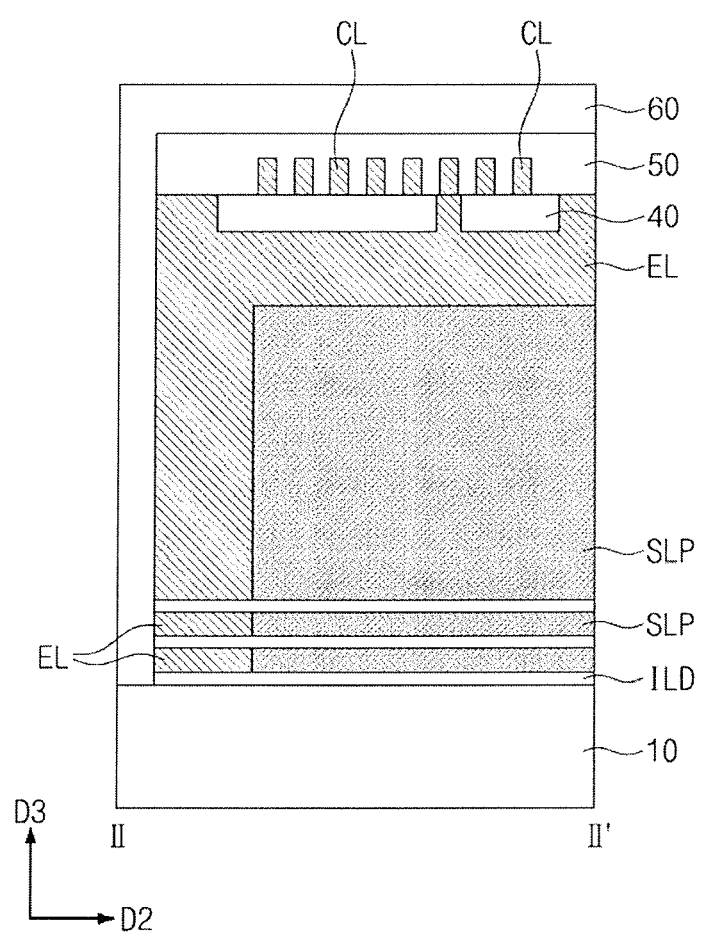
Figure 13A:
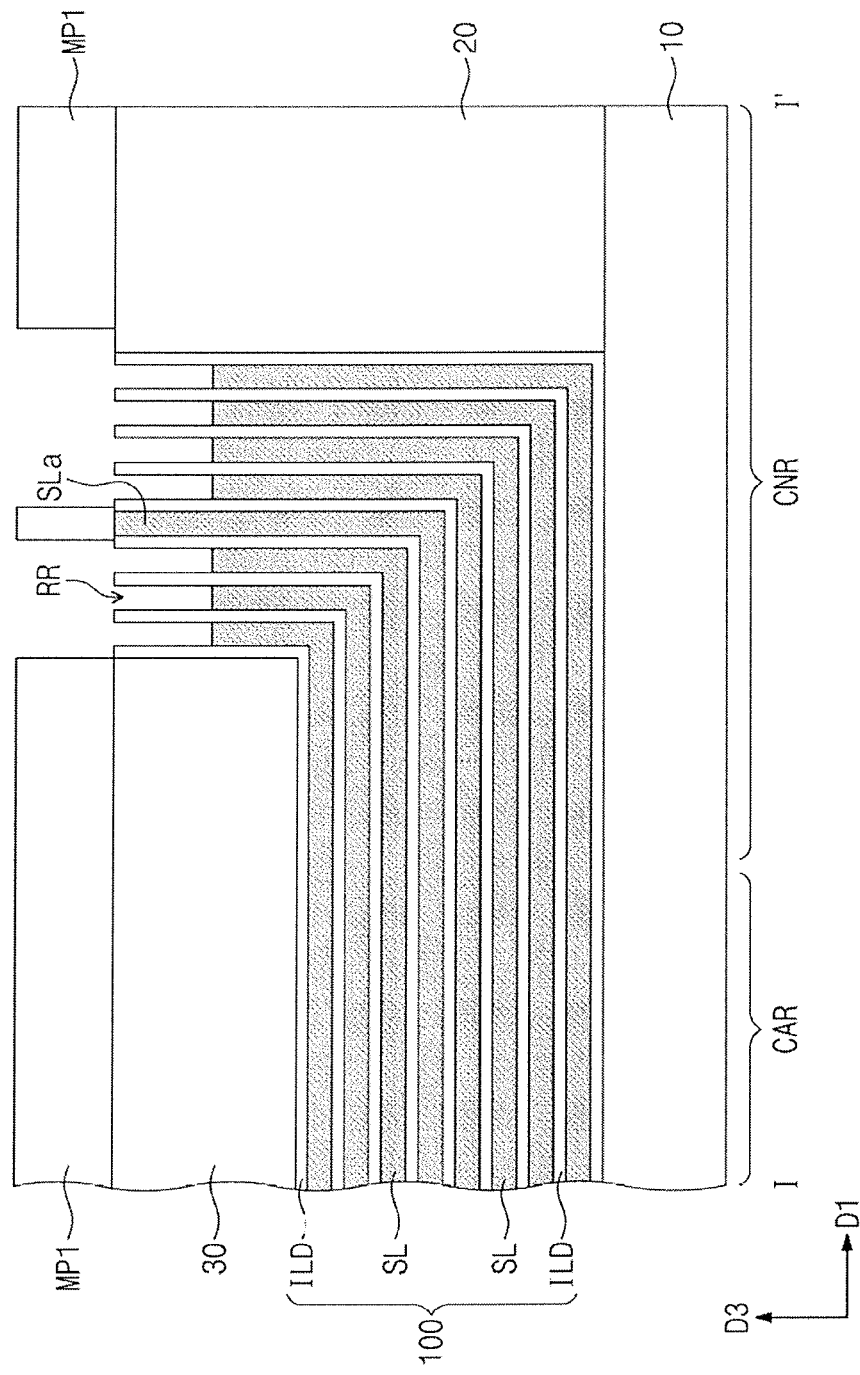
FIGS. 13A and 13B are cross-sectional views illustrating modified embodiments of a method for manufacturing a 3D semiconductor device according to some embodiments of the inventive concepts.
Figure 13B:
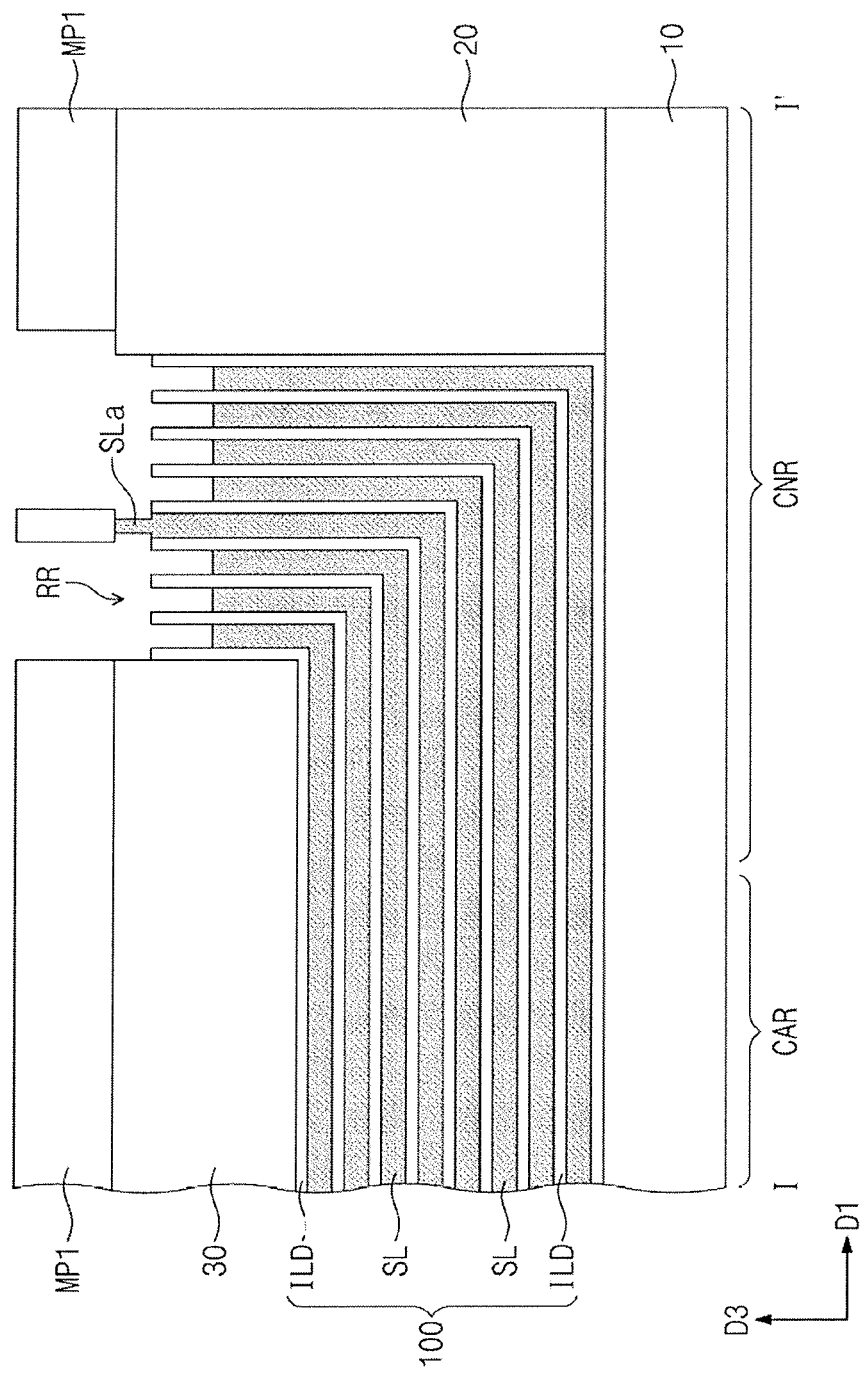

Meanwhile, in some embodiments, the process of forming the contact plugs PLG on the connection region CNR may be omitted as illustrated in FIGS. 12A, 12B, and 12C. In this case, the conductive lines CL may be in direct contact with the protrusions of the electrodes EL and the filling insulation layer 40 without the contact plugs PLG.

Figure 14:
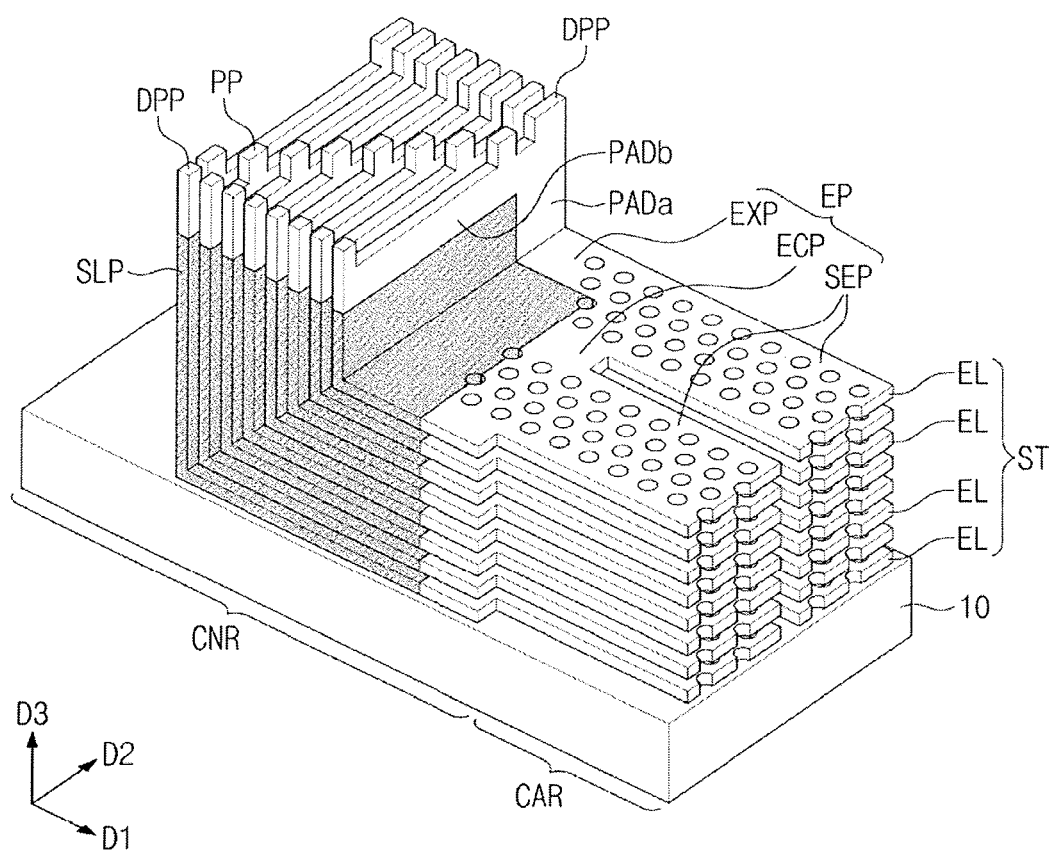
FIG. 14 is a perspective view illustrating an electrode structure formed using the manufacturing method of FIGS. 6A to 12A, 6B to 12B, and 6C to 12C.

FIG. 14 is a perspective view illustrating an electrode structure formed using the manufacturing method of FIGS. 6A to 11A, 6B to 11B, and 6C to 11C. Hereinafter, the descriptions to the same features as in the embodiments of FIGS. 6A to 11A, 6B to 11B, and 6C to 11C will be omitted or mentioned briefly for the purpose of ease and convenience in explanation.

Referring to FIG. 14, an electrode structure ST may be disposed on a substrate 10 including a cell array region CAR and a connection region CNR. The electrode structure ST may include a plurality of electrodes EL sequentially and vertically stacked on the substrate 10. According to some embodiments, each of the electrodes EL may include an electrode portion EP extending in a first direction D1 parallel to a top surface of the substrate 10 on the cell array region CAR, a vertical pad portion PADa extending in a third direction D3 vertical or inclined to the top surface of the substrate 10 on the connection region CNR, a horizontal pad portion PADb extending from a portion of the vertical pad portion PADa in a second direction D2 perpendicular to the first direction D1 and parallel to the top surface of the substrate 10, and a protrusion PP protruding from a portion of the horizontal pad portion PADb in the third direction D3. In addition, each of the electrodes EL may further include a dummy protrusion DPP protruding from a portion of the vertical pad portion PADa in the third direction D3.

According to some embodiments, each of the electrode portions EP of the electrodes EL may include sub-electrode portions SEP extending in the first direction D1 and spaced apart from each other in the second direction D2, an electrode connection portion ECP connecting the sub-electrode portions SEP on the connection region CNR, and an extension EXP extending from a portion of the electrode connection portion ECP in the first direction D1. In some embodiments, a width of the extension EXP in the second direction D2 may be smaller than a width of the sub-electrode portion SEP in the second direction D2. The sub-electrode portions SEP of the electrodes EL may overlap with each other in a plan view, and the electrode connection portions ECP of the electrodes EL may also overlap with each other in a plan view. Lengths, in the first direction D1, of the extensions EXP of the electrodes EL may decrease sequentially as a vertical distance from the substrate 10 increases.

The vertical pad portions PADa of the electrodes EL may extend from portions (i.e., the extensions EXP) of the electrode portions EP in the third direction D3 vertical or inclined to the top surface of the substrate 10. In some embodiments, widths of the vertical pad portions PADa in the second direction D2 may be smaller than the widths of the electrode portions EP in the second direction D2.

Lengths of the vertical pad portions PADa in the third direction D3 may decrease sequentially as heights (or levels) of the electrode portions EP from the substrate 10 increase sequentially.

Widths, in the second direction D2, of the horizontal pad portions PADb of the electrodes EL may be substantially equal to each other. Bottom surfaces of the horizontal pad portions PADb may be disposed at the substantially same height (or level) from the substrate 10. In addition, the horizontal pad portions PADb of the electrodes EL may be spaced apart from the electrode portions EP of the electrodes EL.

The protrusions PP of the electrodes EL may protrude from portions of the horizontal pad portions PADb in the third direction D3 and may have top surfaces disposed at the substantially same height (or level) from the substrate 10. The protrusions PP of the electrodes EL may be arranged in a direction diagonal to the first and second directions D1 and D2 intersecting each other when viewed from a plan view. In some embodiments, widths of the protrusions PP in the second direction D2 may be changed according to a distance between the first and second openings of the first mask pattern described with reference to FIGS. 2B, 6A, 6B, and 6C.

The dummy protrusions DPP of the electrodes EL may be spaced apart from the protrusions PP in the second direction D2, and top surfaces of the dummy protrusions DPP may be substantially coplanar with the top surfaces of the protrusions PP. Sidewalls of the dummy protrusions DPP may be aligned with sidewalls of the horizontal pad portions PADb in the third direction D3.

In addition, as described above, the electrode structure ST may further include the sacrificial patterns SLP disposed under the horizontal pad portions PADb of the electrodes EL. The sacrificial patterns SLP may have L-shapes on the connection region CNR. In some embodiments, sidewalls of the sacrificial patterns SLP may be coplanar with sidewalls of the electrode portions EP of the electrodes EL, and widths of the sacrificial patterns SLP in the second direction D2 may be smaller than widths of the electrode connection portions ECP in the second direction D2.

FIGS. 15A to 17A are perspective views illustrating a method for manufacturing a 3D semiconductor device according to some embodiments of the inventive concepts. FIGS. 15B to 17B are cross-sectional views taken along lines II-II' of FIGS. 15A to 17A, respectively. Hereinafter, the descriptions to the same features as in the embodiments of FIGS. 6A to 11A, 6B to 11B, and 6C to 11C will be omitted or mentioned briefly for the purpose of ease and convenience in explanation.

Figure 15A:
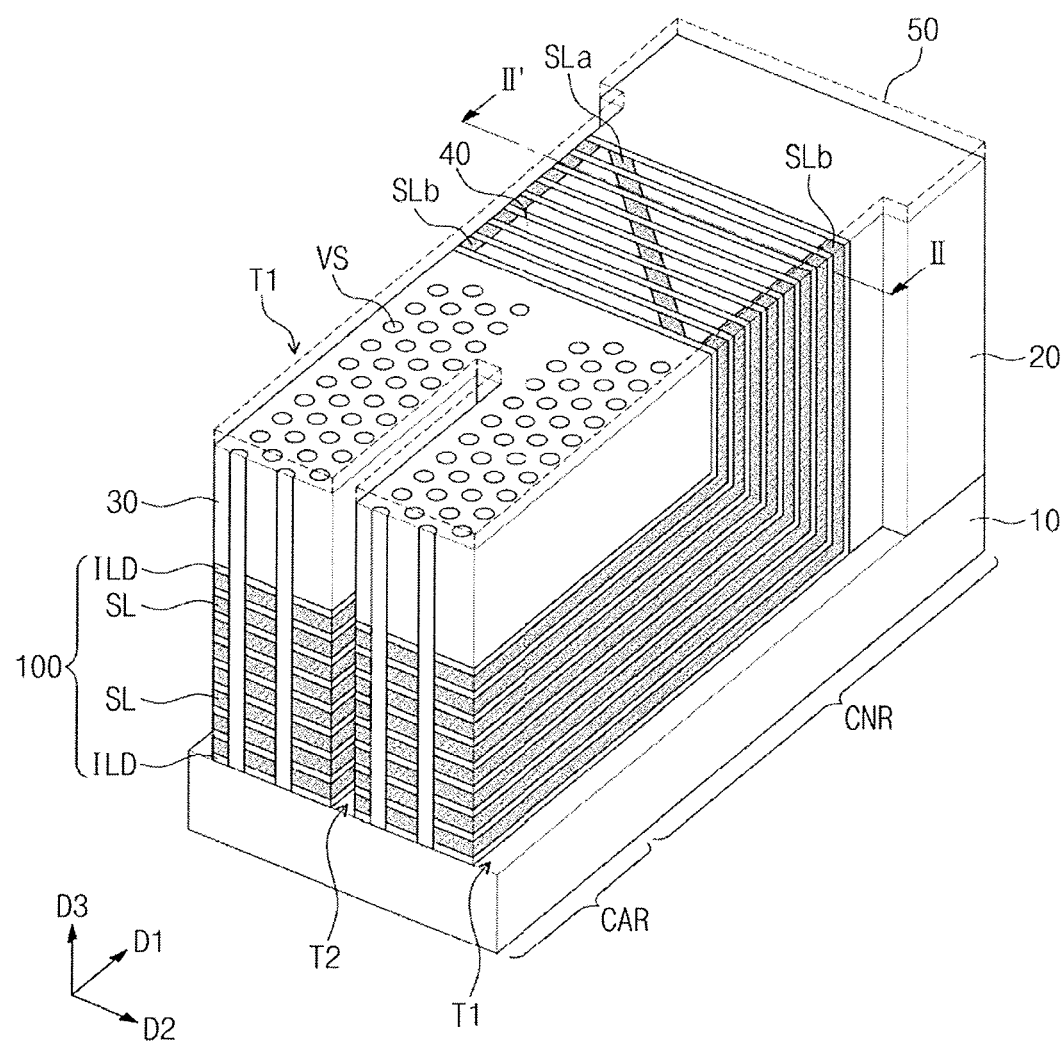
Figure 15B:
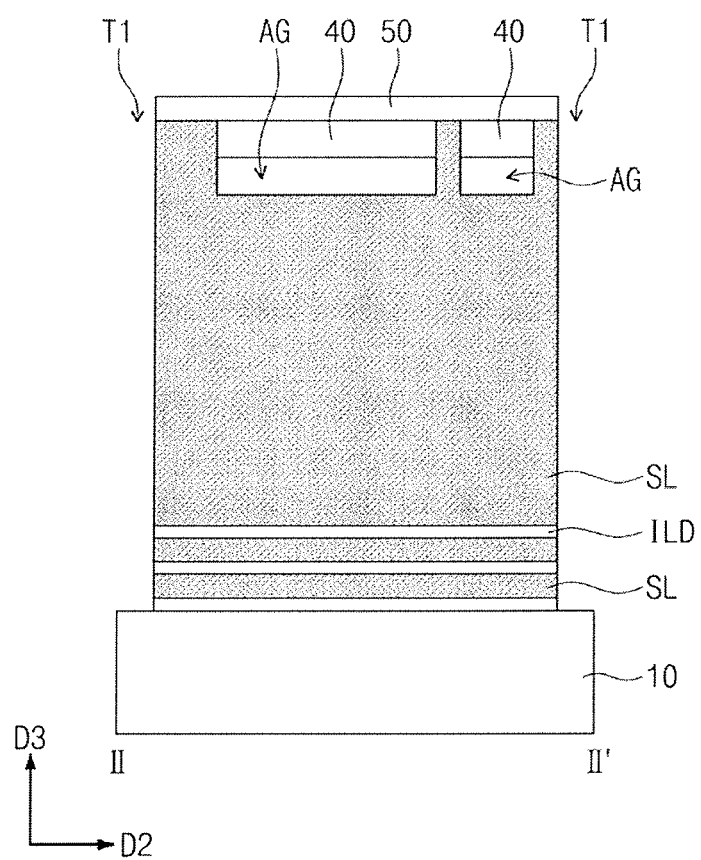

Referring to FIGS. 15A and 15B, as described with reference to FIGS. 7A, 7B, and 7C, the filling insulation layer 40 may be formed to define the air gaps AG between the insulating layers ILD of the thin layer structure 100 on the connection region CNR, and then, a patterning process may be performed on the thin layer structure 100.

In some embodiments, the patterning process of the thin layer structure 100 may be performed using a mask pattern having openings having different lengths in the first direction D1 (e.g., the second mask pattern MP2 of FIG. 2E) as an etch mask. For example, the patterning process may be performed on the thin layer structure 100 to form a plurality of first trenches T1 and at least one second trench T2 between the first trenches T1. Here, lengths of the first trenches T1 in the first direction D1 may be greater than a length of the second trench T2 in the first direction D1.

Both sidewalls of portion of the thin layer structure 100 on the cell array region CAR and the connection region CNR may be exposed by the first trenches T1. In addition, portions of the thin layer structure 100 on the cell array region CAR may be exposed by the second trench T2. For example, sidewalls of the sidewall portions of the sacrificial layers SL may be exposed on the connection region CNR by the first trenches T1.

Figure 16A:
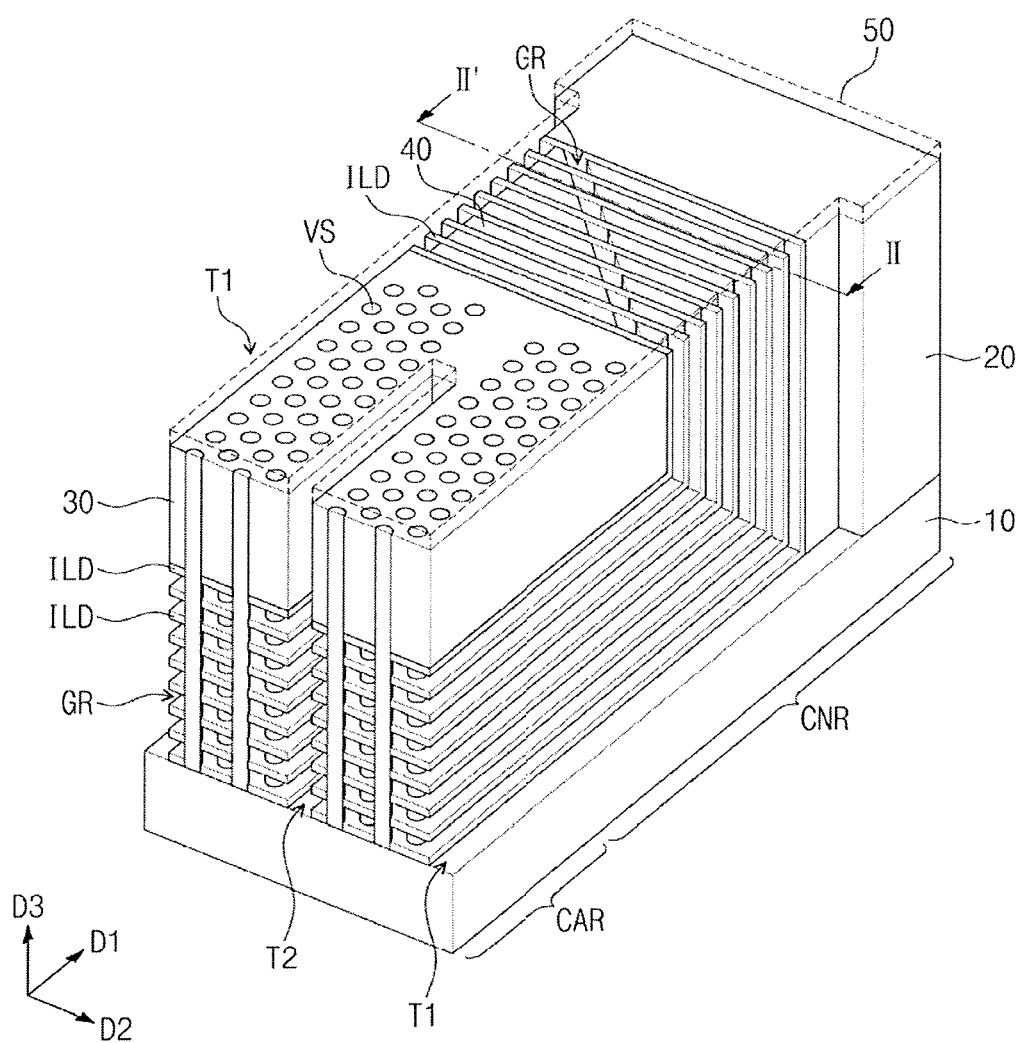
Figure 16B:
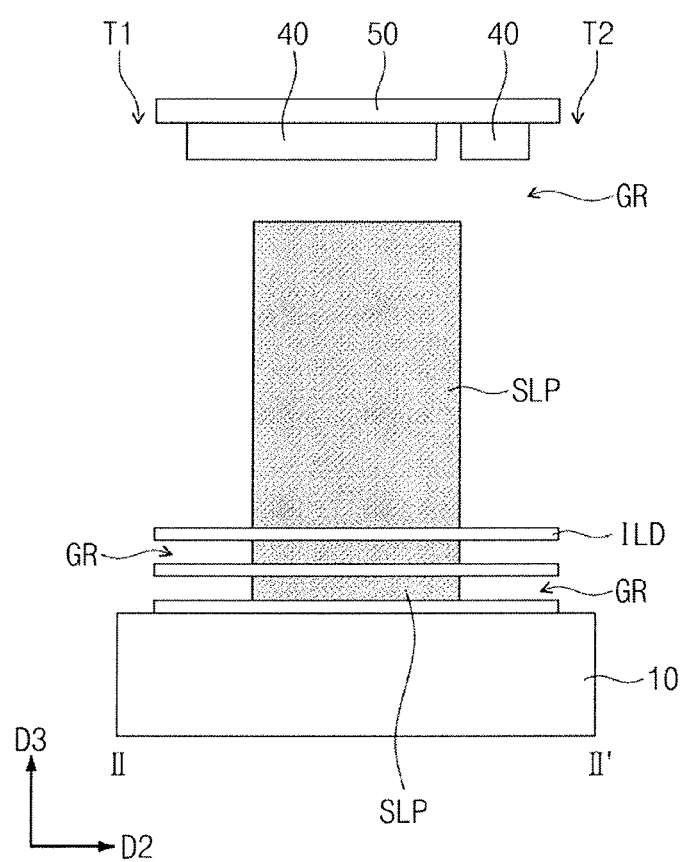

Referring to FIGS. 16A and 16B, an isotropic etching process may be performed to remove the sacrificial layers SL exposed by the first and second trenches T1 and T2. During the isotropic etching process, the sacrificial layers SL of the cell array region CAR may be isotropically etched by an etchant provided through the first trenches T1 and the second trench T2, and the sacrificial layers SL of the connection region CNR may be isotropically etched by the etchant provided through the first trenches T1. Thus, the etched amount of the sacrificial layer SL of the cell array region CAR may be different from that of the sacrificial layer SL of the connection region CNR.

By the isotropic etching process, the sacrificial layers SL of the cell array region CAR may be removed to form gate regions GR corresponding to empty spaces between the insulating layers ILD. In addition, portions of the sacrificial layers SL of the connection region CNR may remain to form sacrificial patterns SLP after the sacrificial layers of the cell array region CAR are removed. The sacrificial patterns SLP may have L-shapes between the insulating layers ILD, and some of the vertical structures VS may penetrate horizontal portions of the sacrificial patterns SLP. In some embodiments, each of the sacrificial patterns SLP may have both sidewalls laterally recessed from the first trenches T1. Widths of the sacrificial patterns SLP in the second direction D2 may be smaller than a distance between the first trenches T1.

In addition, since the etchant is provided through the air gaps AG of FIGS. 15A and 15B on the connection region CNR in the isotropic etching process, the protrusions SLa of the sacrificial layers SL may be etched by the etchant. The dummy protrusions SLb of the sacrificial layers SL may be also etched by the enchant. Thus, top surfaces of the sacrificial patterns SLP may be spaced apart from a bottom surface of the filling insulation layer 40. For example, each of the gate regions GR on the connection region CNR may have a vertical region parallel to the sidewall of the mold pattern 20 and a horizontal region extending in the second direction D2 between the filling insulation layer 40 and each of the sacrificial patterns SLP.

Figure 17A:
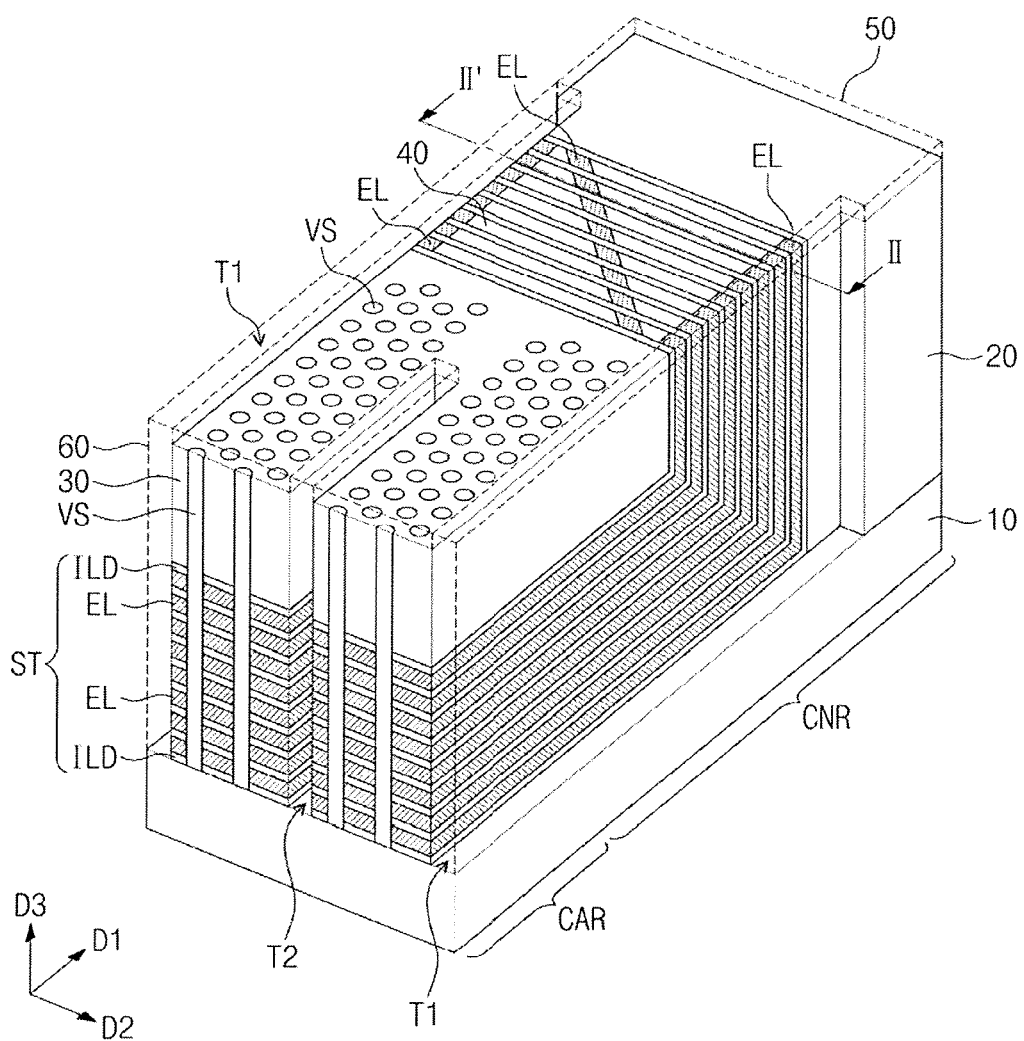
Figure 17B:
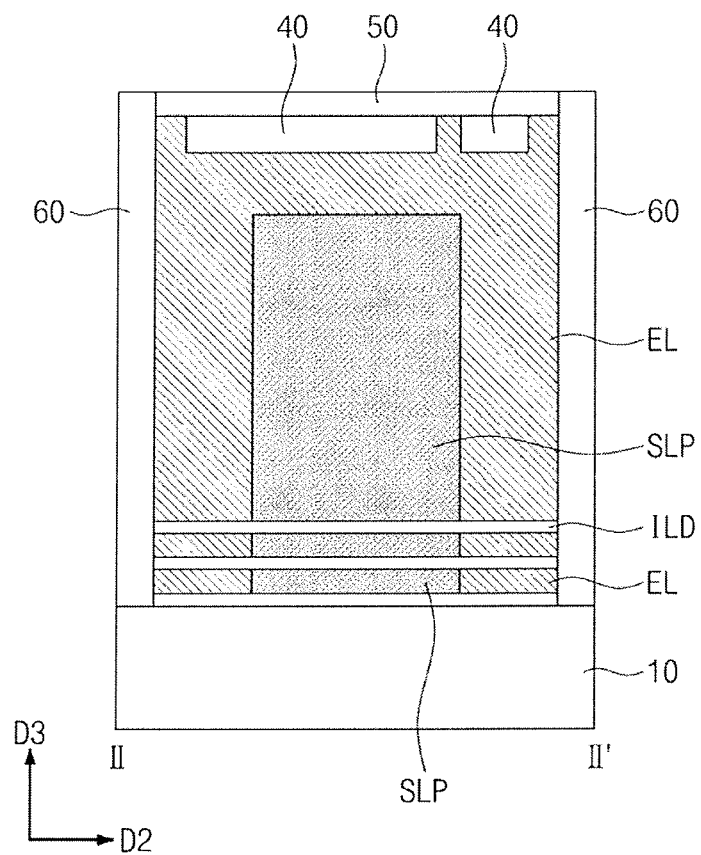

Referring to FIGS. 17A and 17B, electrodes EL may be formed in the gate regions GR, respectively. As described above, the electrodes EL may be formed using a deposition process having a step coverage to the extent that the electrodes EL may be formed along the both sidewalls and the top surfaces of the sacrificial patterns SLP on the connection region CNR. In addition, the electrodes EL may fill empty spaces defined in the filling insulation layers 40. Thus, each of the electrodes EL may include vertical pad portions covering the both sidewalls of each of the sacrificial patterns SLP, a horizontal pad portion covering the top surface of each of the sacrificial patterns SLP, and a protrusion filling the empty space defined in the filling insulation layer 40. Thereafter, isolation insulating patterns 60 may be formed in the first and second trenches T1 and T2, respectively.

Figure 18:
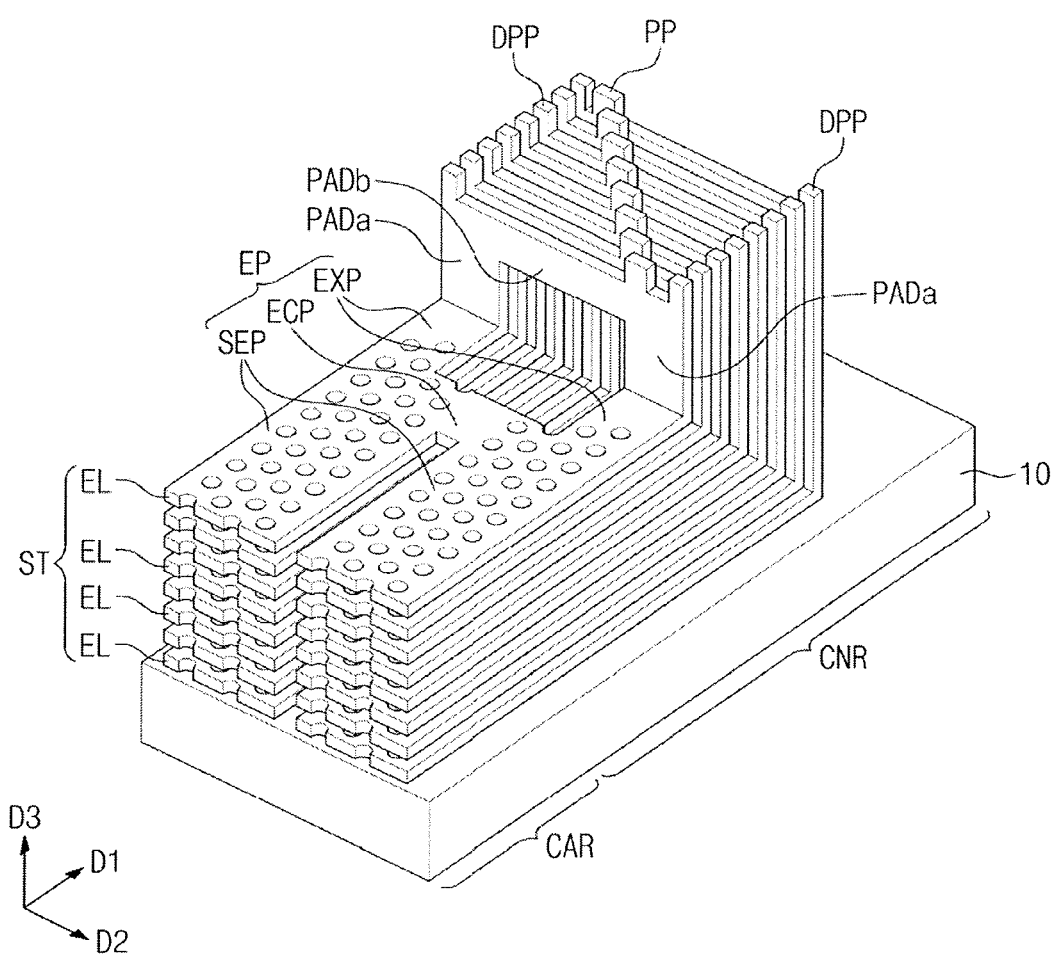
FIGS. 18 and 19 are perspective views illustrating electrode structures formed using the manufacturing method of FIGS. 15A to 17A and 15B to 17B.
Figure 19:
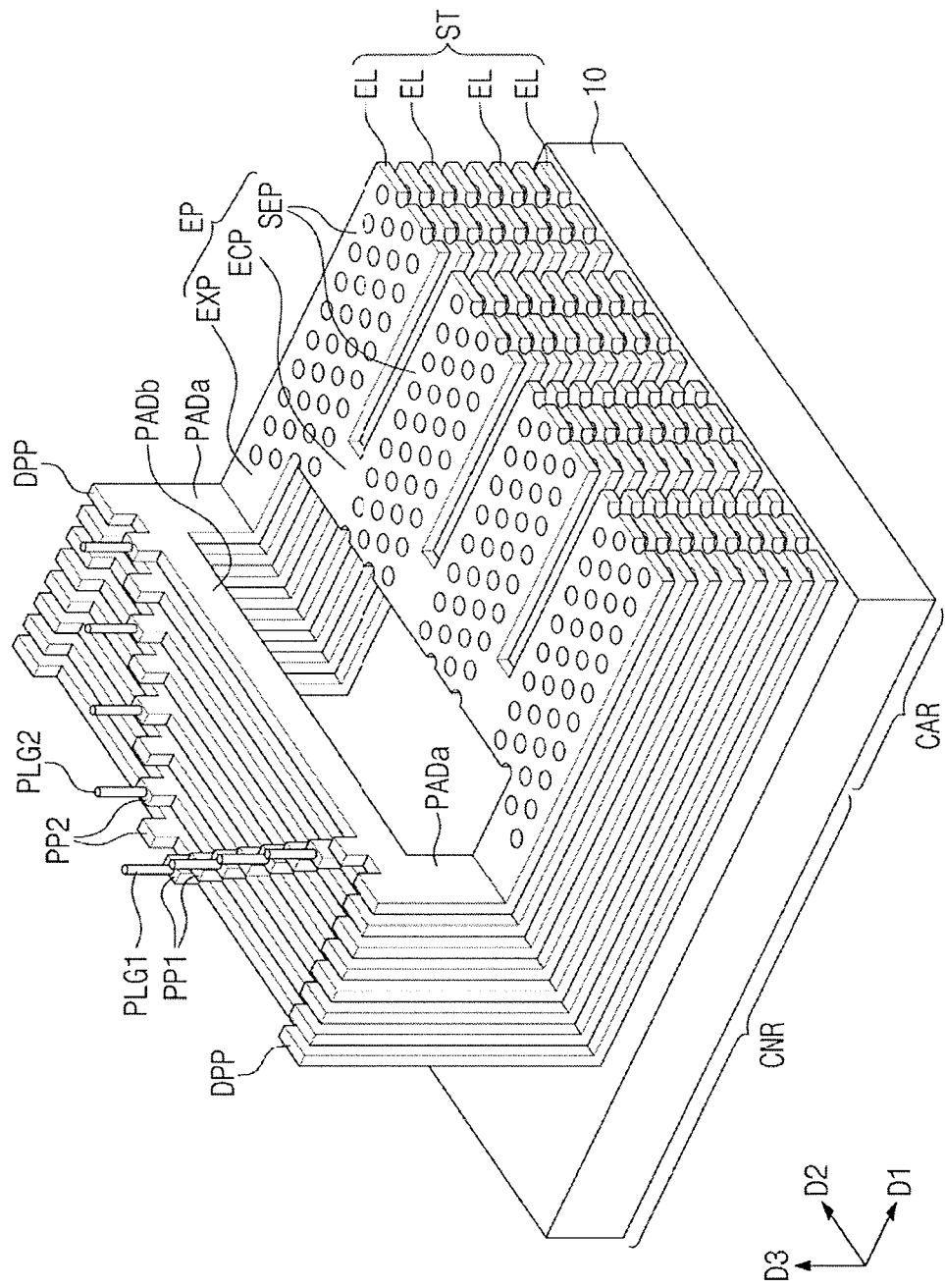

FIGS. 18 and 19 are perspective views illustrating electrode structures formed using the manufacturing method of FIGS. 15A to 17A and 15B to 17B.

Referring to FIG. 18, each of the electrodes EL included in the electrode structure ST may include an electrode portion EP extending on the cell array region CAR in the first direction D1 parallel to the top surface of the substrate 10, vertical pad portions PADa extending in the third direction D3 on the connection region CNR, a horizontal pad portion PADb connecting the vertical pad portions PADa in the second direction D2, and a protrusion PP extending from a portion of the horizontal pad portion PADb in the third direction D3. In addition, each of the electrodes EL may further include dummy protrusions DPP protruding from portions of the vertical pad portions PADa in the third direction D3.

As described above with reference to FIG. 14, each of the electrode portions EP of the electrodes EL may include sub-electrode portions SEP, an electrode connection portion ECP, and extensions EXP. In the present embodiment, the extensions EXP of each of the electrodes EL may extend from the electrode connection portion ECP in the first direction D1 and may be spaced apart from each other in the second direction D2. The vertical pad portions PADa of the electrodes EL may extend from the extensions EXP in the third direction D3. The horizontal pad portions PADb of the electrodes EL may be disposed on the sacrificial patterns SLP of FIG. 17B, and the protrusions PP of the electrodes EL may be arranged in a direction diagonal to the first and second directions D1 and D2 intersecting each other when viewed from a plan view. As described above, contact plugs may be connected to the protrusions PP of the electrodes EL, respectively.

According to an embodiment illustrated in FIG. 19, each of the electrodes EL may include an electrode portion EP, vertical pad portions PADa spaced apart from each other in the second direction D2, a horizontal pad portion PADb laterally connecting the vertical pad portions PADa, and protrusions PP1 and PP2. In some embodiments, each of the electrodes EL may include the protrusions PP1 and PP2 that are spaced apart from each other in the second direction D2 on the horizontal pad portion PADb. A contact plug PLG1 or PLG2 and a conductive line (see CL of FIG. 11A) may be connected to one of the protrusions PP1 and PP2 included in each of the electrodes EL.

In some embodiments, in the electrode structure ST, the protrusions PP1 and PP2 of the electrodes EL may include first protrusions PP1 arranged in a first diagonal direction and second protrusions PP2 arranged in a second diagonal direction different from the first diagonal direction. The first protrusions PP1 and the second protrusions PP2 may be mirror-symmetrical with respect to an imaginary line extending in the first direction D1.

In some embodiments, first contact plugs PLG1 may be respectively connected to the first protrusions PP1 of some electrodes EL corresponding to odd-numbered layers in the electrode structure ST, and second contact plugs PLG2 may be respectively connected to the second protrusions PP2 of other electrodes EL corresponding to even-numbered layers in the electrode structure ST. Thus, a process margin of a process of forming the conductive lines may be secured. The conductive lines may extend in the first direction D1 and be connected to the first and second contact plugs PLG1 and PLG2, respectively.

In an exemplary embodiment, as shown in FIG. 19, the plurality of protrusions PP1 and PP2 are symmetrically arranged on the connection region CNR so that each of the plurality of electrodes EL includes two protrusions PP1 and PP2. One of the two protrusions PP1 and PP2 of each of the plurality of electrodes EL is electrically connected to one of the plurality of contact plugs PLG1 and PLG2.

FIGS. 20A to 25A are perspective views illustrating a method for manufacturing a 3D semiconductor device according to some embodiments of the inventive concepts. FIGS. 20B to 25B are cross-sectional views taken along lines II-II' of FIGS. 20A to 25A, respectively, to illustrate a method for manufacturing a 3D semiconductor device according to some embodiments of the inventive concepts. Hereinafter, the descriptions to the same features as in the embodiments of FIGS. 6A to 11A, 6B to 11B, and 6C to 11C will be omitted or mentioned briefly for the purpose of ease and convenience in explanation.

Figure 20A:
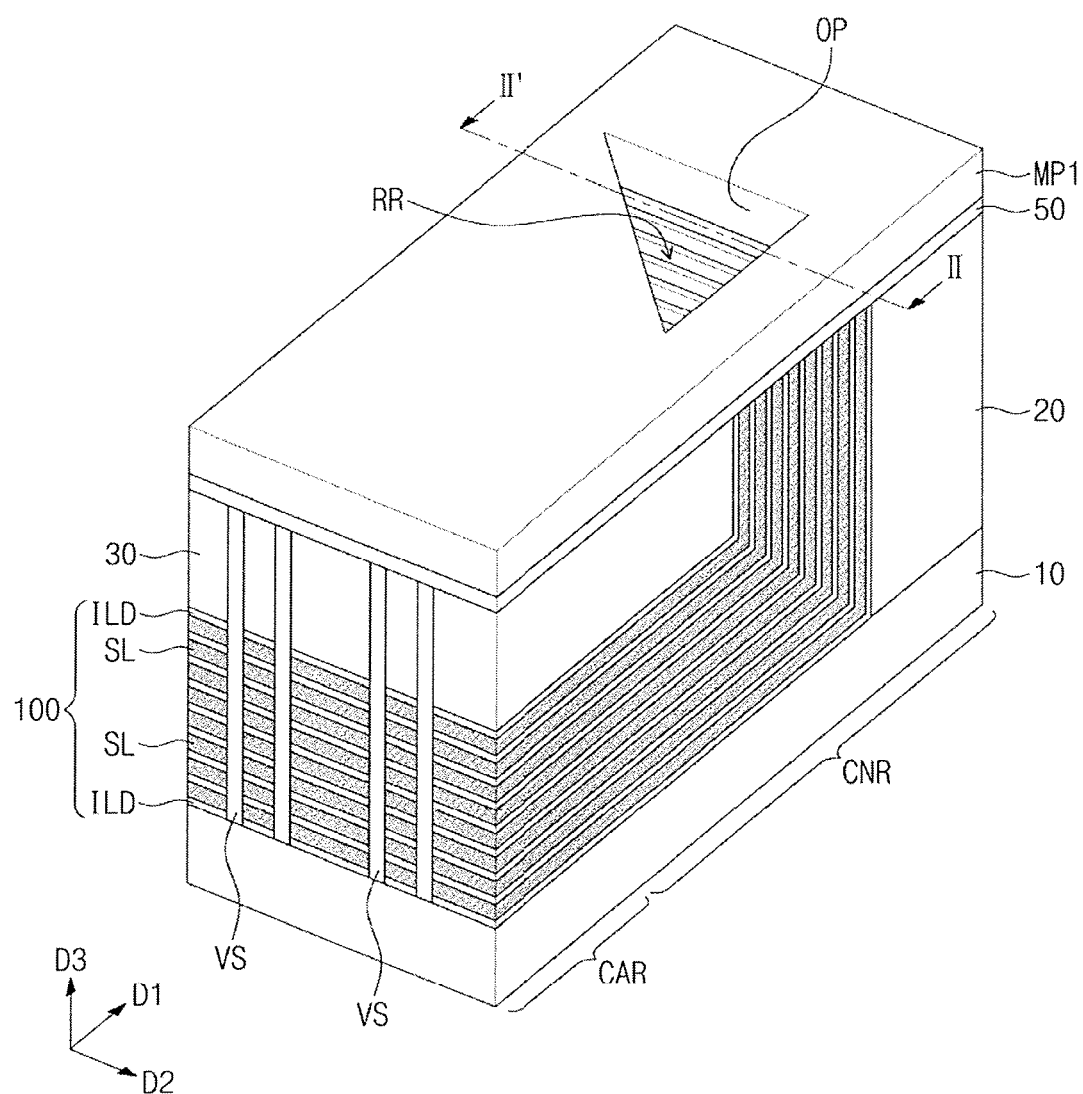
Figure 20B:
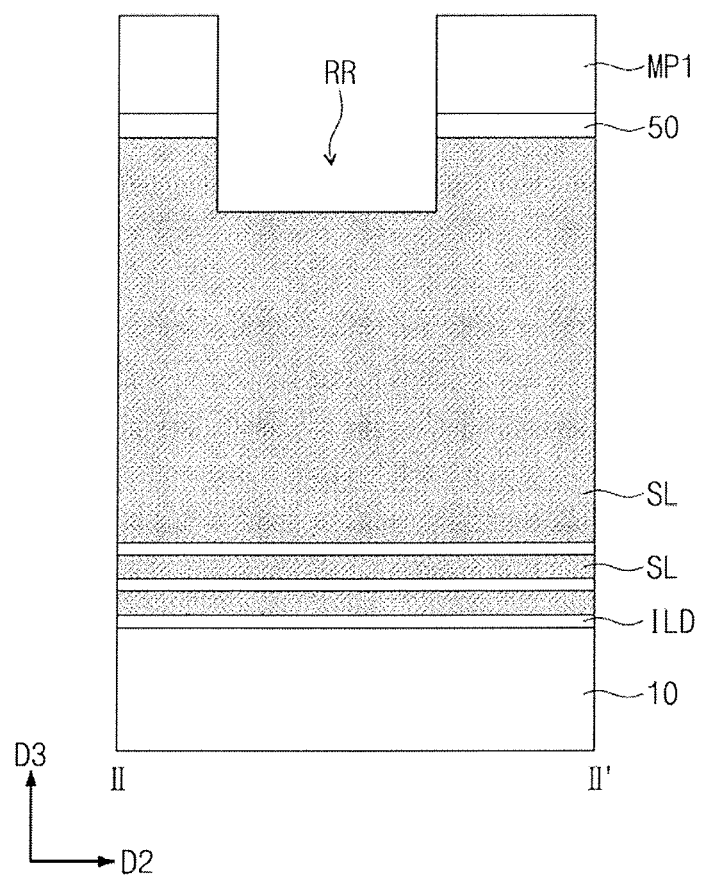

Referring to FIGS. 20A and 20B, the thin layer structure 100 may be formed in the trench defined by the mold pattern 20, and then, a first mask pattern MP1 may be formed to expose portions of the sacrificial layers SL disposed on the connection region CNR.

The first mask pattern MP1 may have an opening OP on the connection region CNR, and areas of the sacrificial layers SL exposed by the opening OP may be varied sequentially as a distance from the cell array region CAR increases. For example, the areas of the sacrificial layers SL exposed by the opening OP may be different from each other. For example, the opening OP may have a triangular shape when viewed from a plan view. The opening OP may have one sidewall extending in a direction diagonal to the first and second directions D1 and D2 perpendicular to each other when viewed from a plan view.

In some embodiments, before the formation of the first mask pattern MP1, the vertical structures VS may be formed to penetrate the thin layer structure 100 on the cell array region CAR and the capping layer 50 may be formed on the thin layer structure 100 having the vertical structures VS.

After the formation of the first mask pattern MP1, the portions of the sacrificial layers SL may be selectively etched using the first mask pattern MP1 as an etch mask, thereby forming recess regions RR between the sidewall portions of the insulating layers ILD on the connection region CNR. An isotropic etching process or an anisotropic etching process may be performed on the sacrificial layers SL to form the recess regions RR. In some embodiments, top surfaces of the sacrificial layers SL exposed by the recess regions RR may be lower than the top surfaces of the sidewall portions of the insulating layers ILD on the connection region CNR. In addition, the top surfaces of the sacrificial layers SL exposed by the recess regions RR may be higher than a bottom surface of the uppermost sacrificial layer SL disposed on the cell array region CAR.

In some embodiments, the recess regions RR may have sidewalls laterally aligned with each other, and widths of the recess regions RR in the second direction D2 may be different from each other.

Figure 21A:
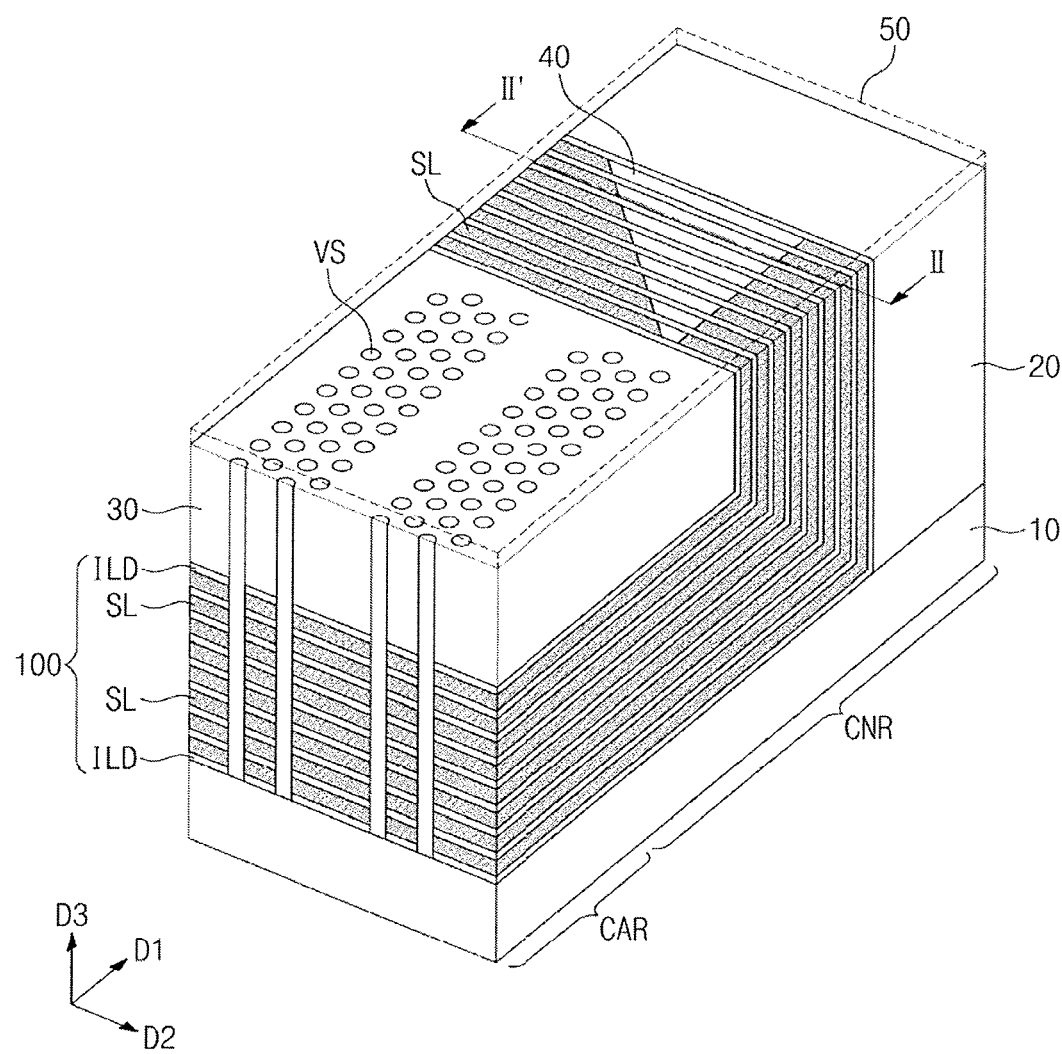
Figure 21B:
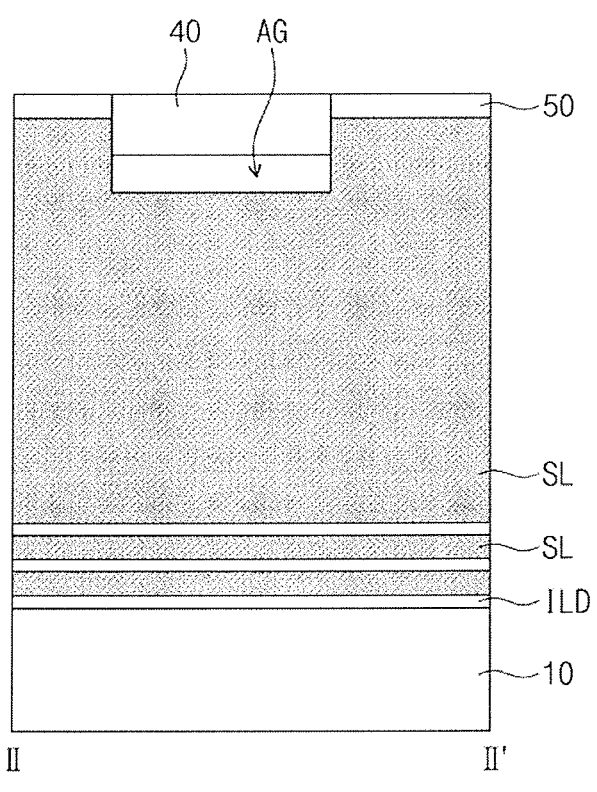
Figure 21B:
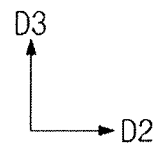

Referring to FIGS. 21A and 21B, filling insulation layers 40 may be formed to fill portions of the recess regions RR. The filling insulation layer 40 may be formed using a deposition process having a step coverage property, as described with reference to FIGS. 7A, 7B, and 7C. Thus, the filling insulation layer 40 may define the air gap AG in the recess region RR. Here, the air gaps AG may be locally formed in the recess regions RR, and the top surfaces of the sacrificial layers SL in the recess regions RR may be exposed by the air gaps AG. For example, the filling insulation layer 40 may define top surfaces of the air gaps AG and the top surfaces of the sacrificial layers SL disposed on the connection region CNR may define bottom surfaces of the air gaps AG. The sidewall portions of the insulating layers ILD disposed on the connection region CNR may define sidewalls of the air gaps AG. In some embodiments, since the widths of the recess regions RR in the second direction D2 are different from each other, widths of the air gaps AG in the second direction D2 may also be different from each other.

Figure 22A:
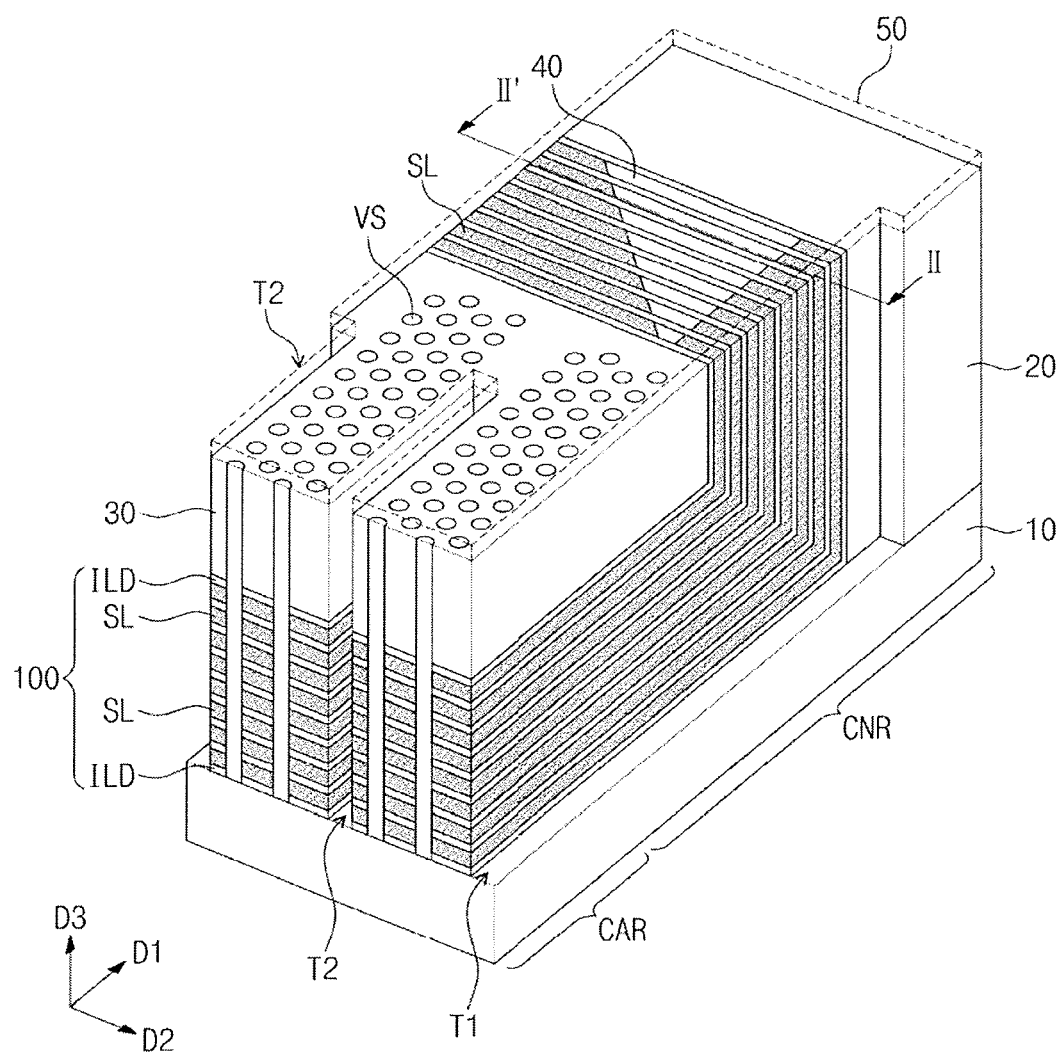
Figure 22B:
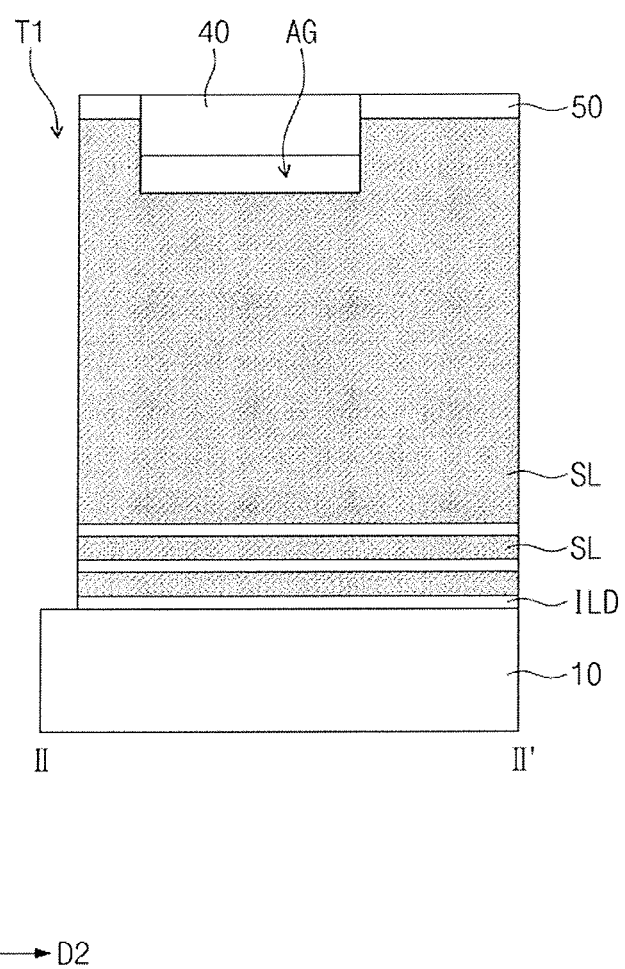

Referring to FIGS. 22A and 22B, the thin layer structure 100 may be patterned to form first and second trenches T1 and T2 defining a mold structure. In some embodiments, the first and second trenches T1 and T2 may extend in the first direction D1, and a length of the second trench T2 in the first direction D1 may be shorter than a length of the first trench T1 in the first direction D1. In addition, the first trench T1 may be spaced apart from the filling insulation layer 40 on the connection region CNR.

One sidewall of the mold structure may be exposed on the cell array region CAR and the connection region CNR by the first trench T1, and another sidewall of the mold structure may be exposed on the cell array region CAR by the second trench T2. For example, the first trench T1 may expose the horizontal portions and the sidewall portions of the sacrificial layers SL, and the second trench T2 may expose portions of the horizontal portions of the sacrificial layers SL.

Figure 23A:
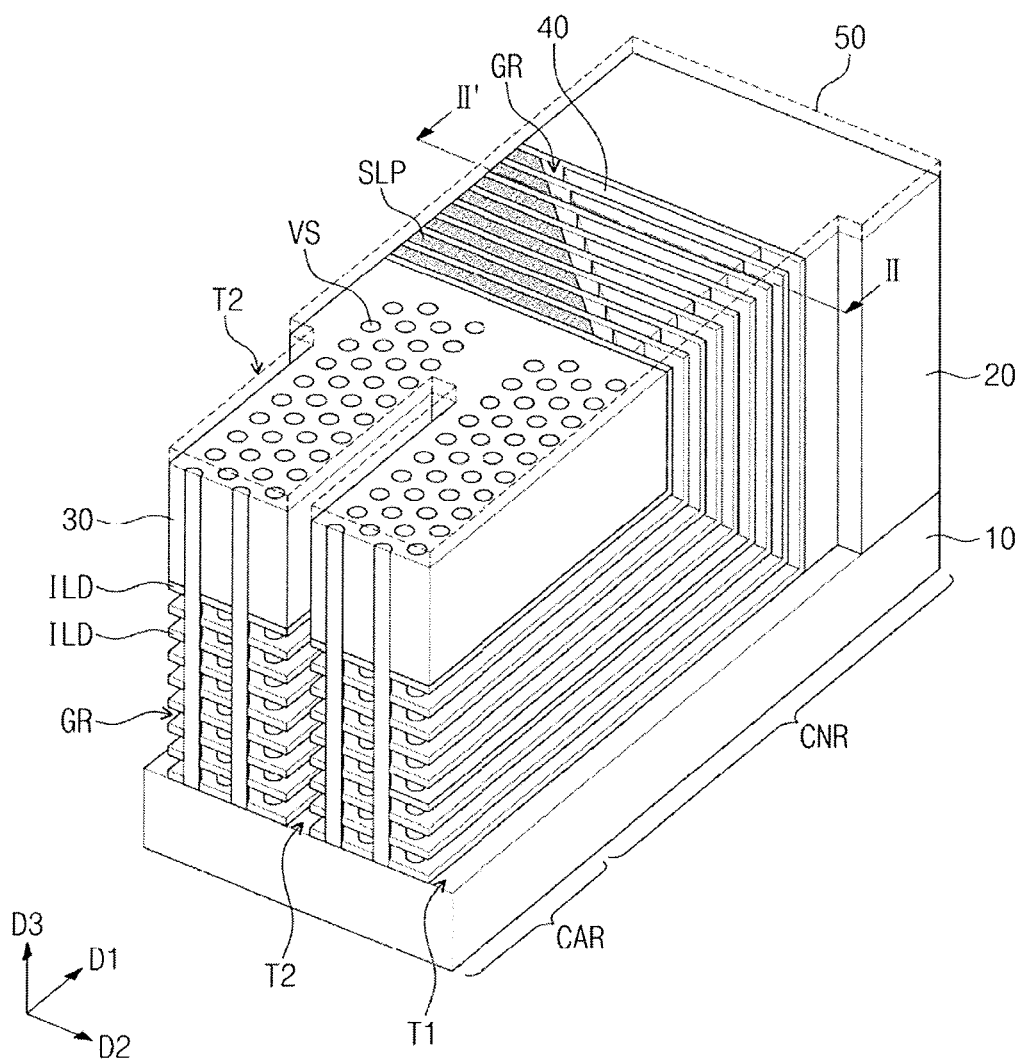
Figure 23B:
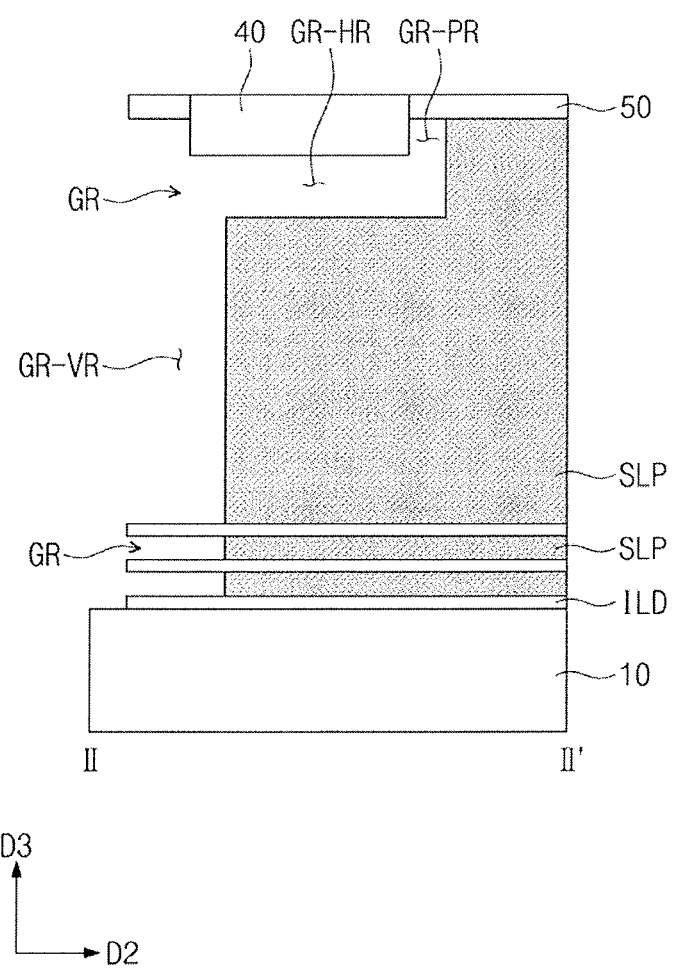

Referring to FIGS. 23A and 23B, the sacrificial layers SL exposed by the first and second trenches T1 and T1 may be isotropically etched to form gate regions GR between the insulating layers ILD. As described above, the gate regions GR may be formed by isotropically etching the sacrificial layers SL using an etchant having etch selectivity with respect to the insulating layers ILD, the vertical structures VS, and the substrate 10. Since the etchant is laterally supplied through the first and second trenches T1 and T2 during the isotropic etching process, the etched amount of the sacrificial layer SL of the cell array region CAR may be different from that of the sacrificial layer SL of the connection region CNR. Thus, portions of the sacrificial layers SL may remain on the connection region CNR to form sacrificial patterns SLP.

In some embodiments, the etchant may be provided in the second direction D2 through the air gaps AG of FIGS. 22A and 22B disposed under the filling insulation layer 40 in the isotropic etching process. Thus, sidewalls of the sacrificial layers SL exposed by the air gaps may be recessed in the second direction D2. For example, one sidewall of each of the sacrificial layers SL may be spaced apart from one sidewall of the filling insulation layer 40 in the second direction D2 on the connection region CNR. Thus, the gate regions GR formed on the connection region CNR may expose a portion of a bottom surface of the capping layer 50. The gate regions may be formed between the filling insulation layer 40 and the sacrificial pattern SLP.

Each of the gate regions GR may include a vertical region GR-VR disposed between the sidewall portions of the insulating layers ILD on the connection region CNR, a horizontal region GR-VR extending in the second direction D2 between the bottom surface of the filling insulation layer 40 and the top surface of the sacrificial pattern SLP on the connection region CNR, and a protrusion region GR-PR extending from the horizontal region in the third direction D3 between the sidewall of the filling insulation layer 40 and the sidewall of the sacrificial pattern SLP. In some embodiments, widths, in the second direction D2, of the horizontal regions GR-HR of the gate regions GR may be different from each other. Thus, the horizontal regions GR-HR of the gate regions GR may be disposed at positions horizontally different from each other.

In some embodiments, each of the sacrificial patterns SLP disposed on the connection region CNR may have a first top surface being in contact with the capping layer 50 and a second top surface lower than the first top surface. The second top surface of the sacrificial pattern SLP may define the horizontal region GR-HR of the gate region GR. For example, the second top surface of the sacrificial pattern SLP may face the filling insulating layer 40 and the horizontal region GR-HR of the gate region GR is defined by the second top surface of the sacrificial pattern SLP and the filling insulating layer 40.

Figure 24A:
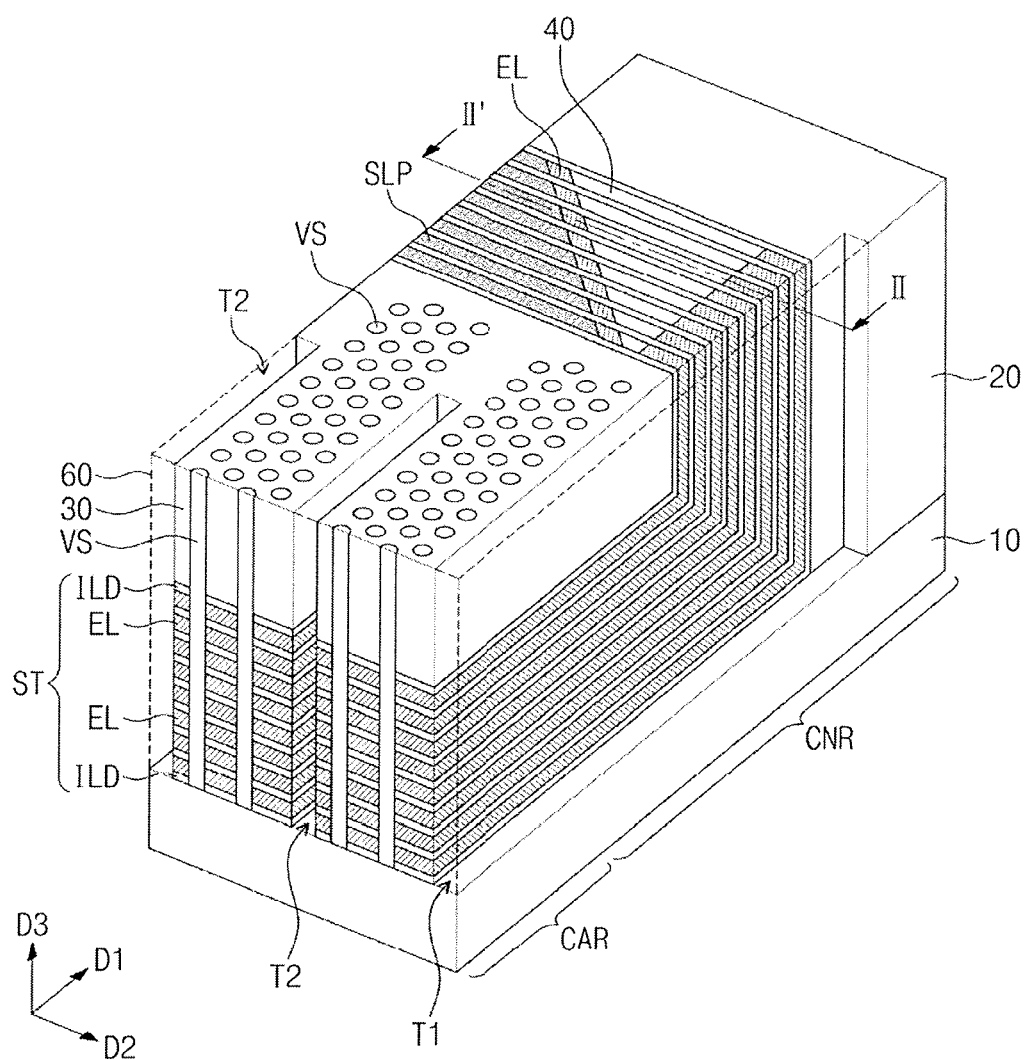
Figure 24B:
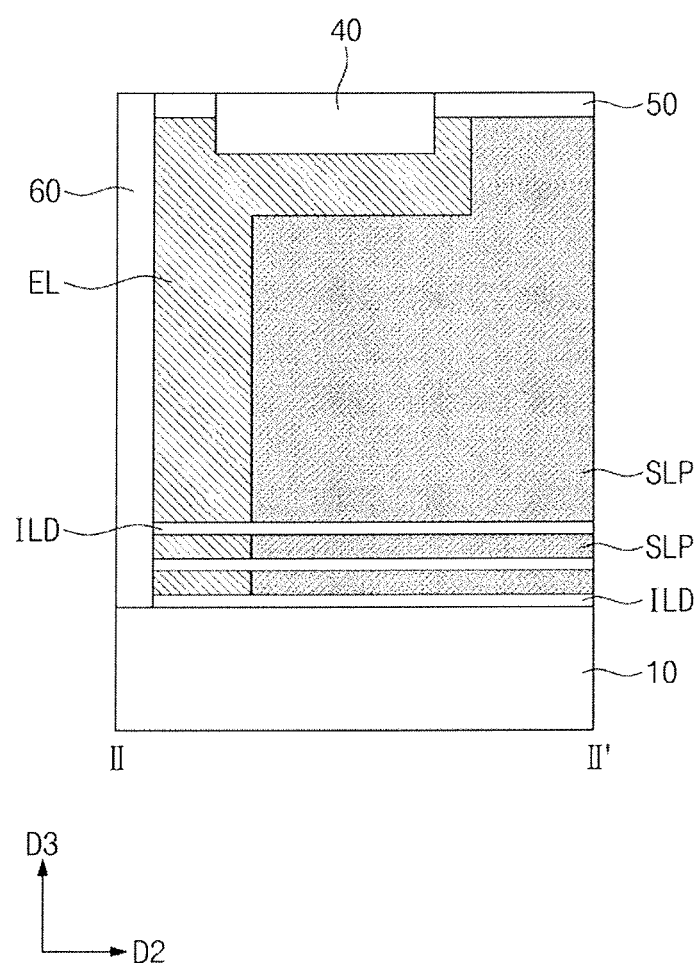

Referring to FIGS. 24A and 24B, electrodes EL may be formed in the gate regions GR, respectively. Since the electrodes EL are formed using a deposition process having a step coverage to the extent that the electrodes EL may fill the gate regions GR, respectively. Thus, each of the electrodes EL may include a horizontal pad portion extending in the second direction D2 between the filling insulation layer 40 and the second top surface of the sacrificial pattern SLP. In addition, each of the electrodes EL may also include a protrusion vertically protruding from an end portion of the horizontal pad portion.

In some embodiments, the horizontal pad portions of the electrodes EL may be formed on the second top surfaces of the sacrificial patterns SLP, respectively. The protrusion of the electrode EL may be disposed between the second top surface of the sacrificial pattern SLP and the capping layer 50 in the third direction D3. Top surfaces of the protrusions of the electrodes EL may be substantially coplanar with the first top surfaces of the sacrificial patterns SLP. The electrodes EL according to the present embodiment will be described in more detail with reference to FIGS. 26 and 27.

Figure 25A:
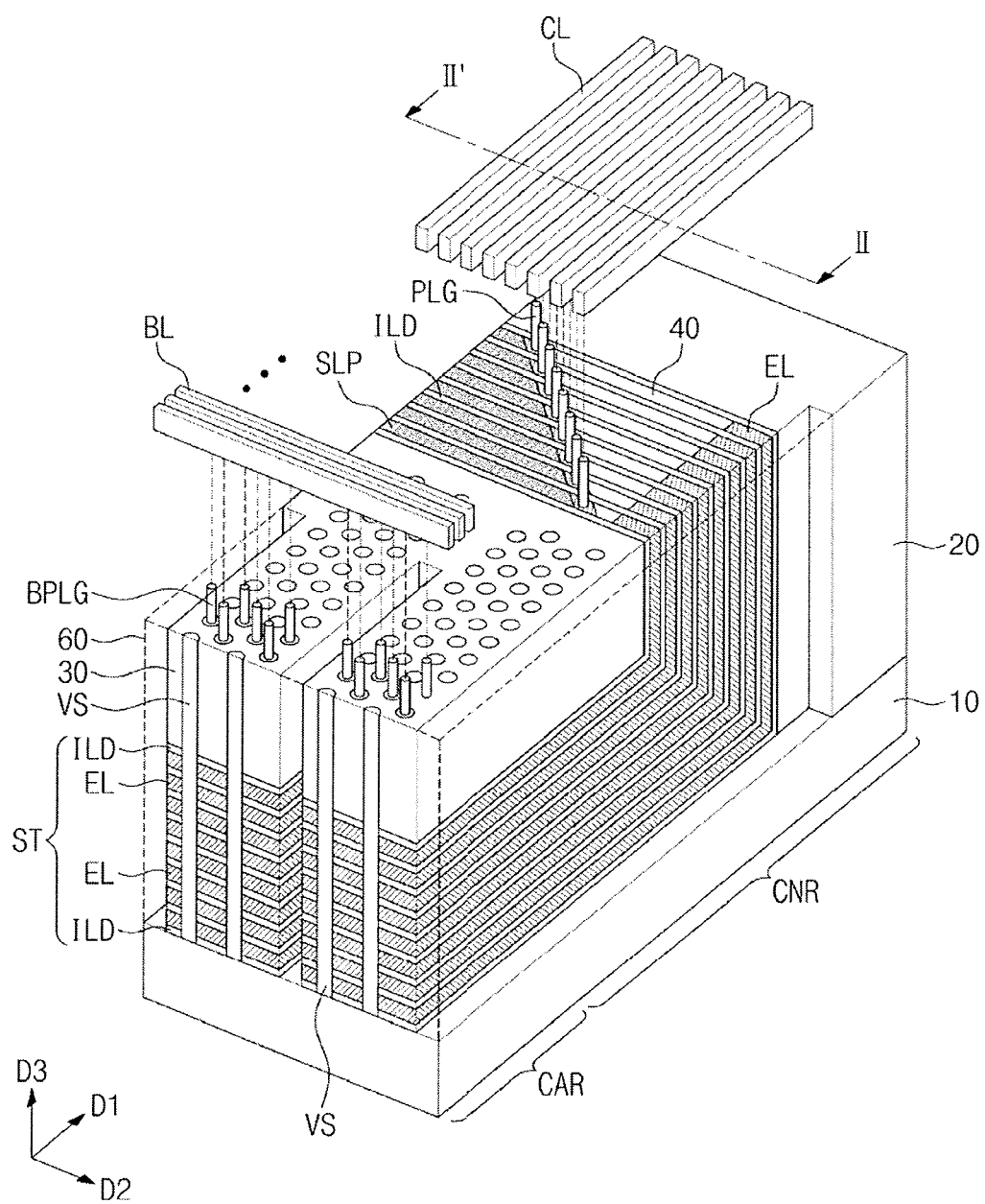
Figure 25B:
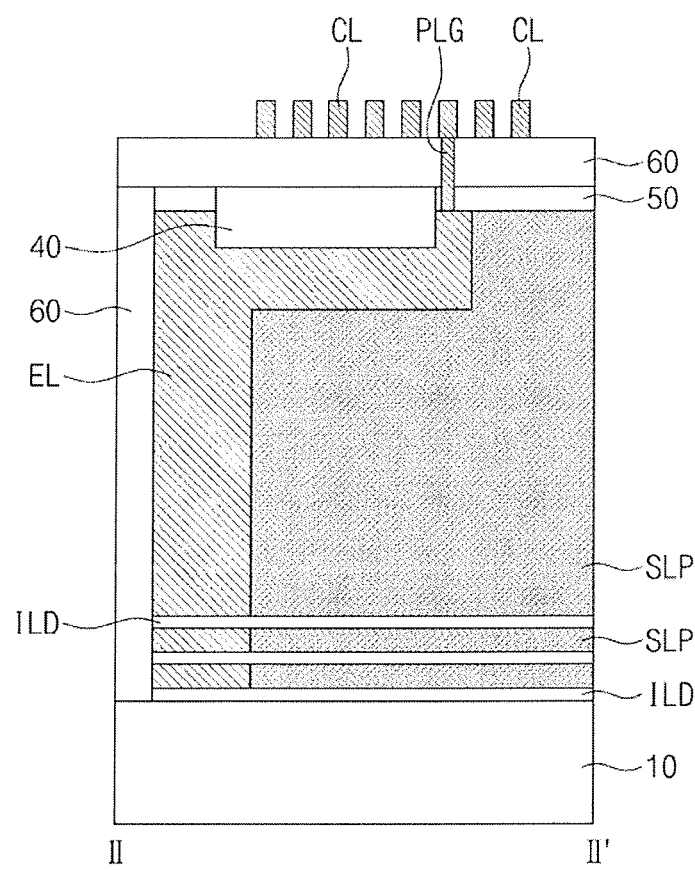

Referring to FIGS. 25A and 25B, an interconnection structure connected to the electrode structure ST may be formed on the connection region CNR. The interconnection structure may include contact plugs PLG connected to the protrusions of the electrodes EL and conductive lines CL connected to the contact plugs PLG. In addition, bit line contact plugs BPLG and bit lines BL may be formed on the cell array region CAR. The bit line contact plugs BPLG may be electrically connected to the vertical structures VS, and the bit lines BL may extend in the second direction D2 to intersect the electrodes EL. The bit lines BL may be electrically connected to the vertical structures VS through the bit line contact plugs BPLG.

Meanwhile, in some embodiments, the process of forming the contact plugs PLG on the connection region CNR may be omitted as described with reference to FIGS. 12A, 12B, and 12C. In this case, the conductive lines CL may be in direct contact with the protrusions of the electrodes EL and the filling insulation layer 40 without the contact plugs PLG.

Figure 26:
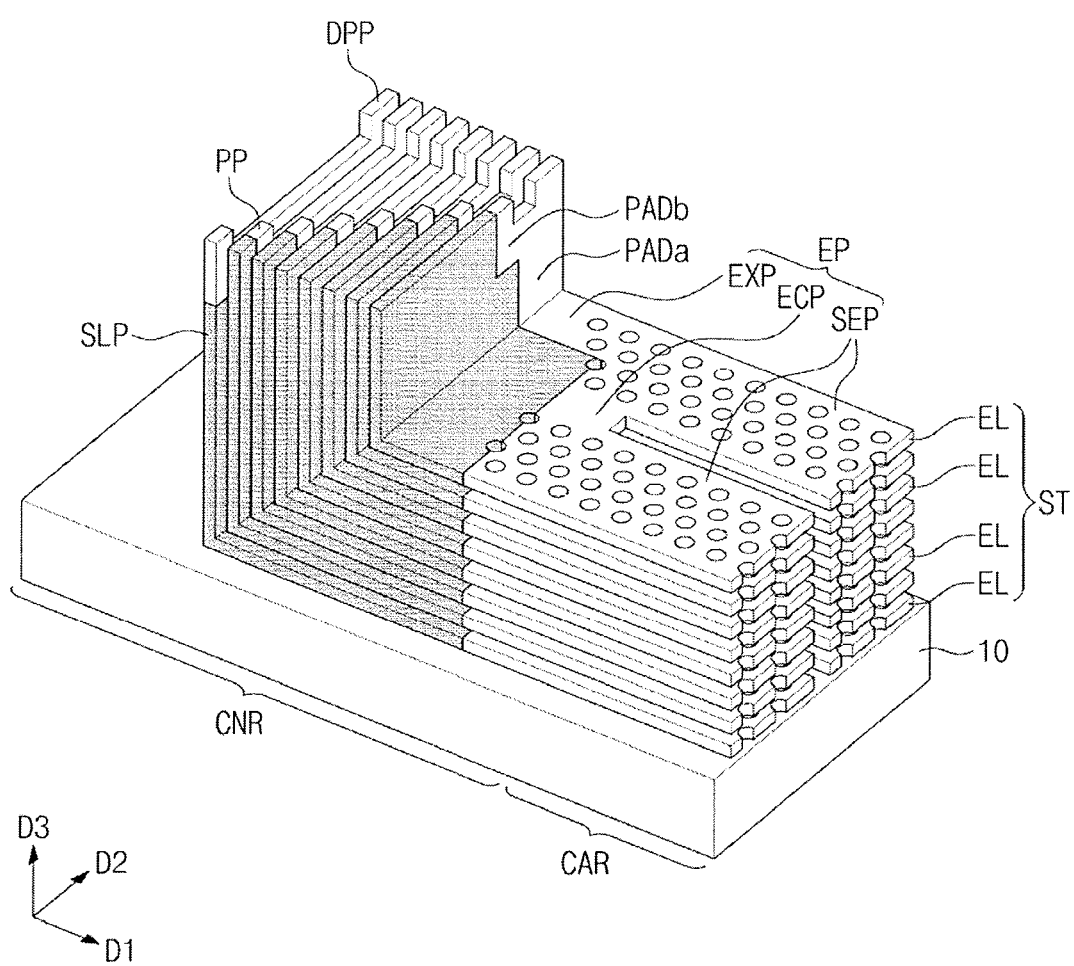
FIGS. 26 and 27 are perspective views illustrating electrode structures formed using the manufacturing method of FIGS. 20A to 25A and 20B to 25B.
Figure 27:
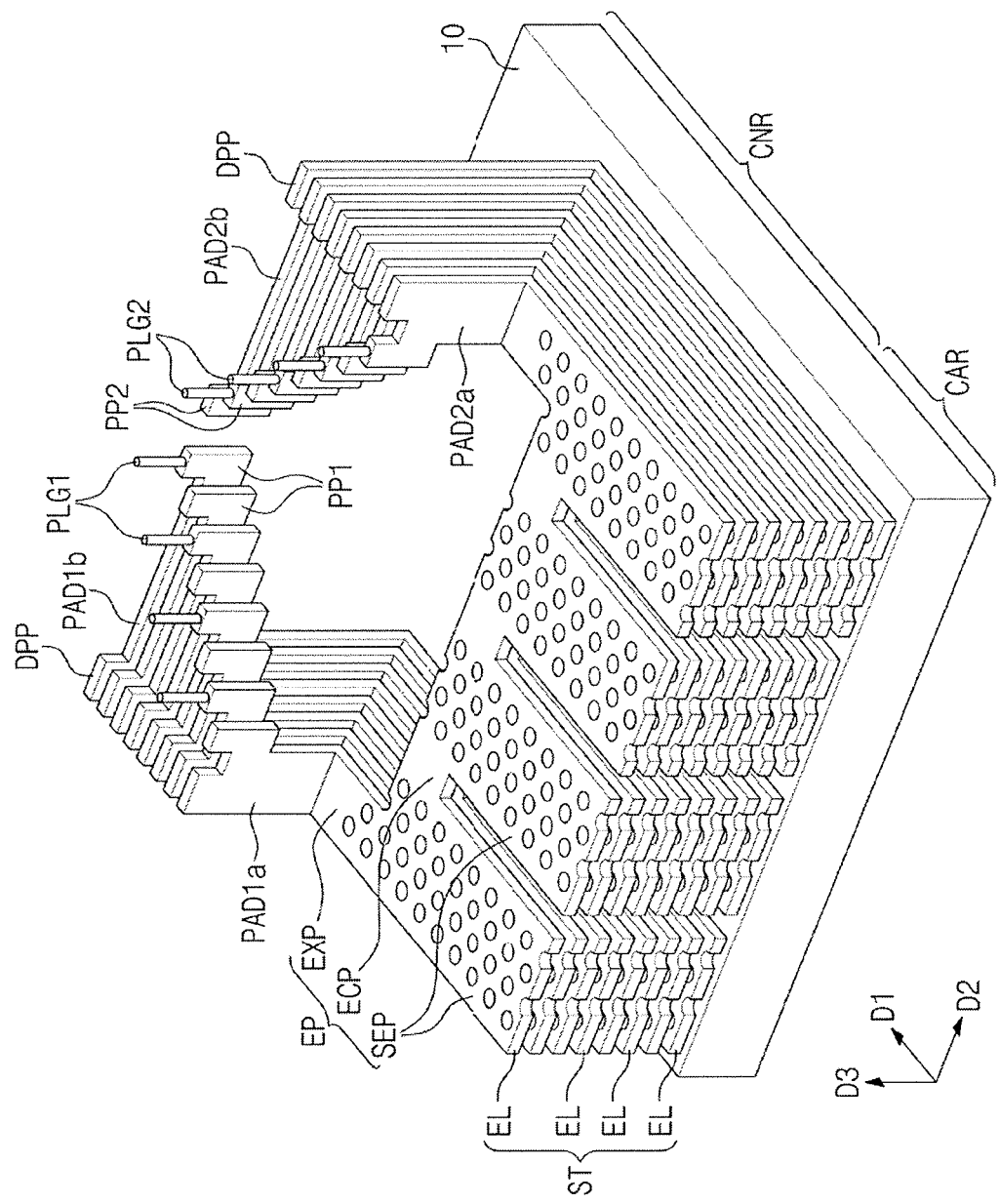

FIGS. 26 and 27 are perspective views illustrating electrode structures formed using the manufacturing method of FIGS. 20A to 25A and 20B to 25B.

Referring to FIG. 26, the electrode structure ST including vertically stacked electrodes EL may be disposed on the substrate 10. Each of the electrodes EL may include an electrode portion EP extending in the first direction D1 parallel to the top surface of the substrate 10 on the cell array region CAR, a vertical pad portion PADa extending in the third direction D3 vertical or inclined to the top surface of the substrate 10 on the connection region CNR, a horizontal pad portion PADb extending from a portion of the vertical pad portion PADa in the second direction D2 perpendicular to the first direction D1 and parallel to the top surface of the substrate 10, and a protrusion PP protruding from a portion of the horizontal pad portion PADb in the third direction D3.

In addition, each of the electrodes EL may further include a dummy protrusion DPP protruding from a portion of the vertical pad portion PADa in the third direction D3.

As described with reference to FIG. 14, each of the electrode portions EP of the electrodes EL may include the sub-electrode portions SEP, the electrode connection portion ECP, and the extension EXP.

In some embodiments, the vertical pad portions PADa of the electrodes EL may have sidewalls laterally aligned with each other, and widths of the vertical pad portions PADa in the second direction D2 may be substantially equal to each other. The horizontal pad portions PADb of the electrodes EL may have widths in the second direction D2 from the vertical pad portions PADa, and the widths of the horizontal pad portions PADb may be different from each other. For example, the widths of the horizontal pad portions PADb in the second direction D2 may decrease sequentially as the heights of the electrode portions EP from the substrate 10 increase sequentially. The protrusions PP of the electrodes EL may be disposed on end portions of the horizontal pad portions PADb, respectively. Thus, the protrusions PP of the electrodes EL may be arranged in a direction diagonal to the first and second directions D1 and D2 when viewed from a plan view.

The electrode structure ST may include sacrificial patterns SLP disposed at the same layers as the electrodes EL, respectively, and the sacrificial patterns SLP may have substantially L-shaped cross sections on the connection region CNR. In some embodiments, top surfaces of the sacrificial patterns SLP may be disposed at the substantially same height (or level) as top surfaces of the protrusions PP of the electrodes EL on the connection region CNR. In addition, portions of the sacrificial patterns SLP may be disposed under the horizontal pad portions PADb of the electrodes EL. For example, the portions of the sacrificial patterns SLP may be in direct contact with the horizontal pad portions PADb and the vertical pad portions PADa.

Referring to FIG. 27, each of the electrodes EL may include first and second vertical pad portions PAD1a and PAD2a spaced apart from each other in the second direction D2, a first horizontal pad portion PAD1b extending from a portion of the first vertical pad portion PAD1a in parallel to the second direction D2, and a second horizontal pad portion PAD2b extending from a portion of the second vertical pad portion PAD2a in parallel to the second direction D2. The first and second horizontal pad portions PAD1b and PAD2b may extend in directions opposite to each other. For example, the first horizontal pad portions PAD1b of the electrodes EL and the second horizontal pad portions PAD2b of the electrodes EL may be mirror-symmetrical with respect to an imaginary line parallel to the first direction D1.

First protrusions PP1 may be disposed on end portions of the first horizontal pad portions PAD1b, respectively, and second protrusions PP2 may be disposed on end portions of the second horizontal pad portions PAD2b, respectively. For example, the first protrusions PP1 may be arranged in a first diagonal direction to the first and second directions D1 and D2 in a plan view, and the second protrusions PP2 may be arranged in a second diagonal direction different from the first diagonal direction in a plan view.

In some embodiments, first contact plugs PLG1 may be respectively connected to the first protrusions PP1 of some electrodes EL corresponding to odd-numbered layers in the electrode structure ST, and second contact plugs PLG2 may be respectively connected to the second protrusions PP2 of other electrodes EL corresponding to even-numbered layers in the electrode structure ST. Thus, a process margin of a process of forming conductive lines may be increased. The conductive lines may extend in the first direction D1 and be connected to the first and second contact plugs PLG1 and PLG2, respectively.

FIGS. 28 to 32 are perspective views illustrating a method for manufacturing a 3D semiconductor device according to some embodiments of the inventive concepts. FIG. 33 is a perspective view illustrating an electrode structure formed using the manufacturing method of FIGS. 28 to 32. Hereinafter the descriptions to the same features as in the embodiments of FIGS. 20A to 25A and 20B to 25B will be omitted or mentioned briefly for the purpose of ease and convenience in explanation.

Figure 28:
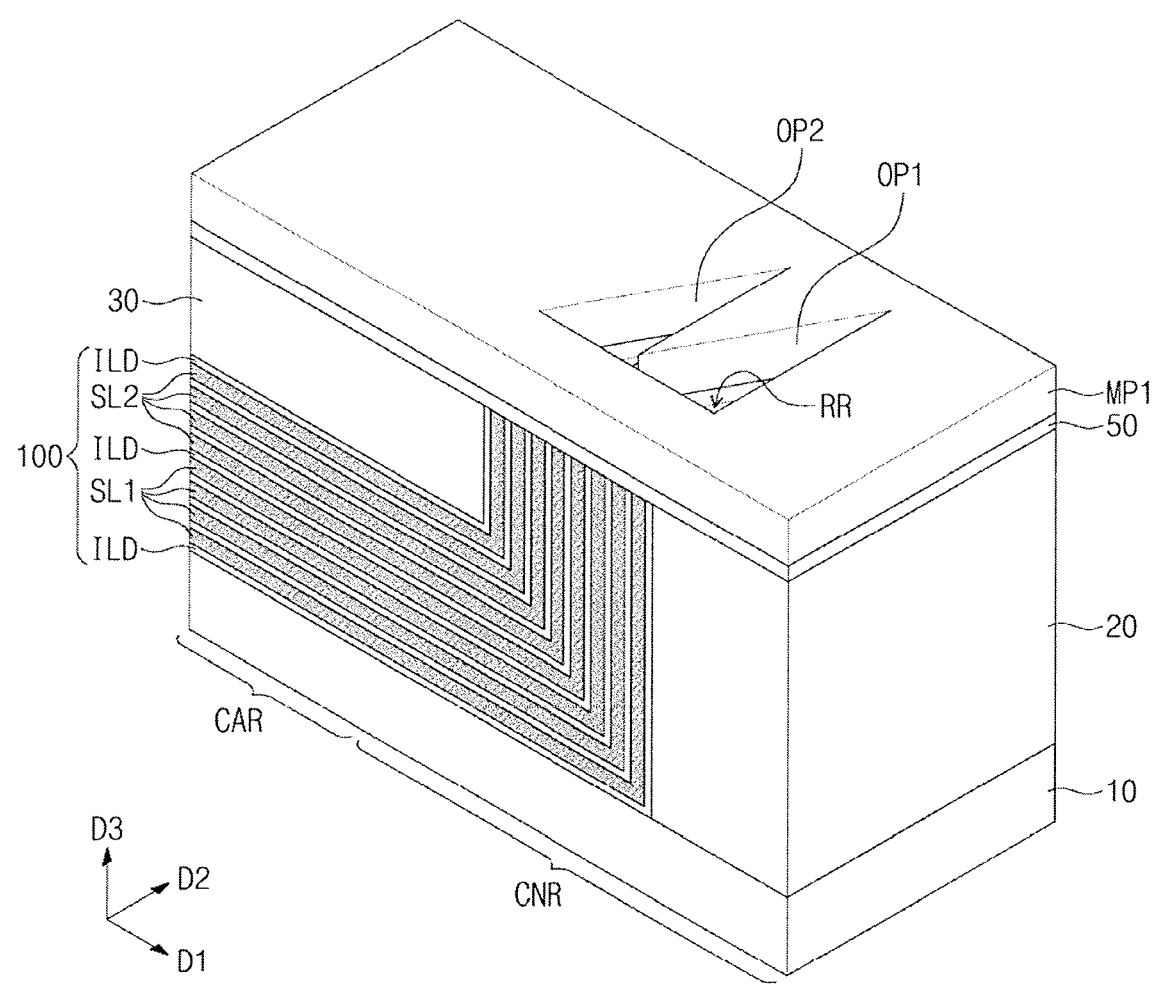
FIGS. 28 to 32 are perspective views illustrating a method for manufacturing a 3D semiconductor device according to some embodiments of the inventive concepts.

Referring to FIG. 28, a thin layer structure 100 may be formed in the trench defined by the mold pattern 20. The thin layer structure 100 may include insulating layers ILD and sacrificial layers SL1 and SL2, which are alternately and repeatedly stacked on the substrate 10. Each of the insulating layers ILD and the sacrificial layers SL1 and SL2 may include a horizontal portion parallel to the top surface of the substrate 10 and a sidewall portion parallel to the sidewall of the mold pattern 20. In some embodiments, the thin layer structure 100 may include a lower thin layer structure and an upper thin layer structure. The lower thin layer structure may include lower sacrificial layers SL1 sequentially stacked on the substrate 10, and the upper thin layer structure may include upper sacrificial layers SL2 sequentially stacked on the lower thin layer structure.

Next, a first mask pattern MP1 having first and second openings OP1 and OP2 may be formed on the thin layer structure 100 and the mold pattern 20. The first and second openings OP1 and OP2 may be disposed on the thin layer structure 100 disposed on the connection region CNR. In some embodiments, the first opening OP1 may expose portions of the lower sacrificial layers SL1, and the second opening OP2 may expose portions of the upper sacrificial layers SL2.

Each of the first and second openings OP1 and OP2 may have a triangular shape in a plan view. For example, each of the first and second openings OP1 and OP2 may have a sidewall extending in a direction diagonal to the first and second directions D1 and D2 intersecting each other when viewed from a plan view. In addition, the sidewalls of the first and second openings OP1 and OP2 may extend in parallel to each other. For example, an area of the lower thin layer structure exposed by the first opening OP1 may gradually increase as a distance from the cell array region CAR increases. Likewise, an area of the upper thin layer structure exposed by the second opening OP2 may gradually increase as a distance from the cell array region CAR increases.

Meanwhile, in some embodiments, the first mask pattern MP1 may have a pair of openings which have the shapes illustrated in FIG. 2B and expose the lower and upper thin layer structures, respectively.

Next, portions of the lower and upper sacrificial layers SL1 and SL2 may be etched using the first mask pattern MP1 as an etch mask to form recess regions RR in the sidewall portions of the lower and upper sacrificial layers SL1 and SL2, as described with reference to FIGS. 20A and 20B. For example, top surfaces of the lower and upper sacrificial layers SL1 and SL2 exposed through the recess regions RR may be lower than the top surface of the mold pattern 20.

In some embodiments, the recess regions RR of the lower sacrificial layers SL1 may have sidewalls laterally aligned with each other. Widths, in the second direction D2, of the recess regions RR of the lower sacrificial layers SL1 may be different from each other. The recess regions RR of the upper sacrificial layers SL2 may have these features of the recess regions RR of the lower sacrificial layers SL1.

Figure 29:
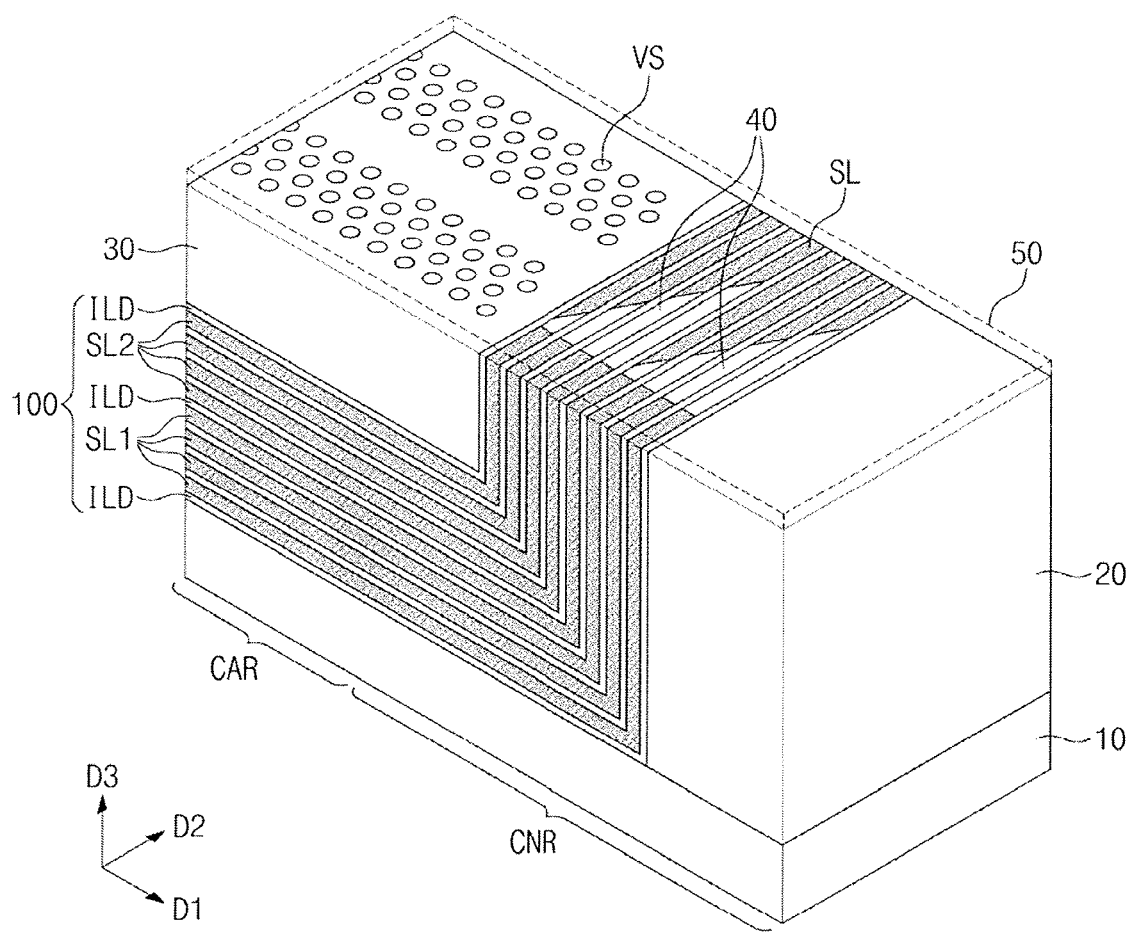

Referring to FIG. 29, filling insulation layers 40 may be formed in the recess regions RR of the lower and upper sacrificial layers SL1 and SL2.

The filling insulation layers 40 may completely fill the recess regions RR, as described with reference to FIG. 2D. In some embodiments, the filling insulation layers 40 may fill upper portions of the recess regions RR to define air gaps in the recess regions RR, as described with reference to FIGS. 21A and 21B.

In some embodiments, vertical structures VS may be formed to penetrate the thin layer structure 100 on the cell array recess region CAR after the filling insulation layers 40 are formed in the recess regions RR of the sidewall portions of the lower and upper sacrificial layers SL1 and SL2. In some embodiments, the vertical structures VS may be formed before the recess regions RR are formed in the sidewall portions of the lower and upper sacrificial layers SL1 and SL2.

Figure 30:
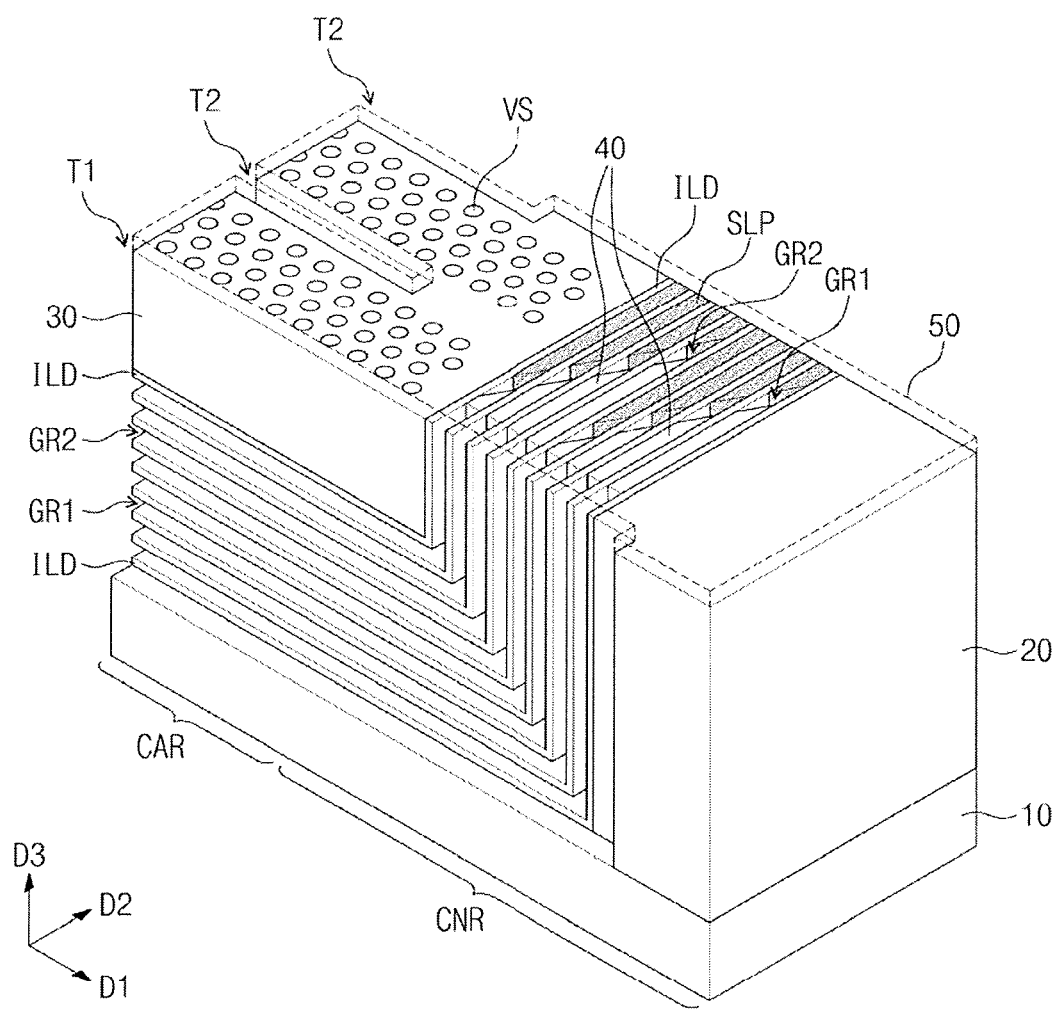

Referring to FIG. 30, the thin layer structure 100 may be patterned to form first and second trenches T1 and T2 defining a mold structure. The first and second trenches T1 and T2 may extend in the first direction D1 and may have different lengths in the first direction D1.

Subsequently, the lower and upper sacrificial layers SL1 and SL exposed by the first and second trenches T1 and T2 may be isotropically etched to form gate regions GR1 and GR2. The lower sacrificial layers SL1 may be removed to form lower gate regions GR1 between the insulating layers ILD of the lower thin layer structure, and the upper sacrificial layers SL2 may be removed to form upper gate regions GR2 between the insulating layers ILD of the upper thin layer structure.

The lower sacrificial layer SL1 may be formed to a lower sacrificial pattern SLP1. The upper sacrificial layer SL2 may be formed to an upper sacrificial pattern SLP2. The lower and upper sacrificial patterns SLP1 and SLP2 may be formed on the connection region CNR.

In some embodiments, due to the isotropic etching process, the lower and upper sacrificial patterns SPL1 and SPL2 may be spaced apart from the filling insulation layer 40 in the second direction D2 on the connection region CNR. Thus, an empty space exposing a portion of the bottom surface of the capping layer 50 may be formed between the filling insulation layer 40 and each of the lower and upper sacrificial patterns SPL1 and SPL2. The empty space between the lower sacrificial pattern SPL1 and the filling insulation layer 40 may be referred to as the lower gate region GR1. The empty space between the lower sacrificial pattern SPL1 and the filling insulation layer 40 may be referred to as the upper gate region GR2. In some embodiments, by the isotropic etching process, an empty space may be formed between the filling insulation layers 40 spaced apart from each other in the second direction D2 in each of the lower and upper sacrificial layers SL1 and SL2.

As described with reference to FIGS. 23A and 23B, each of the lower and upper gate regions GR1 and GR2 may include a vertical region parallel to the sidewall of the mold pattern 20, a horizontal region extending from the vertical region in the second direction D2, and a protrusion region extending from the horizontal region in the third direction D3 between the filling insulation layer 40 and a sidewall of the sacrificial pattern SLP, which are disposed on the connection region CNR.

In some embodiments, the protrusion regions of the lower gate regions GR1 may be spaced apart from the protrusion regions of the upper gate regions GR2 in the first direction D1. In some embodiments, distances in the first direction D1 between the protrusion regions of the lower gate regions GR1 and the protrusion regions of the upper gate regions GR2 may be substantially equal to each other.

Figure 31:
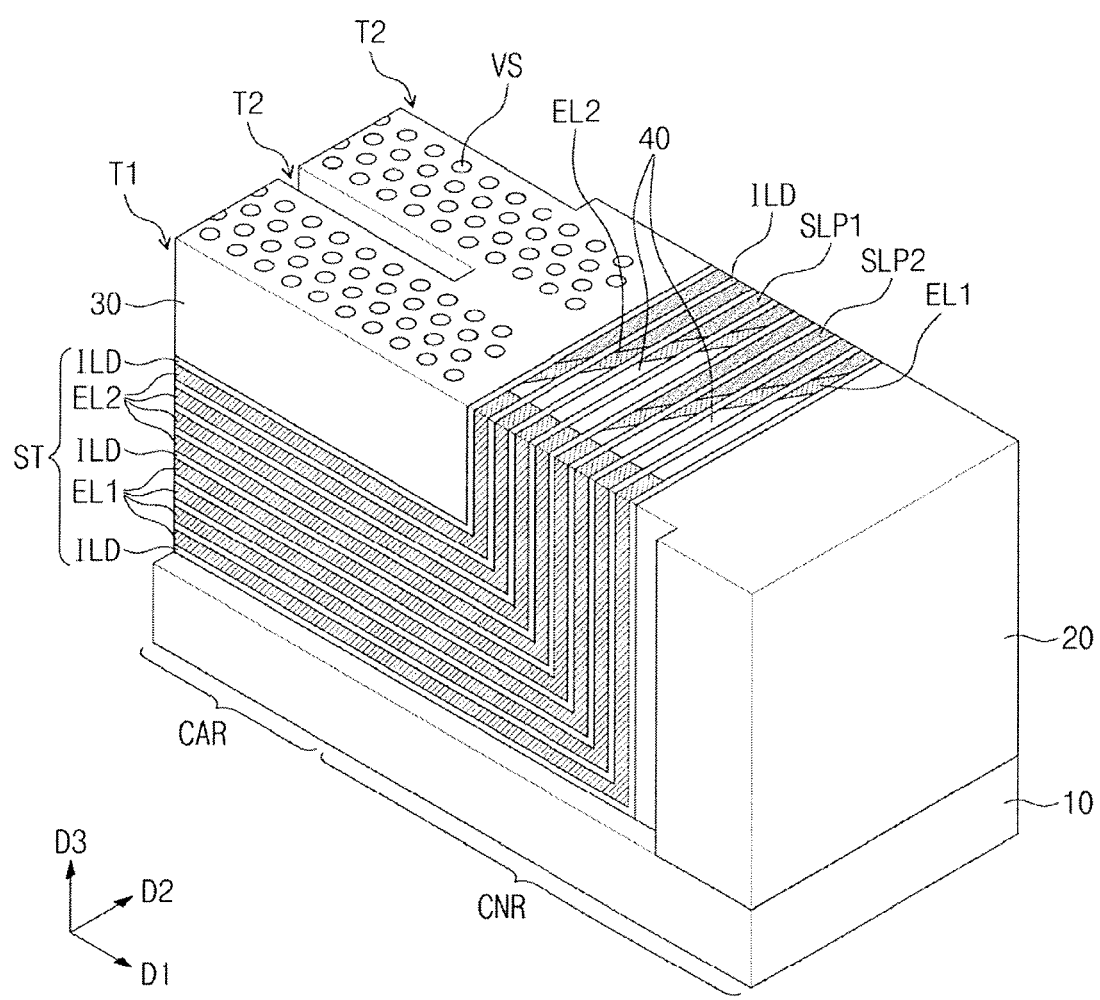

Referring to FIG. 31, lower electrodes EL1 may be formed in the lower gate regions GR1, respectively, and upper electrodes EL2 may be formed in the upper gate regions GR2, respectively. The lower electrodes EL1 and the upper electrodes EL2 may be formed using a deposition process having a step coverage property, as described with reference to FIGS. 24A and 24B. As a result, an electrode structure ST including a lower electrode structure and an upper electrode structure may be formed on the substrate 10. The lower electrode structure may include the lower electrodes EL1 vertically stacked on the substrate 10, and the upper electrode structure may include the upper electrodes EL2 vertically stacked on the lower electrode structure. Each of the lower and upper electrodes EL1 and EL2 may include a horizontal pad portion PADb extending in the second direction D2 on the connection region CNR and protrusions PP1 and PP2 protruding from a portion of the horizontal pad portion PADb, as illustrated in FIG. 33. The protrusions PP1 and PP2 of the lower and upper electrodes EL1 and EL2 may be respectively disposed between the lower sacrificial pattern SLP1 and the filling insulation layers 40 and between the upper sacrificial patterns SLP and the filling insulation layers 40. The filling insulation layers 40 may be spaced apart from the lower sacrificial patterns SLP1 and the upper sacrificial patterns SLP2 in the second direction D2. Top surfaces of the protrusions PP1 and PP2 of the lower and upper electrodes EU and EL2 may be substantially coplanar with each other.

In some embodiments, as illustrated in FIG. 33, each of the lower and upper electrodes EL1 and EL2 may include an electrode portion EP parallel to the top surface of the substrate 10, a vertical pad portion PADa vertical or inclined to the top surface of the substrate 10, the horizontal pad portion PADb extending from a portion of the vertical pad portion PADa in the second direction D2, and the protrusions PP1 and PP2 protruding from the portion of the horizontal pad portion PADb.

The protrusions PP1 of the lower electrodes EL1 may be arranged in a diagonal direction to constitute a first line, and the protrusions PP2 of the upper electrodes EL2 may be arranged in the diagonal direction to constitute a second line parallel to the first line. The protrusions PP1 of the lower electrodes EL1 may be spaced apart from the protrusions PP2 of the upper electrodes EL2 in the first direction D1, respectively. Distances in the first direction D1 between the protrusions PP1 and the protrusions PP2 may be substantially equal to each other.

Figure 32:
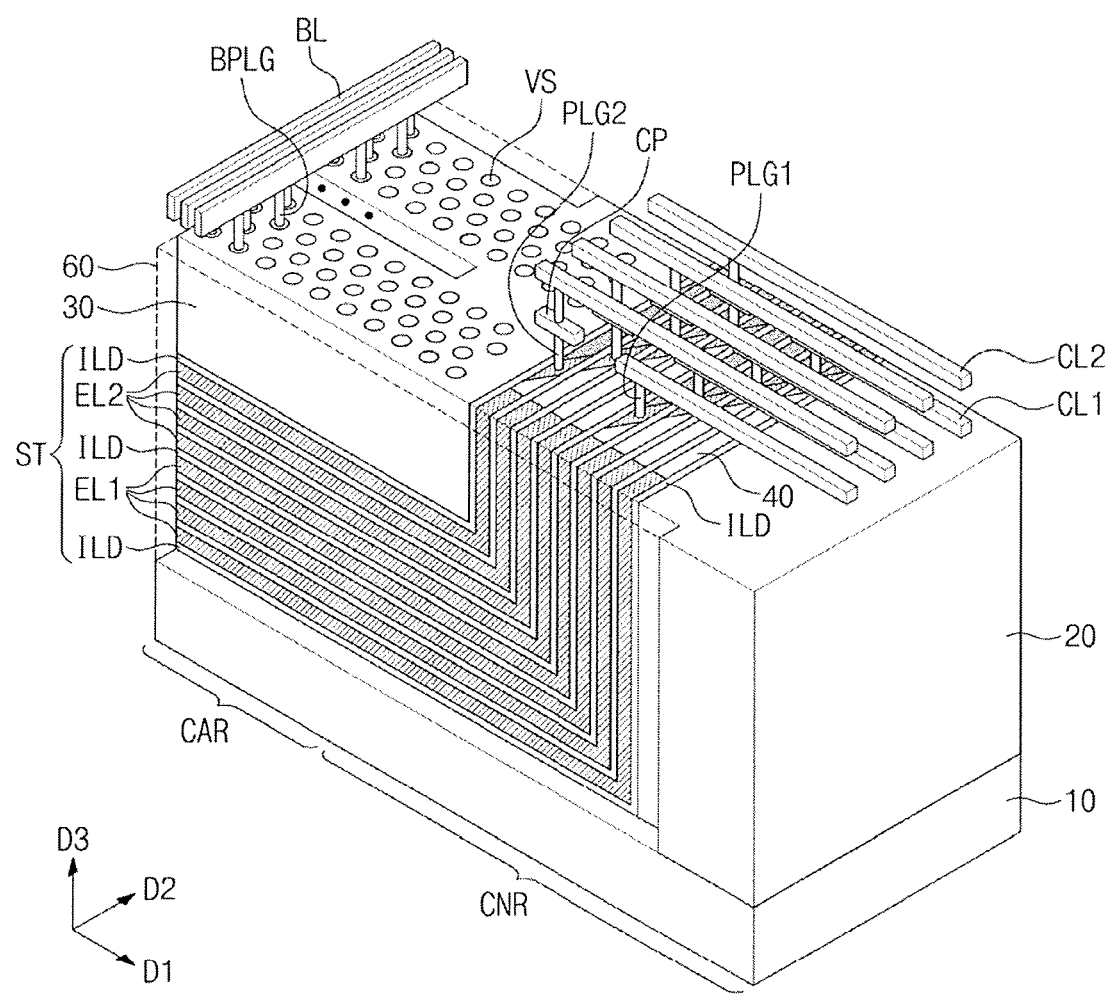
Figure 33:
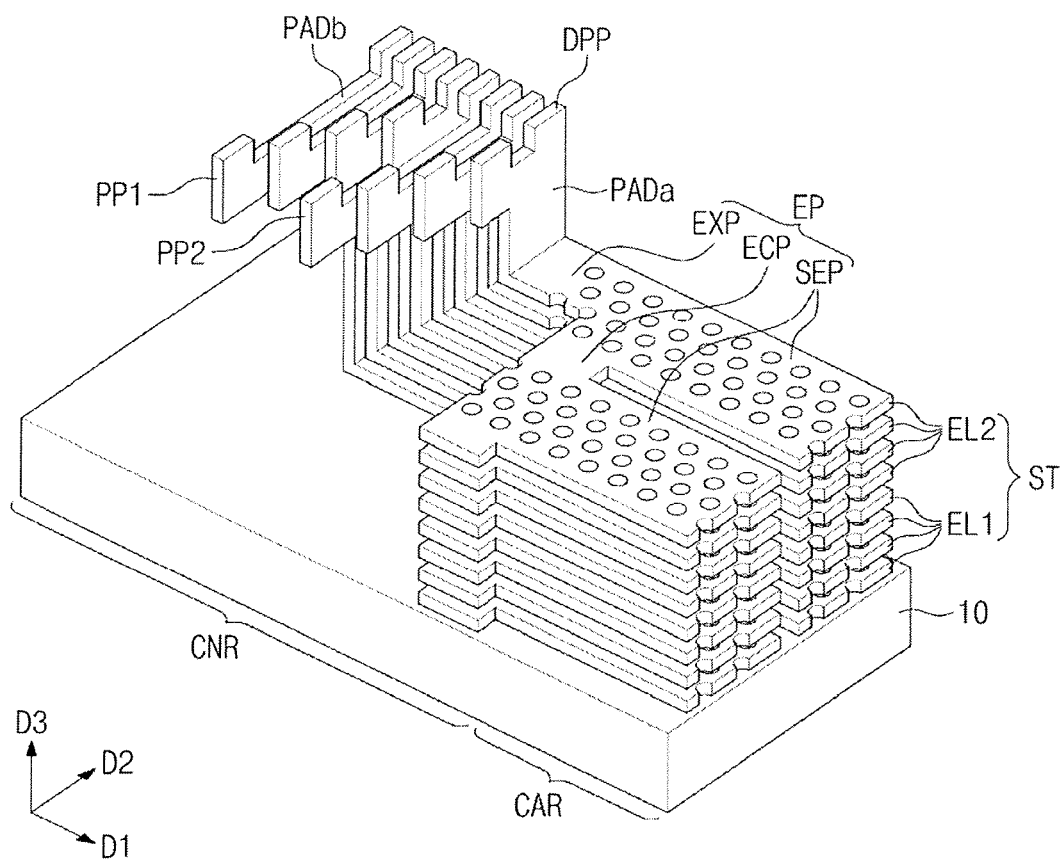
FIG. 33 is a perspective view illustrating an electrode structure formed using the manufacturing method of FIGS. 28 to 32.

Referring to FIG. 32, an interconnection structure may be formed to be connected to the electrode structure ST including the lower electrodes EL1 and the upper electrodes EL2. In some embodiments, the interconnection structure may include first lower contact plugs PLG1, lower conductive lines CL1, second lower contact plugs PLG2, and upper conductive lines CL2. The first lower contact plugs PLG1 and the lower conductive lines CL1 may be electrically connected to the lower electrodes EL1, and the second lower contact plugs PLG2 and the upper conductive lines CL2 may be electrically connected to the upper electrodes EL2.

The first lower contact plugs PLG1 may be connected to the protrusions PP1 of the lower electrodes EL1, respectively. The lower conductive lines CL1 may extend in the first direction D1 and may be connected to the first lower contact plugs PLG1, respectively. Since the protrusions PP1 of the lower electrodes EL1 are arranged in the diagonal direction, lengths of the lower conductive lines CL1 in the first direction D1 may be different from each other. Alternatively, the first lower contact plugs PLG1 may be omitted. In this case, the lower conductive lines CL1 may be in direct contact with the protrusions PP1 of the lower electrodes EL1 without the first lower contact plugs PLG1.

The second lower contact plugs PLG2 may be connected to the protrusions PP2 of the upper electrodes EL2, respectively. Lower conductive patterns CP may be connected to the second lower contact plugs PLG2, respectively. Here, the lower conductive patterns CP may be disposed at the same level as the lower conductive lines CL1. In some embodiments, the second lower contact plugs PLG2 may be omitted. In this case, the lower conductive patterns CP may be in direct contact with the protrusions PP2 of the upper electrodes EL2.

The upper conductive lines CL2 may be electrically connected to the lower conductive patterns CP through upper contact plugs PLG2, respectively. The upper conductive lines CL2 may extend in the first direction D1 and may partially overlap with the lower conductive lines CL1 in a plan view. Since the upper conductive lines CL2 are disposed at a different level from the lower conductive lines CL1, a process margin of the process of forming the lower and upper conductive lines CL1 and CL2 may be secured in the case where the number of the lower and upper electrodes EL1 and EL2 of the electrode structure ST increases.

Figure 34:
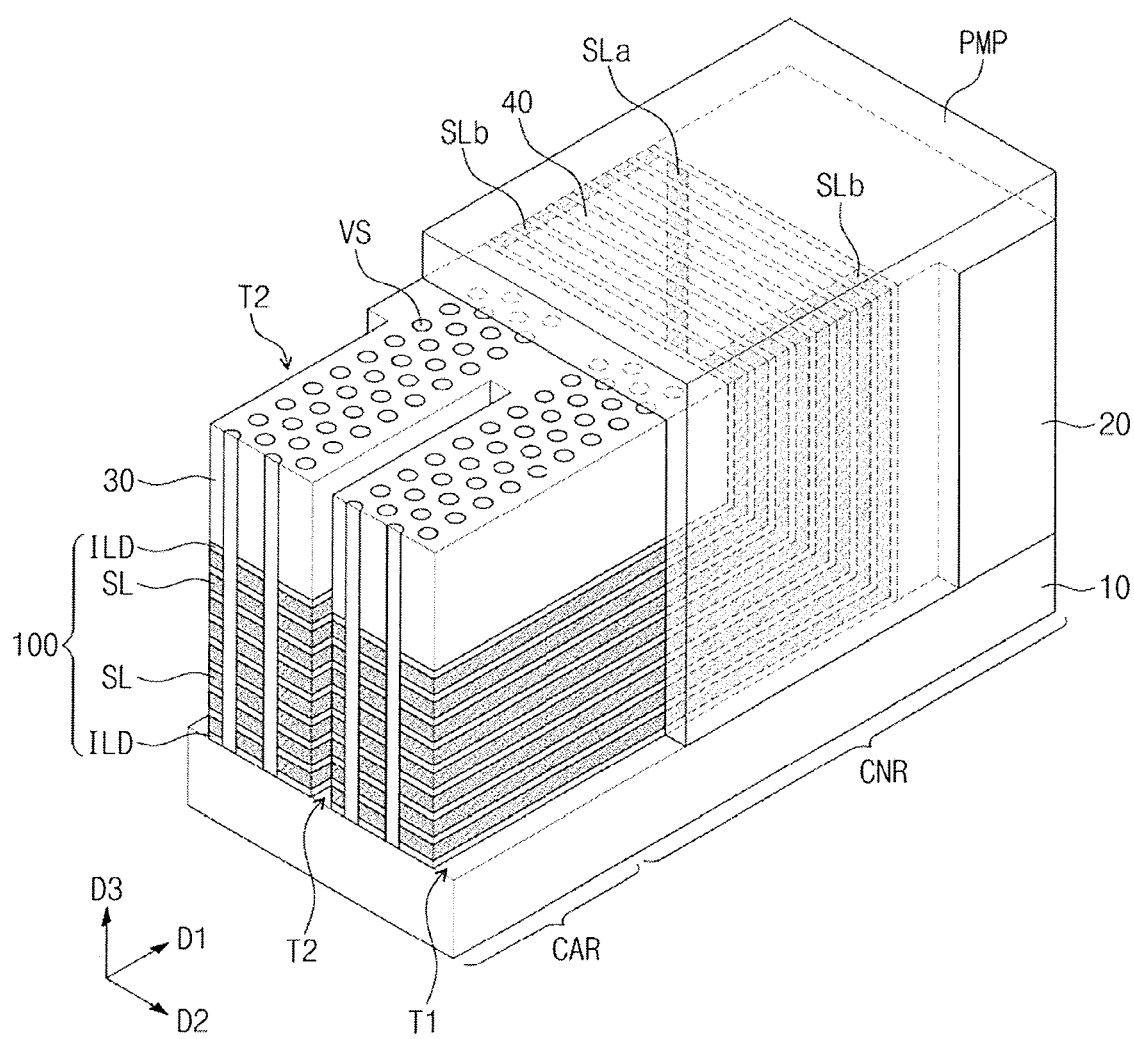
FIGS. 34 and 35 are perspective views illustrating a method for manufacturing a 3D semiconductor device according to some embodiments of the inventive concepts.
Figure 35:
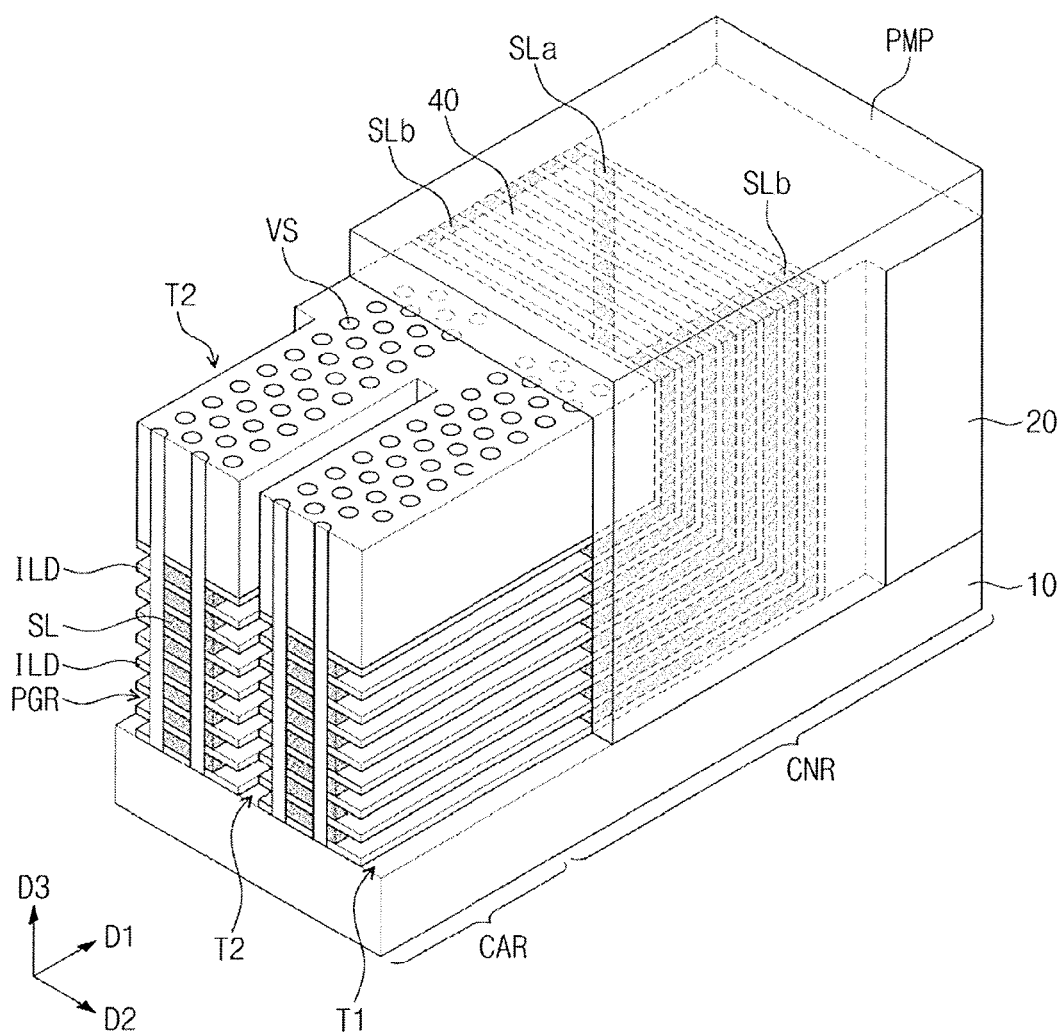
Figure 36:
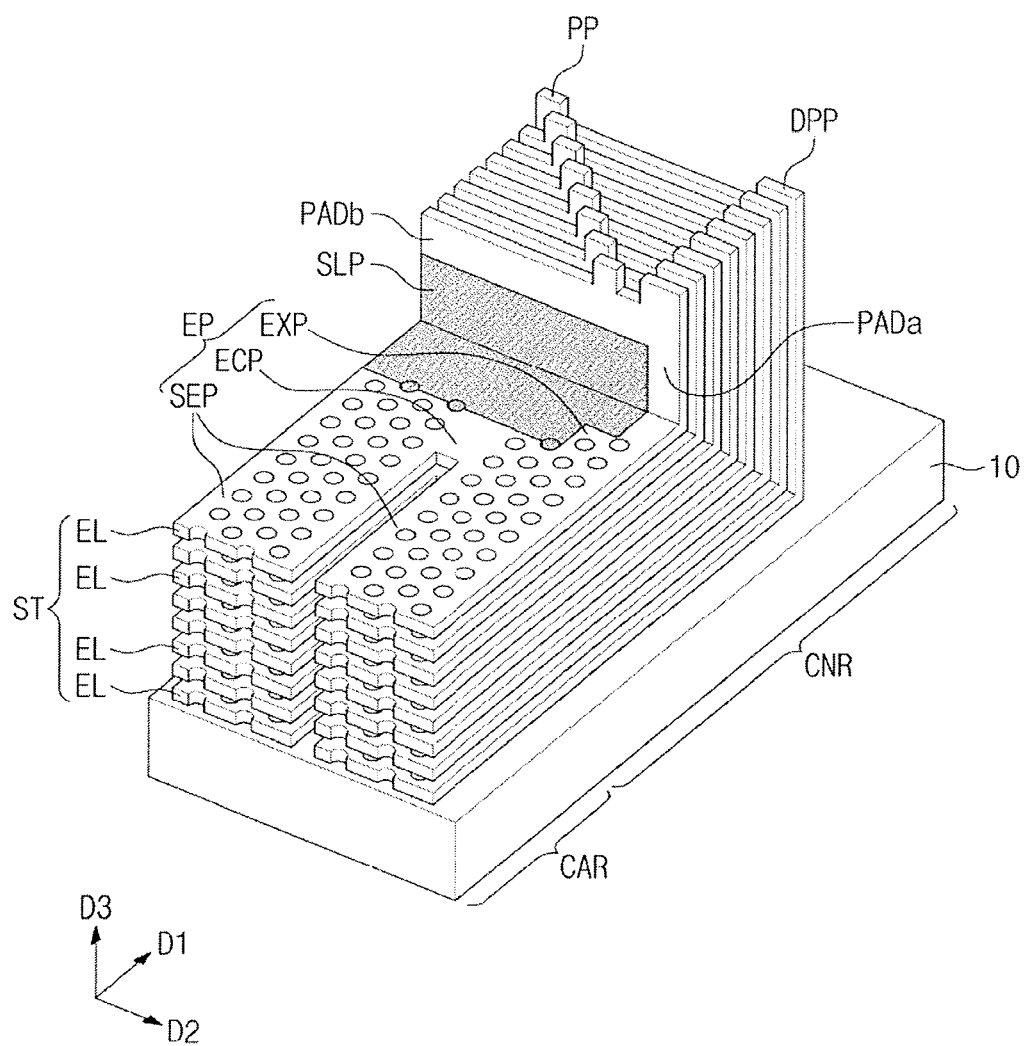
FIGS. 36 and 37 are perspective views illustrating electrode structures formed using the manufacturing method of FIGS. 34 and 35.
Figure 37:
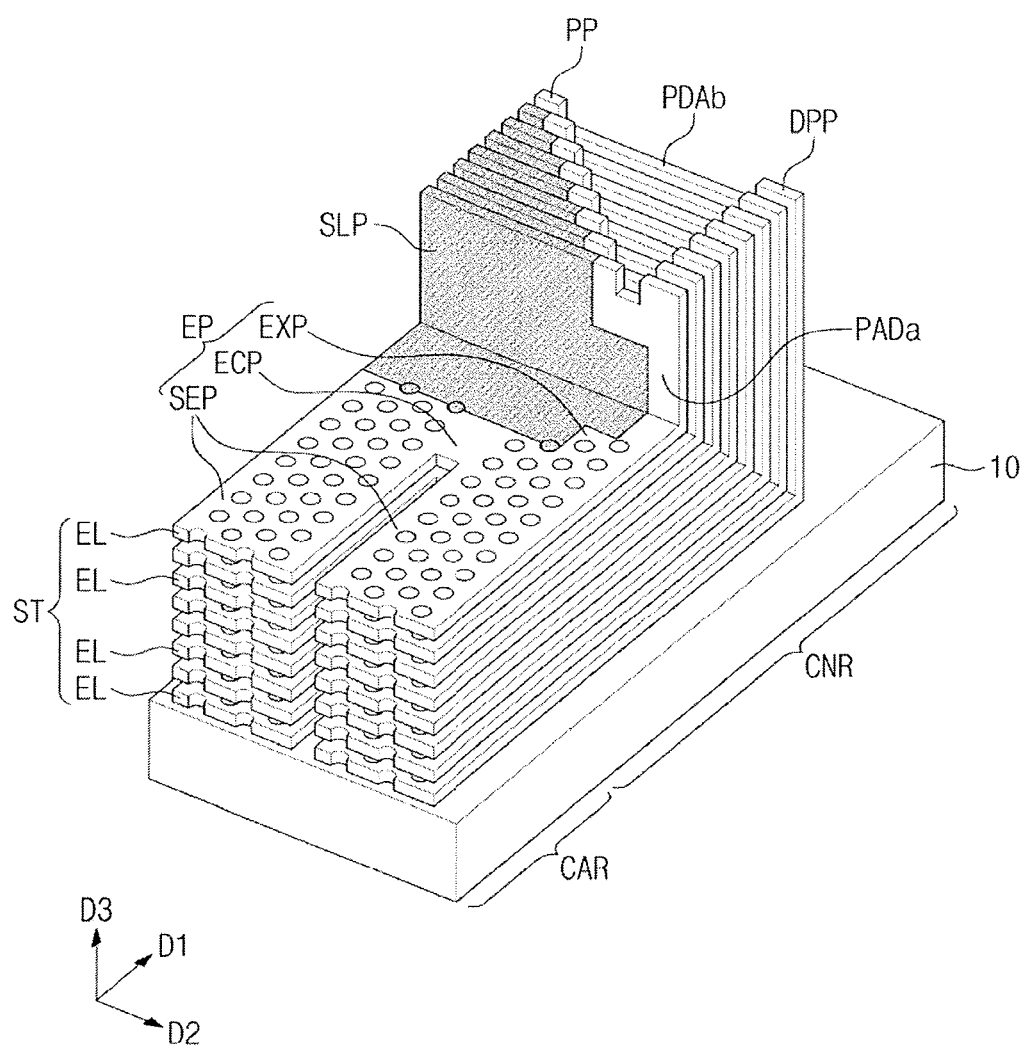

FIGS. 34 and 35 are perspective views illustrating a method for manufacturing a 3D semiconductor device according to some embodiments of the inventive concepts. FIGS. 36 and 37 are perspective views illustrating electrode structures formed using the manufacturing method of FIGS. 34 and 35.

According to some embodiments, a thin layer structure 100 may be formed in the trench defined by the mold pattern 20. The thin layer structure 100 may include insulating layers ILD and sacrificial layers SL alternately and repeated stacked on the substrate 10, and each of the insulating layers ILD and the sacrificial layers SL may include a horizontal portion parallel to the top surface of the substrate 10 and a sidewall portion parallel to the sidewall of the mold pattern 20.

As described with reference to FIGS. 6A to 8A, 6B to 8B, and 6C to 8C, air gaps may be formed in portions of the thin layer structure 100 on the connection region CNR, and then, a patterning process may be performed on the thin layer structure 100 to form trenches in the thin layer structure 100.

First and second trenches T1 and T2 exposing the substrate 10 may be formed by the patterning process of the thin layer structure 100, as described with reference to FIGS. 8A, 8B, and 8C. The first and second trenches T1 and T2 may extend in the first direction D1 and may have different lengths in the first direction D1. For example, the first trench T1 may expose the horizontal portions and the sidewall portions of the insulating layers ILD and the sacrificial layers SL on the cell array region CAR and the connection region CNR, and the second trench T2 may expose the horizontal portions of the insulating layers ILD and the sacrificial layers SL on the cell array region CAR.

Referring to FIG. 34, a pad mask pattern PMP may be formed to cover a portion of the mold structure on the connection region CNR after the formation of the first and second trenches T1 and T2. The pad mask pattern PMP may fill portions of the first trenches T1 on the connection region CNR and may expose the horizontal portions of the insulating layers ILD and the sacrificial layers SL. For example, the pad mask pattern PMP may be a photoresist pattern or a hard mask pattern.

Meanwhile, in some embodiments, the recess regions may be formed in the thin layer structure 100 on the connection region CNR by using the first mask pattern having one opening, as described with reference to FIGS. 20A to 22A and 20B to 22B. Thereafter, the pad mask pattern PMP of FIG. 34 may be formed on the connection region CNR of the structure illustrated in FIGS. 22A and 22B.

Referring to FIG. 35, a first etching process may be performed to selectively etch portions of the sacrificial layers SL exposed by the pad mask pattern PMP. The first etching process may be an isotropic etching process using an etchant selectively etching the sacrificial layers SL. During the first etching process, the etchant may be provided through the first and second trenches T1 and T2 on the cell array region CAR to laterally etch the sacrificial layers SL. Thus, preliminary gate regions PGR may be formed between the insulating layers ILD on the cell array region CAR, and portions of the sacrificial layers SL may remain between the insulating layers ILD on the cell array region CAR. Since the pad mask pattern PMP covers the thin layer structure 100 of the connection region CNR during the first etching process, a width in the second direction D2 of the sacrificial layer SL of the cell array region CAR may be different from a width in the second direction D2 of the sacrificial layer SL of the connection region CNR. For example, after the first etching process, the widths of the sacrificial layers SL of the cell array region CAR may be smaller than the widths of the sacrificial layers SL of the connection region CNR.

The pad mask pattern PMP may be removed after the fox of the preliminary gate regions PGR, and thus sidewalls of the mold structure of the connection region CNR may be exposed. For example, the sidewall portions of the insulating layers ILD and the sacrificial layers SL may be exposed through the first trenches T1 on the connection region CNR.

Next, a second etching process may be performed to selectively etch the sacrificial layers SL exposed through the first and second trenches T1 and T2. The second etching process may be an isotropic etching process using an etchant selectively etching the sacrificial layers SL. For example, during the second etching process, the etchant may be provided through the first and second trenches T1 and T2 on the cell array region CAR and may be provided through the first trenches T1 on the connection region CNR. The sacrificial layers SL of the cell array region CAR may be completely removed by the second etching process to form gate regions between the insulating layers ILD, and portions of the sacrificial layers SL of the connection region CNR may remain after the second etching process to form sacrificial patterns SLP, as described with reference to FIGS. 9A, 9B, and 9C.

Each of the gate regions formed by the second etching process may include a horizontal region extending in the second direction D2 between the sacrificial pattern SLP and the filling insulation layer 40 and a protrusion region extending onto a sidewall of the filling insulation layer 40, as described with reference to FIGS. 9A, 9B, and 9C.

Referring back to FIGS. 9A, 9B and 9C, the gate regions formed by the second etching process may expose sidewalls and top surfaces of the sacrificial patterns SLP on the connection region CNR.

Referring to FIG. 36, the sacrificial patterns SLP may include horizontal portions parallel to the top surface of the substrate 10 and sidewall portions vertical or inclined to the top surface of the substrate 10. Using the first and second etching processes, the horizontal portion of each of the sacrificial patterns SLP may include portions having widths different from each other.

Thereafter, electrodes EL may be formed in the gate regions, respectively, as described with reference to FIGS. 10A, 10B, and 10C. As a result, an electrode structure ST may be formed on the substrate 10. The electrode structure ST may include a plurality of the electrodes EL sequentially stacked on the substrate 10. Each of the electrodes EL may include an electrode portion EP extending on the cell array region CAR in the first direction D1 parallel to the top surface of the substrate 10, a vertical pad portion PADa extending from the electrode portion EP in a direction vertical or inclined to the top surface of the substrate 10 on the connection region CNR, a horizontal pad portion PADb extending from a portion of the vertical pad portion PADa in the second direction D2, and a protrusion PP protruding from a portion of the horizontal pad portion PADb, as illustrated in FIGS. 36 and 37. In addition, each of the electrodes EL may further include a dummy protrusion DPP protruding from a portion of the vertical pad portion PADa in the third direction D3.

In the embodiment illustrated in FIG. 36, lengths of the horizontal pad portions PADb in the second direction D2 may be substantially equal to each other. In some embodiments, as shown in FIG. 37, the horizontal pad portions PADb may have different lengths in the second direction D2 from the vertical pad portions PADa, and the protrusions PP may be disposed on end portions of the horizontal pad portions PADb, respectively.

Referring to FIGS. 36 and 37, the electrode portion EP of each of the electrodes EL may include sub-electrode portions SEP extending in the first direction D1 and spaced apart from each other in the second direction D2, an electrode connection portion ECP connecting the sub-electrode portions SEP on the connection region CNR, and an extension EXP extending from a portion of the electrode connection portion ECP in the first direction D1. In some embodiments, a width of the extension EXP in the second direction D2 may be smaller than a width of the sub-electrode portion SEP in the second direction D2. In addition, the extension EXP may include a first portion being adjacent to the electrode connection portion ECP and having a first width, and a second portion being adjacent to the vertical pad portion PADa and having a second width smaller than the first width. A width of the vertical pad portion PADa may be substantially equal to the second width of the second portion of the extension EXP.

Figure 38:
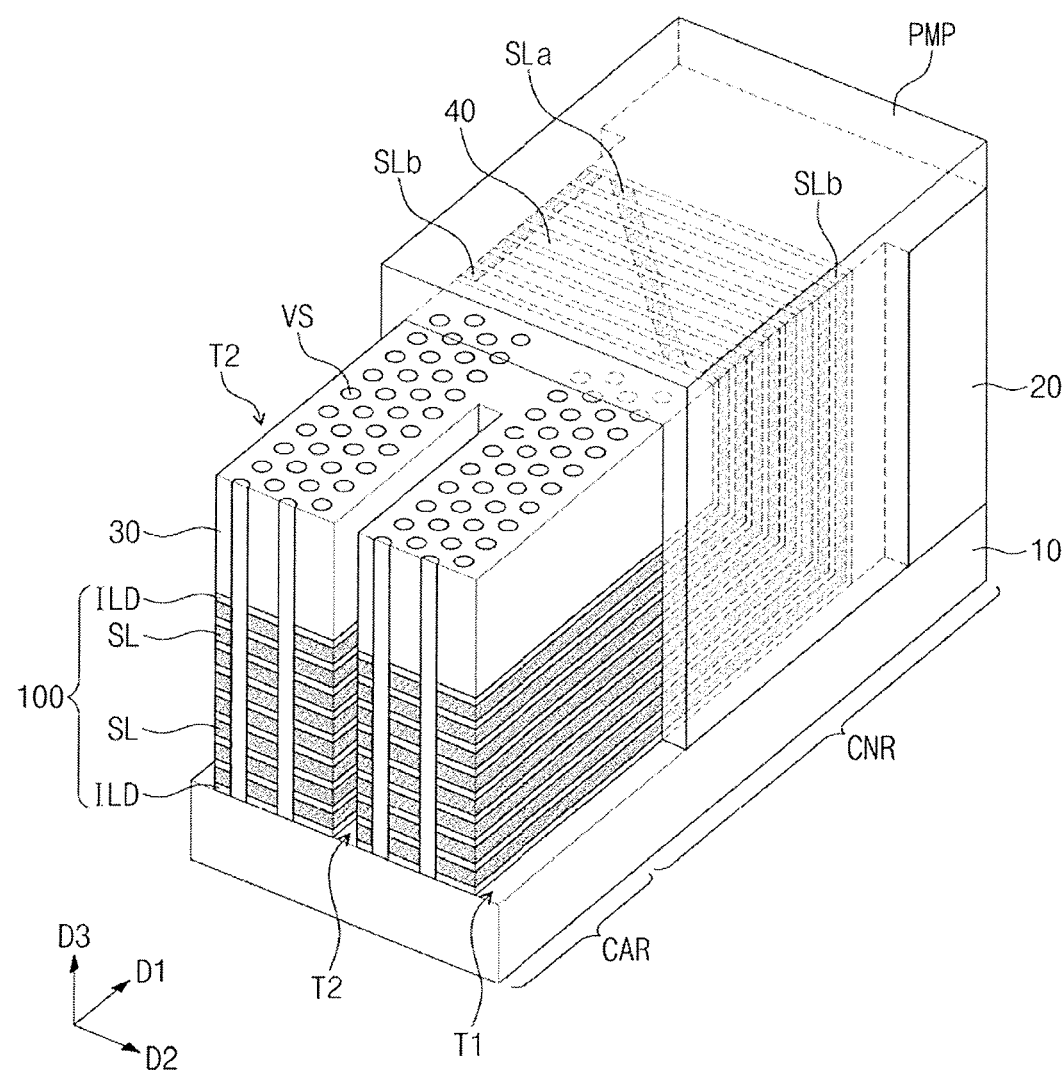
FIGS. 38 and 39 are perspective views illustrating a method for manufacturing a 3D semiconductor device according to some embodiments of the inventive concepts.
Figure 39:
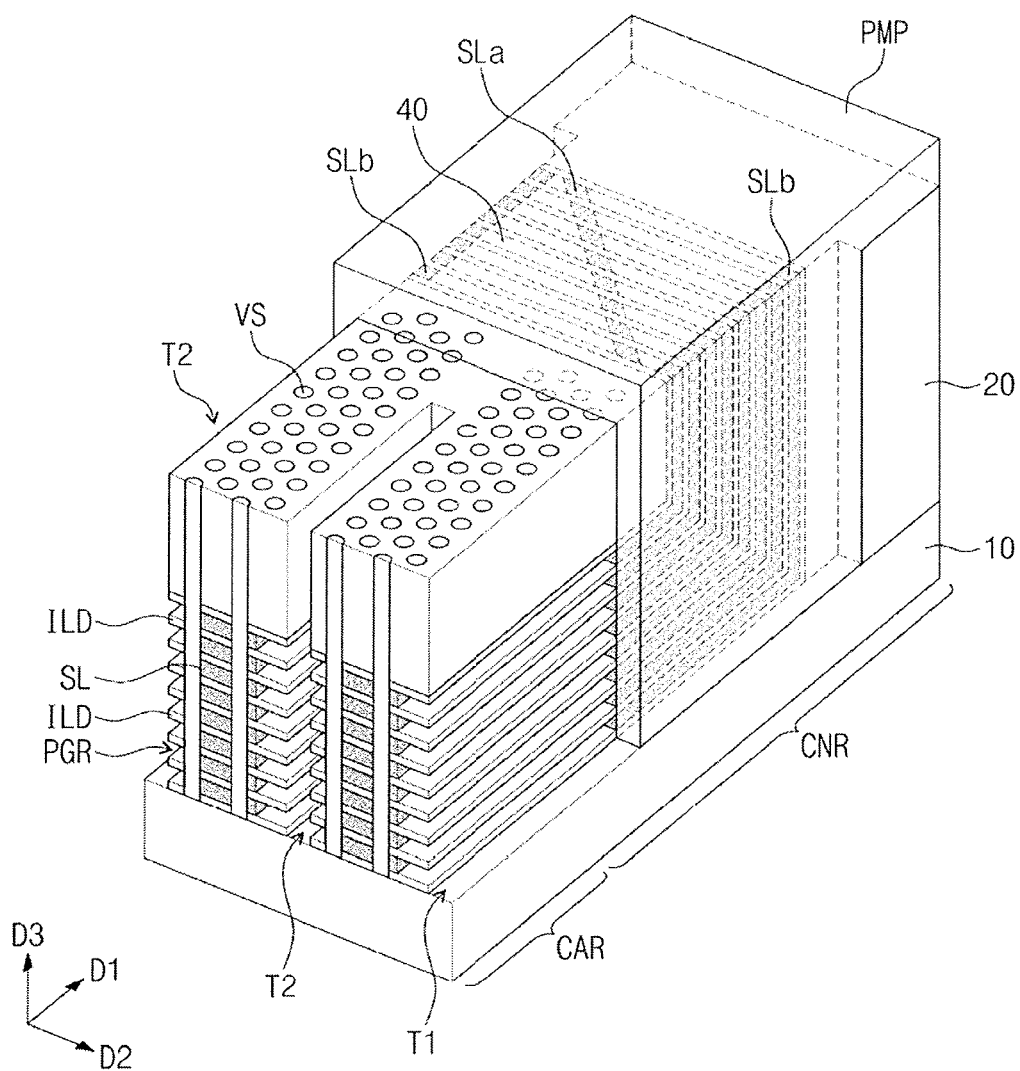
Figure 40:
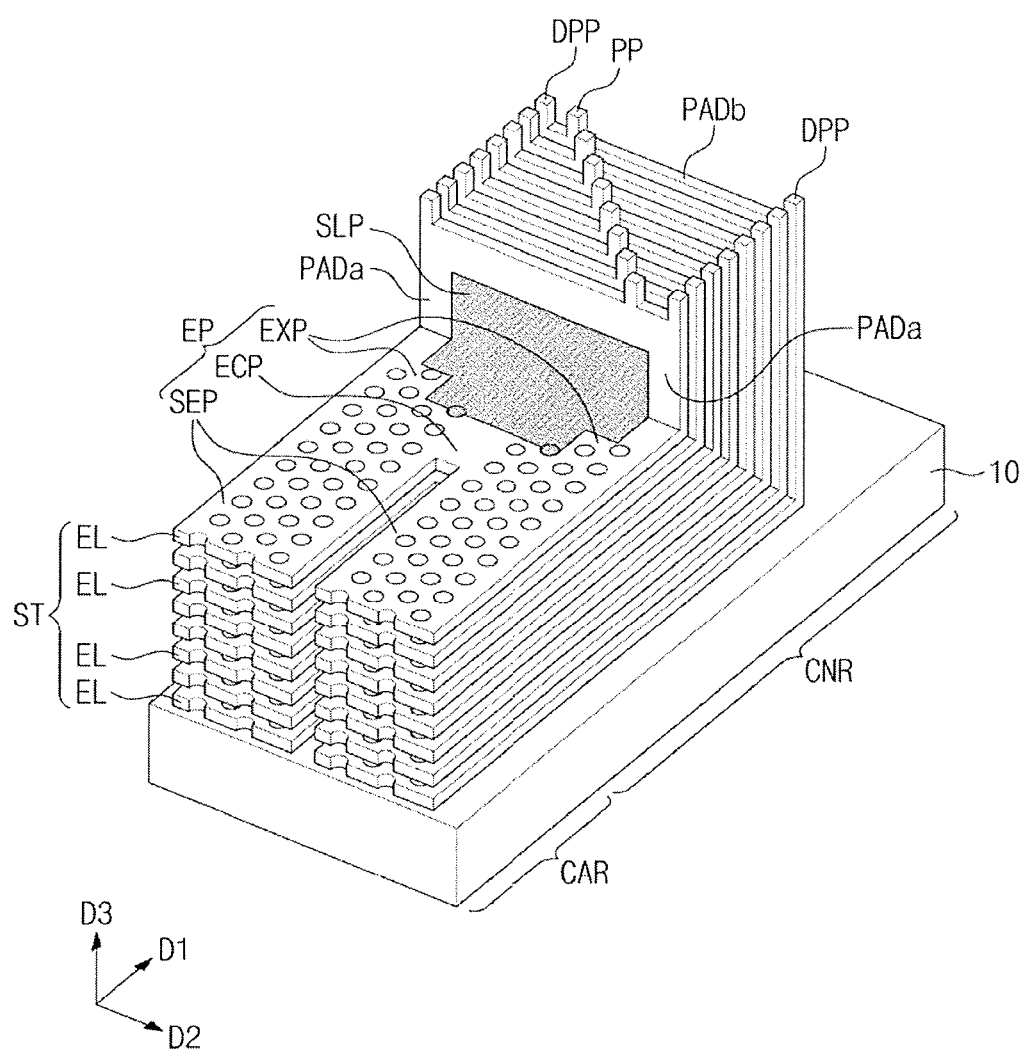
FIG. 40 is a perspective view illustrating an electrode structure formed using the manufacturing method of FIGS. 38 and 39.

FIGS. 38 and 39 are perspective views illustrating a method for manufacturing a 3D semiconductor device according to some embodiments of the inventive concepts. FIG. 40 is a perspective view illustrating an electrode structure formed using the manufacturing method of FIGS. 38 and 39.

In some embodiments, filling insulation layers 40 may be formed to define air gaps AG between the insulating layers ILD of the thin layer structure 100 on the connection region CNR, and then, the thin layer structure 100 may be patterned to form the first and second trenches T1 and T2, as described with reference to FIGS. 15A and 15B. In some embodiments, the second trench T2 may be formed between the first trenches T1, and the first trenches T1 may be longer than the second trench T2 in the first direction D1. In some embodiments, both sidewalls of the mold structures may be exposed on the cell array region CAR and the connection region CNR after the formation of the first and second trenches T1 and T2.

As illustrated in FIG. 38, a pad mask pattern PMP may be formed on the connection region CNR after the formation of the first and second trenches T1 and T2. The pad mask pattern PMP may fill portions of the first trenches T1 on the connection region CNR. Thus, the pad mask pattern PMP may cover opposite sidewalls of the sidewall portions of the insulating layers ILD and the sacrificial layers SL and may expose the horizontal portions of the insulating layers ILD and the sacrificial layers SL.

Referring to FIG. 39, a first etching process may be performed to etch portions of the sacrificial layers SL exposed by the pad mask pattern PMP. Thus, preliminary gate regions PGR may be formed between the insulating layers ILD of the cell array region CAR.

In some embodiments, during the first etching process, an etchant may be provided through the first and second trenches T1 and T2 on the cell array region CAR to laterally etch the sacrificial layers SL. The preliminary gate regions PGR may expose portions of the sacrificial layers SL remaining between the insulating layers ILD.

Next, the pad mask pattern PMP may be removed, and then, a second etching process may be performed to laterally etch the sacrificial layers SL exposed by the first and second trenches T1 and T2. The second etching process may be performed using the substantially same etch recipe as the first etching process.

Since opposite sidewalls of the sacrificial layers SL of the connection region CNR are exposed to an etchant during the second etching process, the opposite sidewalls of the sacrificial layers SL may be laterally etched. In addition, the sacrificial layers SL of the cell array region CAR may be completely removed by the second etching process to form gate regions GR between the insulating layers ILD, and portions of the sacrificial layers SL of the connection region CNR may remain after the second etching process to form sacrificial patterns SLP, as described with reference to FIGS. 16A and 16B. Here, the sacrificial patterns SLP may include horizontal portions parallel to the top surface of the substrate 10 and sidewall portions vertical or inclined to the top surface of the substrate 10, as illustrated in FIG. 40. Here, due to the first and second etching processes, the horizontal portion of each of the sacrificial patterns SLP may include portions having widths different from each other.

Thereafter, electrodes EL may be formed in the gate regions, respectively, as described with reference to FIGS. 17A and 17B. As a result, an electrode structure ST including a plurality of the electrodes EL sequentially stacked may be formed on the substrate 10. Each of the electrodes EL may include an electrode portion EP on the cell array region CAR, vertical and horizontal pad portions PADa and PADb on the connection region CNR, and a protrusion PP on the connection region CNR. Here, the vertical pad portions PADa of the electrodes EL may extend from the electrode portions EP and may be spaced apart from each other in the second direction D2. Each of the electrode portions EP of the electrodes EL may include sub-electrode portions SEP, an electrode connection portion ECP, and extensions EXP. In some embodiments, the extensions EXP of each of the electrodes EL may extend from the electrode connection portion ECP in the first direction D1 and may be spaced apart from each other in the second direction D2. In addition, each of the extensions EXP may include a first portion being adjacent to the electrode connection portion ECP and having a first width, and a second portion being adjacent to the vertical pad portion PADa and having a second width smaller than the first width. A width of the vertical pad portion PADa may be substantially equal to the second width of the second portion of the extension EXP.

FIGS. 41 to 45 are perspective views illustrating a method for manufacturing a 3D semiconductor device according to some embodiments of the inventive concepts. FIG. 46 is a perspective view illustrating an electrode structure formed using the manufacturing method of FIGS. 41 to 45.

Figure 41:
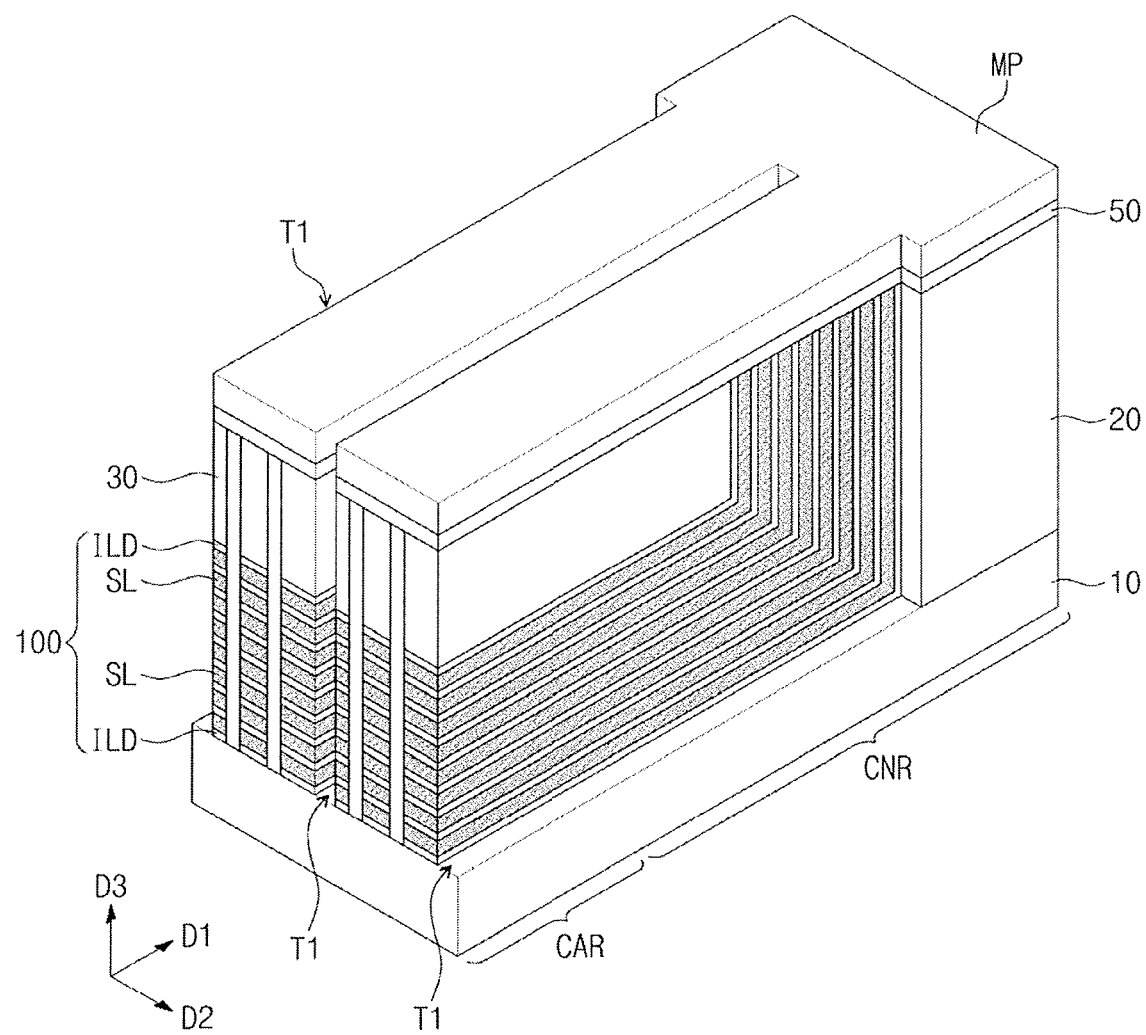
FIGS. 41 to 45 are perspective views illustrating a method for manufacturing a 3D semiconductor device according to some embodiments of the inventive concepts.

Referring to FIG. 41, a thin layer structure 100 may be formed in the trench defined by the mold pattern 20, as described with reference to FIG. 2A. The thin layer structure 100 may include insulating layers ILD and sacrificial layers SL alternately and repeated stacked, and each of the insulating layers ILD and the sacrificial layers SL may include a horizontal portion parallel to the top surface of the substrate 10 and a sidewall portion parallel to the sidewall of the mold pattern 20. Top surfaces of the sidewall portions of the insulating layers ILD and the sacrificial layers SL may be disposed at the same height (or level) from the top surface of the substrate 10. A planarization insulating layer 30 may be formed on the thin layer structure 100 of the cell array region CAR. A top surface of the planarization insulating layer 30 may be substantially coplanar with the top surface of the mold pattern 20 and the top surfaces of the sidewall portions of the insulating layers ILD and the sacrificial layers SL.

Thereafter, vertical structures VS may be formed to penetrate the thin layer structure 100 on the cell array region CAR, as described with reference to FIG. 2D.

Referring to FIG. 41, the thin layer structure 100 may be patterned to form first trenches T1 defining a mold structure.

For example, a capping layer 50 may be formed on the thin layer structure 100 after the formation of the vertical structures VS, and a mask pattern MP may be formed on the capping layer 50. In some embodiments, the mask pattern MP may have line-shaped openings extending in the first direction D1, and the line-shaped openings may intersect the thin layer structure 100 on the cell array region CAR and the connection region CNR.

The thin layer structure 100 may be etched using the mask pattern MP as an etch mask to form the first trenches T1 exposing the substrate 10. In some embodiments, the mold structures may be formed by the formation of the first trenches T1. The mold structures may extend in the first direction D1 and may be spaced apart from each other in the second direction D2. The first trenches T1 may expose sidewalls of the sacrificial layers SL on the cell array region CAR and the connection region CNR. The mask pattern MP may be removed after the formation of the first trenches T1.

Figure 42:
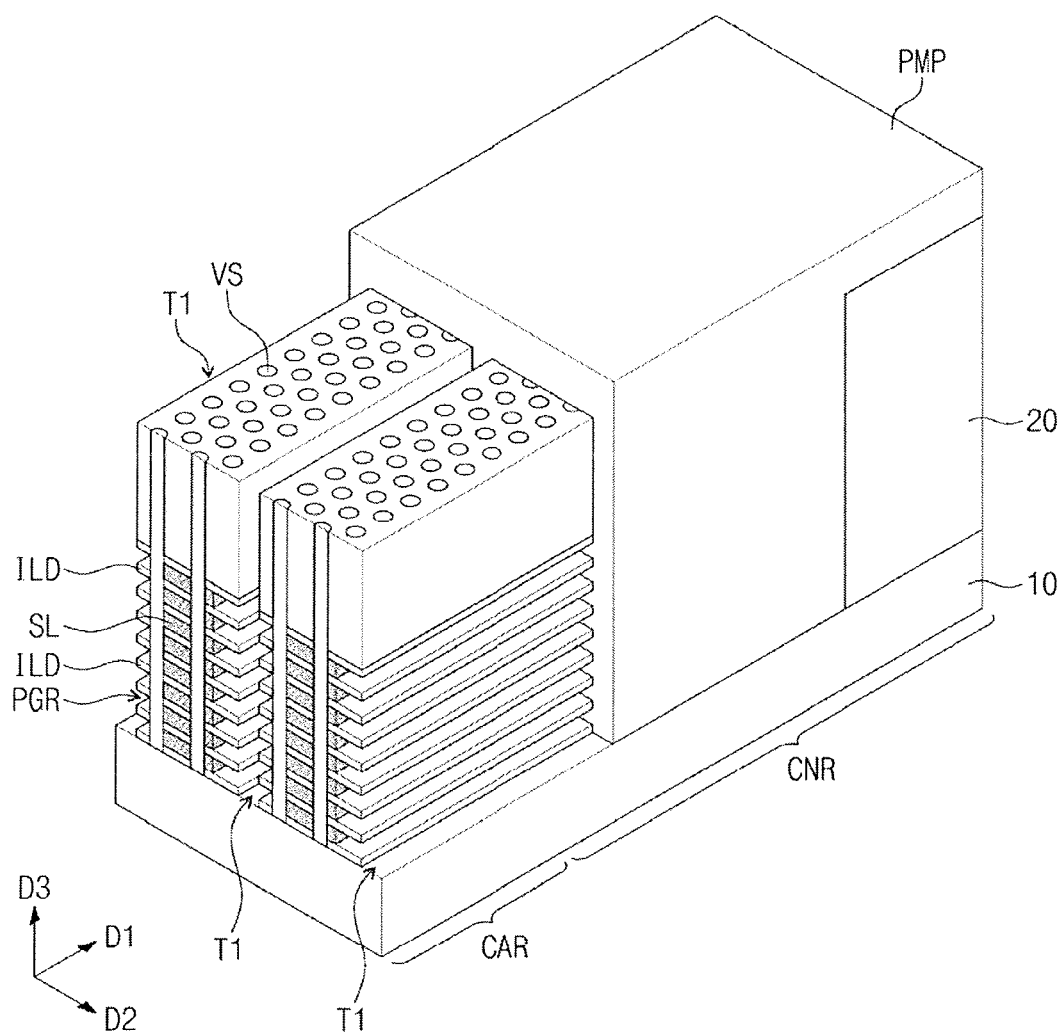

Referring to FIG. 42, a pad mask pattern PMP may be formed to cover portions of the mold structures on the connection region CNR. The pad mask pattern PMP may be formed to fill portions of the first trenches T1. Thus, the pad mask pattern PMP may cover the sidewall portions of the sacrificial layers SL and the insulating layers ILD and portions of the horizontal portions of the sacrificial layers SL and the insulating layers ILD on the connection region CNR. For example, the pad mask pattern PMP may be a photoresist pattern or a hard mask pattern.

Next, a first etching process may be performed to selectively etch portions of the sacrificial layers SL exposed by the pad mask pattern PMP. The first etching process may be an isotropic etching process using an etchant selectively etching the sacrificial layers SL. During the first etching process, the etchant may be provided through the first trenches T1 to laterally etch the sacrificial layers SL. Thus, preliminary gate regions PGR may be formed between the insulating layers ILD on the cell array region CAR, and portions of the sacrificial layers SL may remain between the insulating layers ILD on the cell array region CAR. Due to the first etching process, widths in the second direction D2 of the sacrificial layers SL of the cell array region CAR may be different from widths in the second direction D2 of the sacrificial layers SL of the connection region CNR. For example, after the first etching process, the widths of the sacrificial layers SL of the cell array region CAR may be smaller than the widths of the sacrificial layers SL of the connection region CNR.

Figure 43:
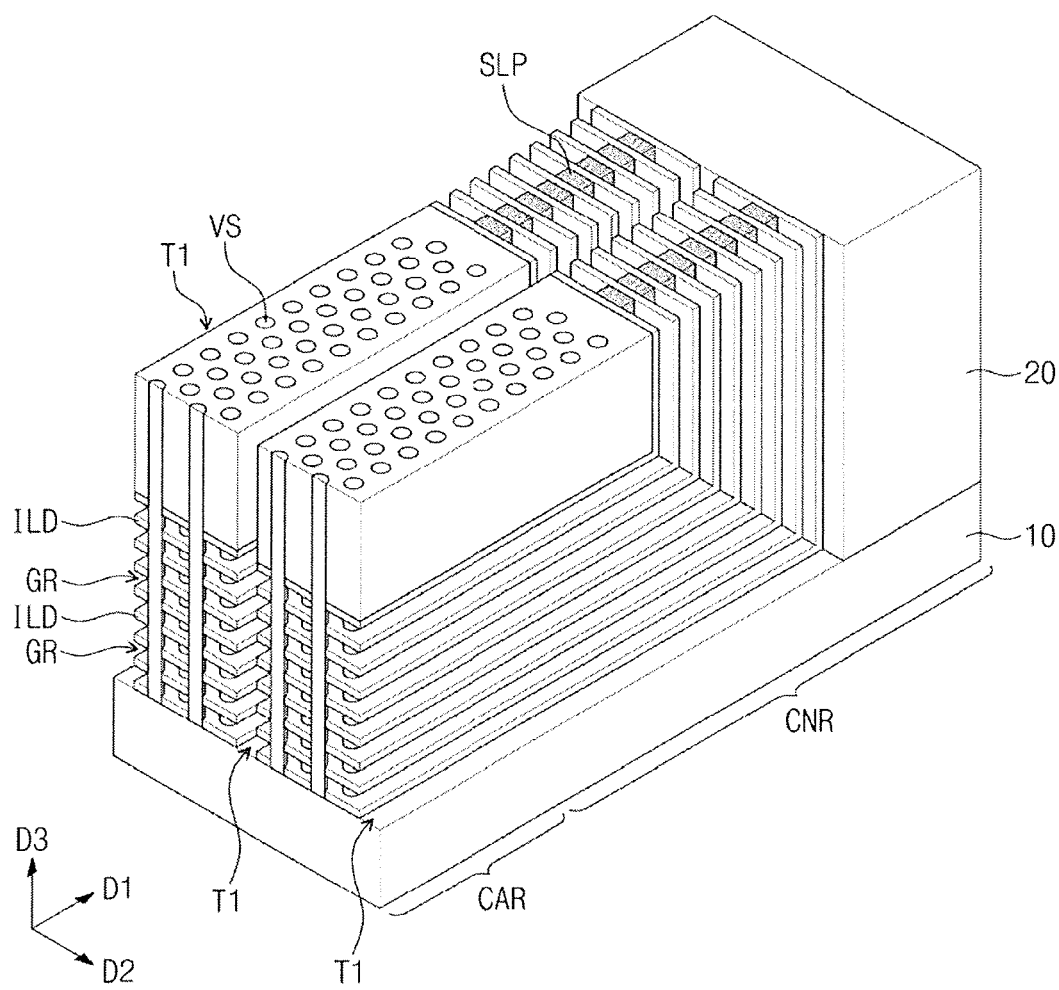

Referring to FIG. 43, after the formation of the preliminary gate regions PGR, the pad mask pattern PMP may be removed to expose sidewalls of the mold structures of the connection region CNR. For example, the sidewall portions of the insulating layers ILD and the sacrificial layers SL may be exposed through the first trenches T1 on the connection region CNR.

Next, a second etching process may be performed to selectively etch the sacrificial layers SL exposed through the first trenches T1. The second etching process may be an isotropic etching process using an etchant selectively etching the sacrificial layers SL. For example, during the second etching process, the etchant may be provided through the first trenches T1 to laterally etch the sacrificial layers SL on the cell array region CAR and the connection region CNR. During the second etching process, laterally recessed depths of the sacrificial layers SL of the cell array region CAR may be substantially equal to those of the sacrificial layers SL of the connection region CNR.

The remaining sacrificial layers SL of the cell array region CAR may be completely removed by the second etching process to form gate regions GR between the insulating layers ILD, and portions of the sacrificial layers SL of the connection region CNR may remain after the second etching process to form sacrificial patterns SLP. The gate regions GR of the connection region CNR may expose the sacrificial patterns SLP remaining between the insulating layers ILD, and the gate regions GR of the cell array region CAR may expose sidewalls of the vertical structures VS. Since the etchant is provided through the first trenches T1 at both sides of the mold structure during the second etching process, widths of the sacrificial patterns SLP may be smaller than a distance between the first trenches T1, i.e., a width of the mold structure.

In some embodiments, since the sacrificial patterns SLP remain between the insulating layers ILD on the connection region CNR, it is possible to inhibit or prevent portions of the insulating layers ILD disposed on the connection region CNR from bending, leaning, or collapsing after the formation of the gate regions GR.

Figure 44:
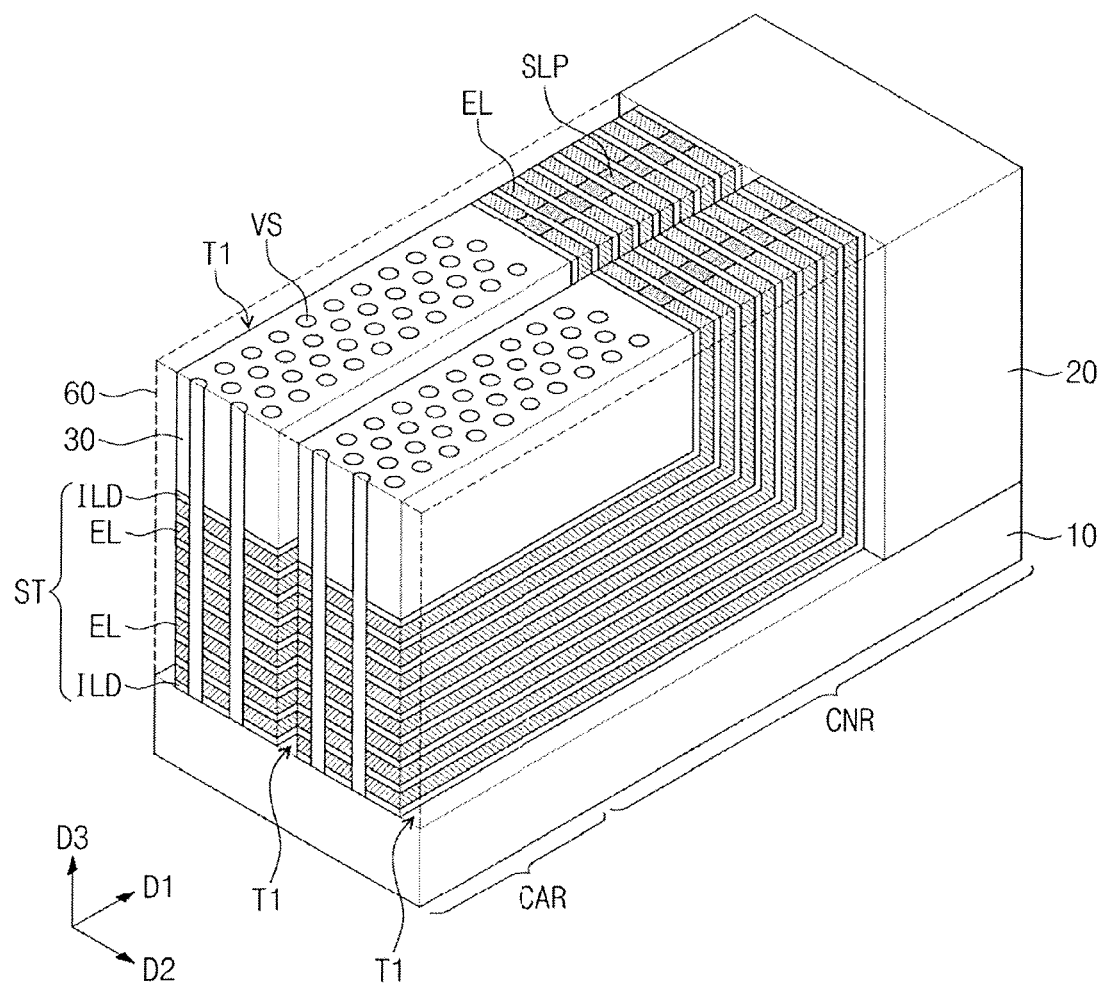

Referring to FIG. 44, electrodes EL may be formed in the gate regions GR, respectively. As described above, a gate conductive layer may be deposited to fill the gate regions GR, and portions of the gate conductive layer disposed in the first trenches T1 may be removed to form the electrodes EL vertically separated from each other. In addition, a horizontal insulating layer (not shown) having a substantially uniform thickness may be formed on inner surfaces of the gate regions GR before the formation of the electrodes EL. In some embodiments, the horizontal insulating layer may be a portion of the data storage layer. After the formation of the electrodes EL, isolation insulating patterns 60 may be formed in the first trenches T1, respectively.

As a result, electrode structures ST, each of which includes the vertically stacked electrodes EL, may be formed on the substrate 10. The electrode structures ST may extend in the first direction D1 and may be spaced apart from each other in the second direction D2. Since the electrodes EL are formed in the gate regions GR, respectively, each of the electrodes EL may include an electrode portion EP parallel to the top surface of the substrate 10 on the cell array region CAR, and pad portions PAD vertical or inclined to the top surface of the substrate 10 on the connection region CNR. In some embodiments, in each of the electrodes EL, the pad portions PAD may have widths smaller than that of the electrode portion EP and may be spaced apart from each other in the second direction D2 by the sacrificial pattern SLP.

Figure 45:
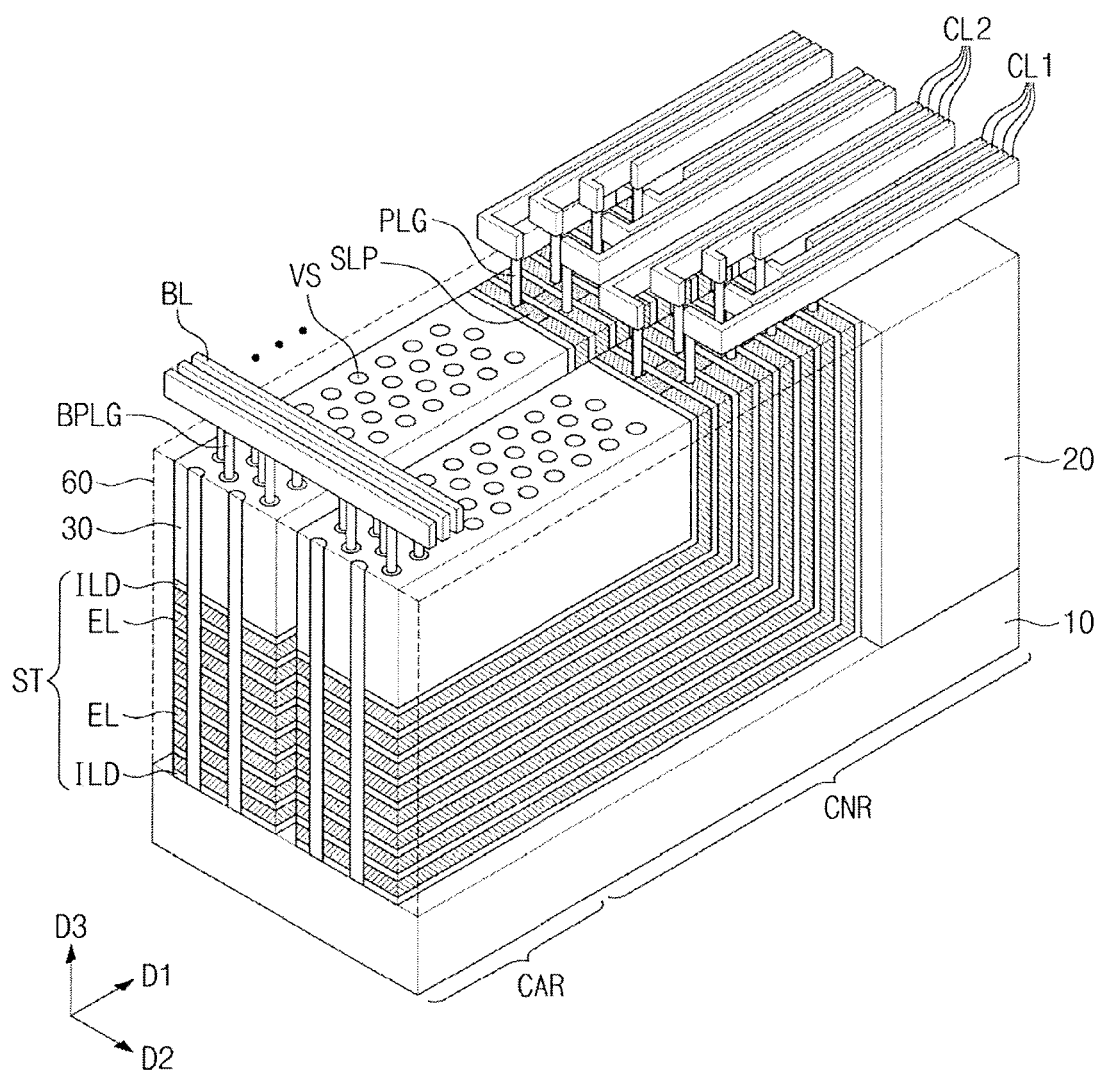
Figure 46:
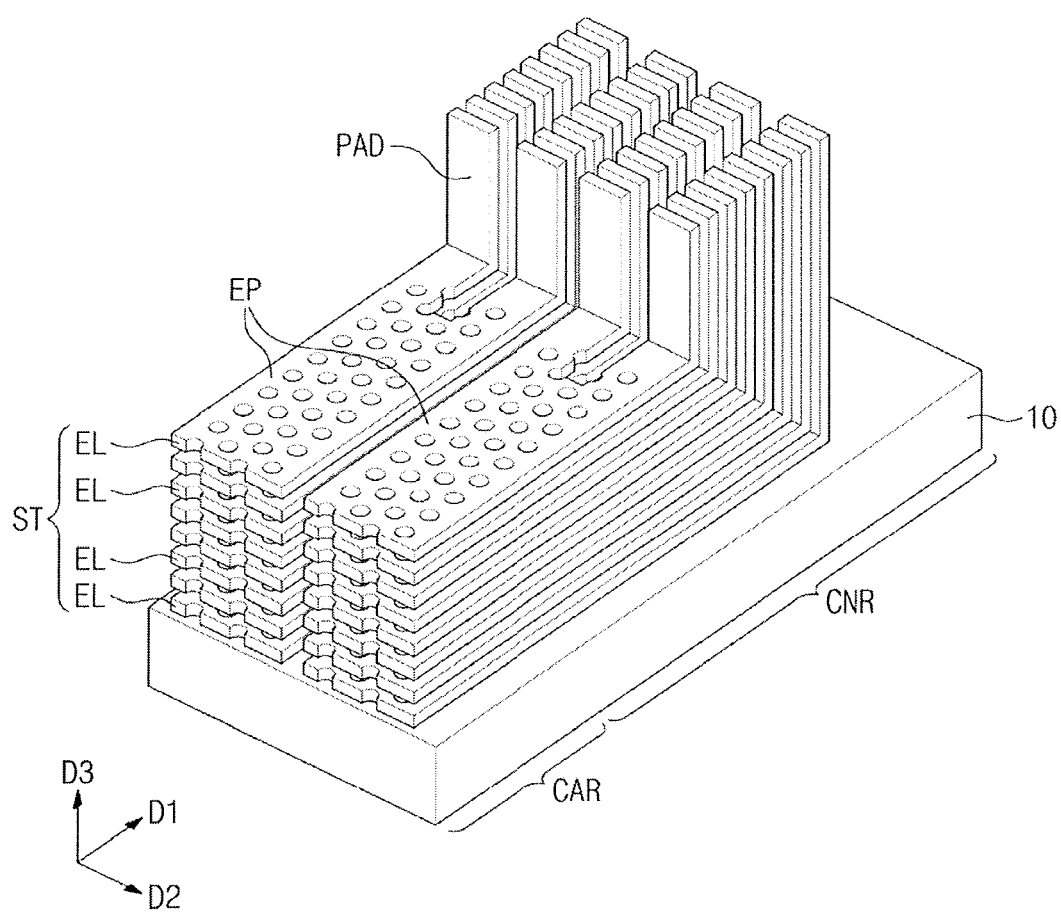
FIG. 46 is a perspective view illustrating an electrode structure formed using the manufacturing method of FIGS. 41 to 45.

Referring to FIG. 45, an interconnection structure electrically connected to the electrodes EL may be formed on the electrode structures ST. The interconnection structure may include contact plugs PLG respectively connected to the electrodes EL and conductive lines CL1 and CL2 respectively connected to the contact plugs PLG.

Each of the contact plugs PLG may be connected to one of the pad portions PAD of the electrodes EL. For example, the contact plugs PLG connected to the electrodes EL corresponding to odd-numbered layers may be spaced apart from the contact plugs PLG connected to the electrodes EL corresponding to even-numbered layers in the second direction D2.

Figure 47:
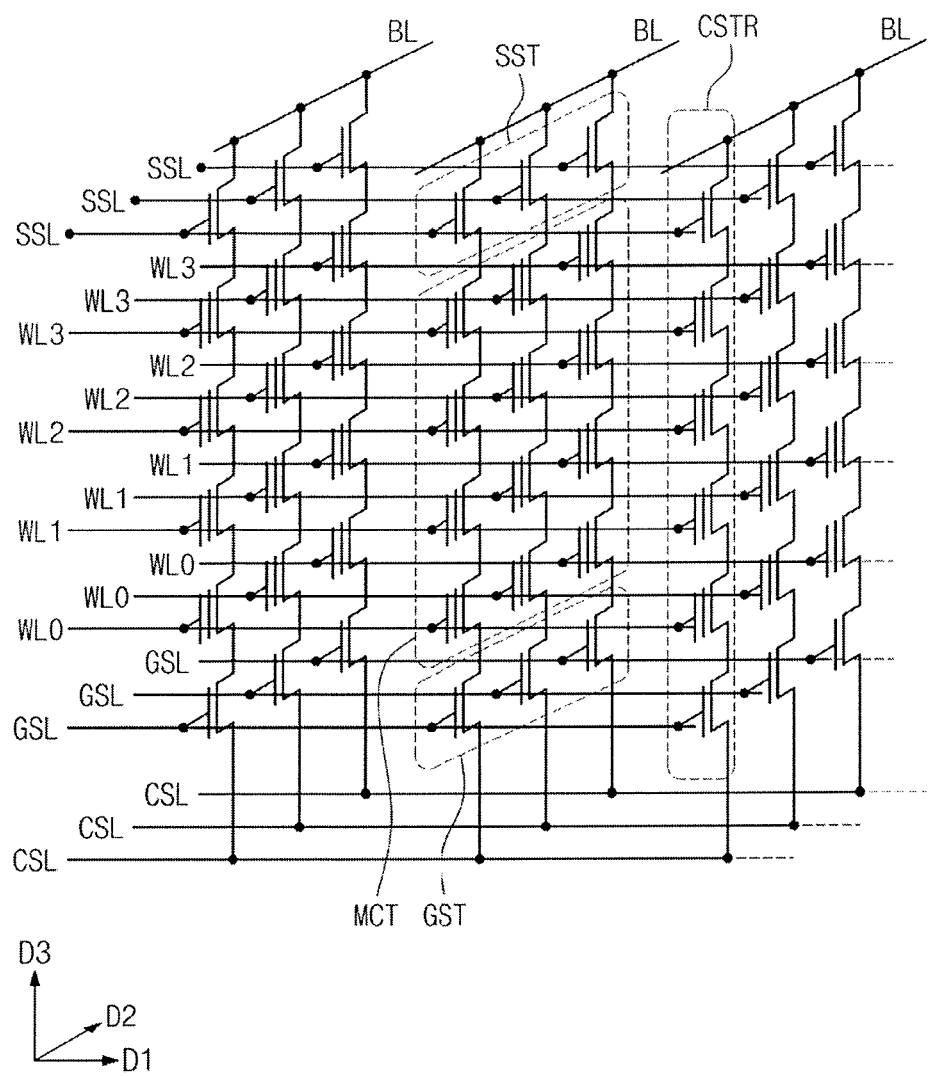
FIG. 47 is a circuit diagram illustrating a 3D semiconductor device including an electrode structure according to some embodiments of the inventive concepts.

FIG. 47 is a circuit diagram illustrating a 3D semiconductor device including an electrode structure according to some embodiments of the inventive concepts. FIGS. 48A to 48D are cross-sectional views illustrating portions of 3D semiconductor devices according to some embodiments of the inventive concepts.

Referring to FIG. 47, a 3D semiconductor device may include a common source line CSL, a plurality of bit lines BL, and a plurality of cell strings CSTR disposed between the common source line CSL and the bit lines BL. The 3D semiconductor device may be a 3D semiconductor memory device.

The common source line CSL may be a conductive layer disposed on a substrate or a dopant region formed in the substrate. The bit lines BL may be conductive patterns (e.g., metal lines) that are disposed over the substrate. The bit lines BL may extend in parallel to each other and may be spaced apart from each other. A plurality of the cell strings CSTR may be connected in parallel to each of the bit lines BL. Thus, the cell strings CSTR may be two-dimensionally arranged on the common source line CSL or the substrate.

Each of the cell strings CSTR may include a ground selection transistor GST connected to the common source line CSL, a string selection transistor SST connected to one of the bit lines BL, and a plurality of memory cell transistors MCT disposed between the ground and string selection transistors GST and SST. The ground selection transistor GST, the memory cell transistors MCT, and the string selection transistor SST may be connected in series in the order named. A ground selection line GSL, a plurality of word lines WL0 to WL3, and a string selection line SSL, which are disposed between the common source line CSL and the bit lines BL, may be used as a gate electrode of the ground selection transistor GST, gate electrodes of the memory cell transistors MCT, and a gate electrode of the string selection transistor SST, respectively.

All ground selection transistors GST may be disposed at the substantially same distance from a substrate, and gate electrodes of the ground selection transistors GST may be connected in common to the ground selection line GSL to be in an equipotential state. Similarly, gate electrodes of a plurality of the memory cell transistors MCT disposed at the same level from the common source line CSL may be connected in common to one of the word lines WL0 to WL3 to be in an equipotential state. Since one cell string CSTR includes the plurality of memory cell transistors MCT respectively located at different levels from the common source line CSL, the word lines WL0 to WL3 respectively located at different levels from each other may be disposed between the common source line CSL and the bit lines BL. The word lines WL0 to WL3 may have the technical features of the semiconductor devices described with reference to FIGS. 2A to 46.

Each of the cell strings CSTR may include a semiconductor pattern that vertically extends from the common source line CSL to be connected to the bit line BL. A data storage layer or memory element may be disposed between the semiconductor pattern and the word lines WL0 to WL3. In some embodiments, the data storage layer or memory element may include a material capable of storing charges or a layer structure capable of storing charges. For example, the data storage layer may include a trap site-rich insulating layer (e.g., a silicon nitride layer), a floating gate electrode, or an insulating layer including conductive nano dots.

Hereinafter, the data storage layers according to various embodiments will be described For example with reference to FIGS. 48A to 48D.

In some embodiments, the 3D semiconductor device may be an NAND flash memory device. For example, the data storage layer DS disposed between the electrode structure ST and the vertical structure VS may include a tunnel insulating layer TIL, a charge storage layer CIL, and a blocking insulating layer BLK. Data stored in the data storage layer DS may be changed by the Fowler-Nordheim tunneling induced by a difference in voltage between the electrode EL and the vertical structure VS including the semiconductor material.

Figure 48A:
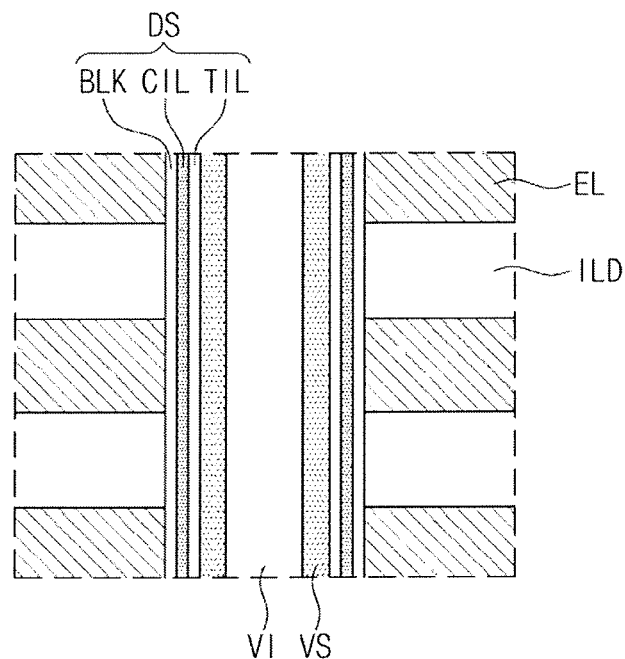
FIGS. 48A to 48D are cross-sectional views illustrating portions of 3D semiconductor devices according to some embodiments of the inventive concepts.

According to an embodiment illustrated in FIG. 48A, the tunnel insulating layer TIL, the charge storage layer CIL, and the blocking insulating layer BLK may extend from between the electrode EL and the vertical structure VS into between the insulating layer ILD and the vertical structure VS.

Figure 48B:
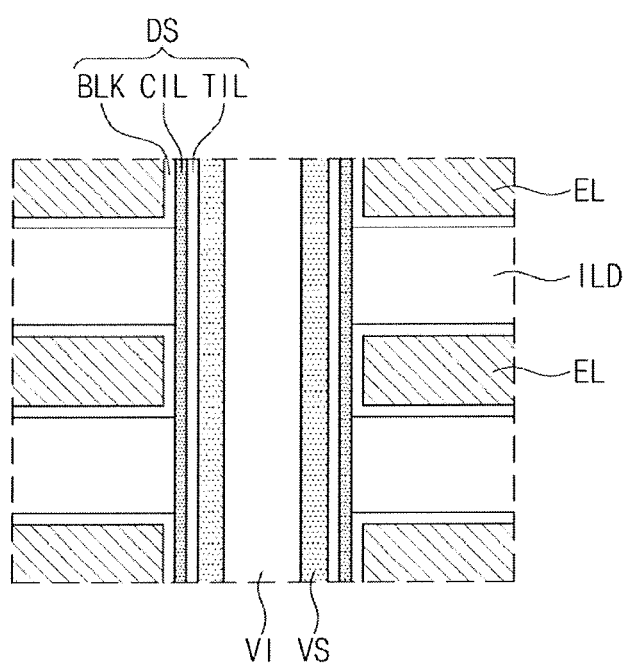

According to an embodiment illustrated in FIG. 48B, the tunnel insulating layer TIL and the charge storage layer CIL may extend from between the electrode EL and the vertical structure VS into between the insulating layer ILD and the vertical structure VS. The blocking insulating layer BLK may extend from between the electrode EL and the vertical structure VS onto top and bottom surfaces of the electrode EL.

Figure 48C:
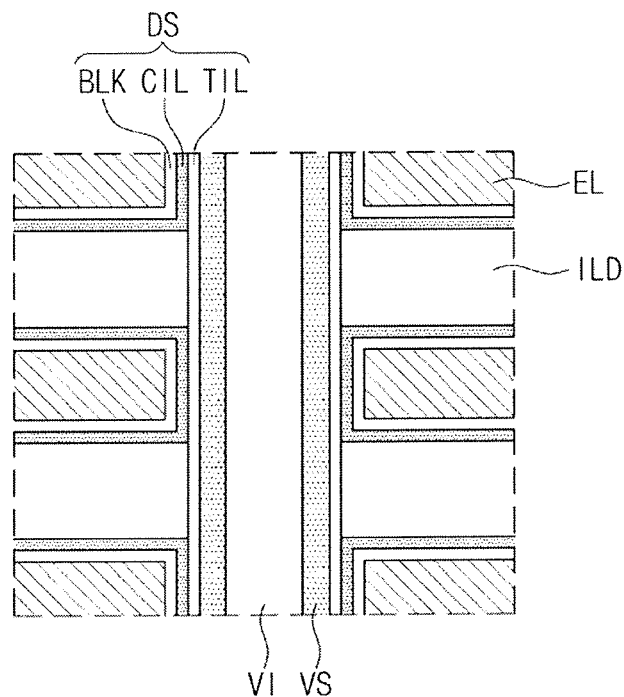

According to an embodiment illustrated in FIG. 48C, the tunnel insulating layer TIL may extend from between the electrode EL and the vertical structure VS into between the insulating layer ILD and the vertical structure VS, and the charge storage layer CIL and the blocking insulating layer BLK may extend from between the electrode EL and the vertical structure VS onto top and bottom surfaces of the electrode EL.

Figure 48D:
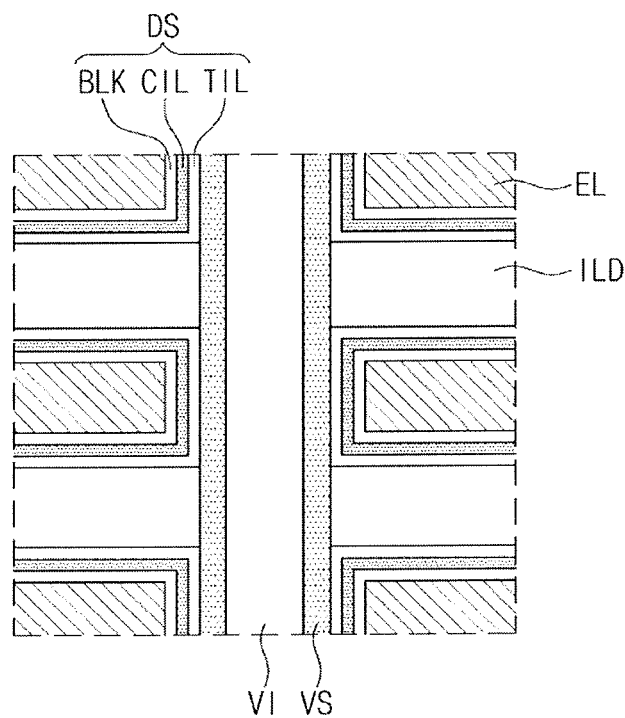

According to an embodiment illustrated in FIG. 48D, the tunnel insulating layer TIL, the charge storage layer CIL, and the blocking insulating layer BLK may extend from between the electrode EL and the vertical structure VS onto top and bottom surfaces of the electrode EL.

In the data storage layer, the charge storage layer CIL may include trap site-rich insulating layer or an insulating layer including conductive nano dots and may be formed by a chemical vapor deposition (CVD) technique or an atomic layer deposition (ALD) technique. For example, the data storage layer CIL may include a trap insulating layer, a floating gate electrode, or an insulating layer including conductive nano dots. For example, the charge storage layer CIL may include at least one of a silicon nitride layer, a silicon oxynitride layer, a silicon-rich nitride layer, a nanocrystalline silicon layer, or a laminated trap layer.

The tunnel insulating layer TIL may include at least one of materials of which energy band gaps are greater than that of the charge storage layer CIL. The tunnel insulating layer TIL may be formed by a CVD technique or an ALD technique. For example, the tunnel insulating layer TIL may include a silicon oxide layer formed using the technique. Alternatively, the tunnel insulating layer TIL may include at least one of high-k dielectric layers such as an aluminum oxide layer and a hafnium oxide layer.

The blocking insulating layer BLK may include first and second blocking insulating layers formed of different materials from each other. One of the first and second blocking insulating layers may include at least one of materials of which energy band gaps are smaller than that of the tunnel insulating layer TIL and are greater than that of the charge storage layer CIL. The first and second blocking insulating layers may be formed by a CVD technique or an ALD technique. In some embodiments, at least one of the first and second blocking insulating layers may be formed by a wet oxidation process. In some embodiments, the first blocking insulating layer may include at least one of high-k dielectric layers such as an aluminum oxide layer and a hafnium oxide layer, and the second blocking insulating layer may be formed of a material of which a dielectric constant is smaller than that of the first blocking insulating layer. In some embodiments, the second blocking insulating layer may include at least one of high-k dielectric layers, and the first blocking insulating layer may be formed of a material of which a dielectric constant is smaller than that of the second blocking insulating layer.

According to some embodiments of the inventive concepts, each of the electrodes included in the electrode structure may include the pad portion vertical or inclined to the top surface of the substrate on the connection region and the protrusion protruding from a portion of the pad portion. The protrusions of the electrodes may be arranged in the diagonal direction to the extending direction of the electrodes in a plan view, and thus it is possible to sufficiently secure a contact margin of the contact plugs respectively connected to the electrodes.

In addition, each of the electrodes may include the vertical pad portion vertical or inclined to the top surface of the substrate on the connection region and the horizontal pad portion laterally extending from a portion of the vertical pad portion in a direction intersecting the extending direction of the electrode pad portion. Here, since the width of the vertical pad portion is smaller than the width of the electrode portion of the cell array region, it is possible to inhibit or prevent the vertical pad portions of the electrodes from bending, leaning or collapsing. In addition, since the electrodes include the horizontal pads, it is possible to sufficiently secure the process margin of the processes of forming the contact plugs and the conductive lines connected to the electrodes.

Furthermore, the width of the electrode portion adjacent to the vertical pad portion may become changed from the cell array region to the connection region. Thus, the width of the vertical pad portion connected to an end of the electrode portion may be reduced to inhibit or prevent the electrodes from bending, leaning, or collapsing on the connection region.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A three-dimensional (3D) semiconductor device comprising:
   an electrode structure including a plurality of electrodes vertically stacked on a substrate,
   wherein each of the plurality of electrodes comprises:
      an electrode portion being parallel to a top surface of the substrate and extending in a first direction;
      a pad portion extending from the electrode portion in an inclined direction with respect to the top surface of the substrate; and
      a protrusion protruding from a portion of the pad portion in a direction parallel to the inclined direction and having a width narrower than a width of the pad portion in a second direction perpendicular to the first direction, and
      wherein the pad portion and the protrusion constitute a single layer,
   wherein protrusions of the plurality of electrodes are disposed at different distances from one sidewall of the electrode structure in a second direction perpendicular to the first direction.

2. The 3D semiconductor device of claim 1,
   wherein the protrusions of the plurality of electrodes are arranged in a direction diagonal to the first direction when viewed from a plan view.

3. The 3D semiconductor device of claim 1,
   wherein top surfaces of each of the protrusions of the plurality of electrodes are disposed at substantially a same height from the substrate as each other.

4. The 3D semiconductor device of claim 1,
   wherein the pad portion of each of the plurality of electrodes comprises:
   a vertical pad portion extending in a direction parallel to the inclined direction and having a width smaller than a of the electrode portion; and
   a horizontal pad portion extending from a portion of the vertical pad portion in a second direction, and
   wherein the second direction is parallel to the top surface of the substrate and is perpendicular to the first direction.

5. The 3D semiconductor device of claim 1,
   wherein the substrate includes a cell array region and a connection region, and
   wherein the electrode portion of each of the plurality of electrodes comprises:
   sub-electrode portions extending in the first direction on the cell array region and laterally spaced apart from each other in a second direction perpendicular to the first direction; and
   an electrode connection portion horizontally connecting the sub-electrode portions to each other on the connection region.

6. The 3D semiconductor device of claim 1, further comprising:
   a plurality of contact plugs, each of the plurality of contact plugs being connected to the protrusion of each of the plurality of electrodes, wherein the width of the contact plug in the second direction from the width of the protrusion in the second direction.

7. The 3D semiconductor device of claim 1, wherein each of the electrodes further includes a dummy protrusion that protrudes from the pad portion and is spaced apart from the protrusion in the second direction.

8. The 3D semiconductor device of claim 7, wherein the dummy protrusions of the plurality of electrodes are arranged along the first direction.

9. The 3D semiconductor device of claim 7, wherein widths of the dummy protrusions in the second direction are substantially equal to each other.

10. The 3D semiconductor device of claim 7, wherein a top surface of the dummy protrusion is located at the same level as a top surface of the protrusion.

11. The 3D semiconductor device of claim 7, wherein the dummy protrusion has a width different from a width of the pad portion in the second direction.

12. A three-dimensional (3D) semiconductor device comprising:
an electrode structure including a plurality of electrodes vertically stacked on a substrate,
wherein each of the plurality of electrodes comprises:
an electrode portion being parallel to a top surface of the substrate and extending in a first direction;
a vertical pad portion extending from a portion of the electrode portion in an inclined direction with respect to the top surface of the substrate; and
a protrusion vertically protruding from a first portion of the vertical pad portion,
wherein top surfaces of protrusions of immediately adjacent electrodes of the plurality of electrodes are disposed at substantially a same height as each other from the substrate, and
wherein the protrusion has the same width as the vertical pad portion, in the first direction,
wherein the three-dimensional (3D) semiconductor device further comprises a contact plug connected to the protrusion, and
wherein the width of the contact plug in a second direction crossing the first direction is different from the width of the protrusion in the second direction.

13. The 3D semiconductor device of claim 12,
wherein the protrusions of the plurality of electrodes are arranged in a direction diagonal to the first and second directions when viewed from a plan view.

14. The 3D semiconductor device of claim 12, wherein the vertical pad portion has a first width in a second direction perpendicular to the first direction,
the protrusion has a second width smaller than the first width in the second direction, and
the first and second directions are parallel to the top surface of the substrate.

15. The 3D semiconductor device of claim 12, wherein each of the electrodes further includes a dummy protrusion that protrudes from the vertical pad portion and is spaced apart from the protrusion in the second direction.

16. A three-dimensional (3D) semiconductor device comprising:
an electrode structure including a plurality of electrodes vertically stacked on a substrate,
wherein each of the plurality of electrodes comprises:
an electrode portion being parallel to a top surface of the substrate and extending in a first direction;
a pad portion extending from the electrode portion in an inclined direction with respect to the top surface of the substrate;
a protrusion protruding from a portion of the pad portion in a direction parallel to the inclined direction; and
a dummy protrusion that protrudes from the pad portion and is spaced apart from the protrusion in a second direction perpendicular to the first direction,
wherein the pad portion has a first width in the second direction,
wherein the protrusion has a second width smaller than the first width in the second direction, and
wherein the first and second directions are parallel to the top surface of the substrate.

17. The 3D semiconductor device of claim 16, wherein protrusions of the plurality of electrodes are arranged in a direction diagonal to the first direction when viewed from a plan view.

18. The 3D semiconductor device of claim 16, wherein top surfaces of protrusions of the plurality of electrodes are located at substantially the same level.

19. The 3D semiconductor device of claim 16, further comprising a plurality of conductive lines extending along the first direction, the plurality of conductive lines being connected to the protrusions of the plurality of electrodes, respectively.

20. The 3D semiconductor device of claim 16, further comprises a contact plug connected to the protrusion,
wherein the width of the contact plug in the second direction is different from the width of the protrusion in the second direction.

* * * * *